United States Patent [19]

Goldsamt et al.

[11] 4,081,859
[45] Mar. 28, 1978

[54] ELECTRONIC CALCULATOR FOR FEET-INCH-FRACTION NUMERICS

[76] Inventors: Alan B. Goldsamt, Banksville Rd., Greenwich, Conn. 06830; Earl Greenberg, 9-20 166th St., Whitestone, N.Y. 11357

[21] Appl. No.: 692,757

[22] Filed: Jun. 4, 1976

Related U.S. Application Data

[63] Continuation-in-part of Ser. No. 507,621, Sep. 19, 1974, Pat. No. 3,973,113.

[51] Int. Cl.² ............................ G06F 3/02; G06F 5/02
[52] U.S. Cl. ..................................... 364/709; 235/310
[58] Field of Search ............... 235/156, 154, 168, 169, 235/170; 340/365 R, 172.5

[56] References Cited

U.S. PATENT DOCUMENTS

| | | | |
|---|---|---|---|
| 3,654,449 | 4/1972 | Boyce | 235/156 |
| 3,739,161 | 6/1973 | Gross et al. | 235/156 |
| 3,809,872 | 5/1974 | Yamamura et al. | 235/170 |
| 3,816,731 | 6/1974 | Jennings et al. | 235/156 |
| 3,973,113 | 8/1976 | Goldsamt | 235/156 |
| 3,983,380 | 9/1976 | Sharif et al. | 235/156 |

*Primary Examiner*—David H. Malzahn
*Attorney, Agent, or Firm*—Sherman & Shalloway

[57] ABSTRACT

An apparatus is disclosed for automatically adding, subtracting, multiplying and dividing feet, inches and fractions of an inch and for the recordation of the results of said arithmetic functions on a visual display. The apparatus also automatically and directly converts feet, inches and fractions of an inch into decimal equivalents and into the metric system of measurement and, similarly, converts numbers in decimal numeric and in metric measurement automatically and directly into feet, inches and fractions of an inch.

12 Claims, 56 Drawing Figures

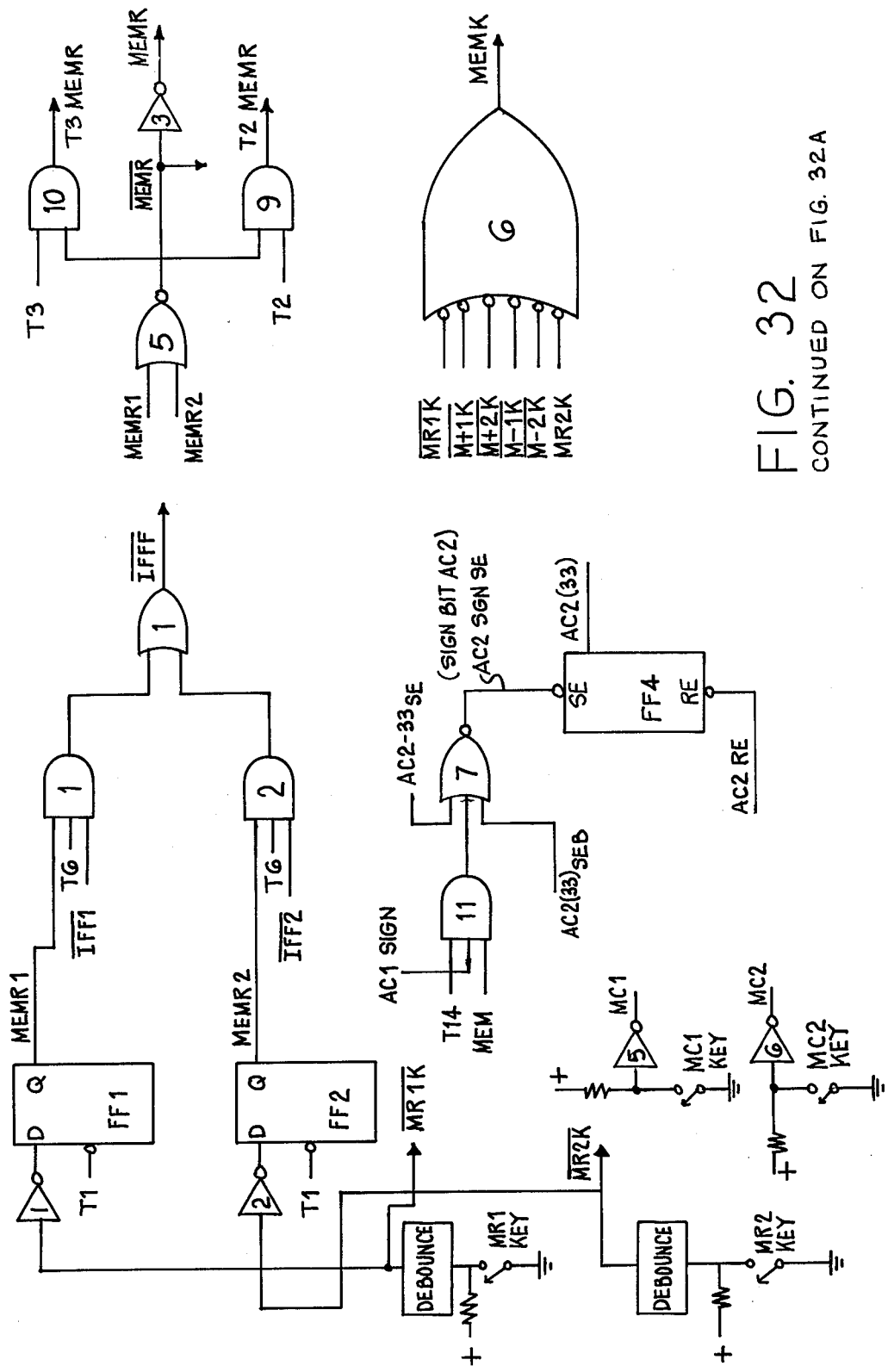
FIG. 32 CONTINUED ON FIG. 32A

ELECTRONIC CALCULATOR FOR FEET-INCH-FRACTION NUMERICS

This application is a continuation-in-part of U.S. Patent Application Ser. No. 507,621, filed Sept. 19, 1974, now U.S. Pat. No. 3,973,113, issued Aug. 3, 1976.

BACKGROUND OF THE INVENTION

1. Field of the Invention

The present invention relates to an apparatus which will be capable of performing the arithmetic functions of addition, subtraction, multiplication and division and the functions of conversion where the data entered into the apparatus is in measurement of feet, inches and fractions of an inch and also in decimal and metric measurement equivalents of feet, inches and fractions of an inch.

2. Technical Considerations and Prior Art

Currently available electronic calculators basically utilize a keyboard with ten character keys identified by and idenntifying the digits zero to nine, and the four function keys identified by signs representing the arithmetic functions of addition (+), subtraction (−), multiplication (×) and division (÷), plus a key identified as an equal (=) key for finalizing the arithmetic functions of multiplication and division and, in some models, for addition and subtraction. There are generally other auxiliary keys or switches such as the "clear" key, "clear entry" key, and "decimal selector" switch, to set the decimal at a predetermined place (2 places, 3 places, etc.), or to permit the decimal to "float." Some calculators have "percent" keys, "square" keys, "square root" keys, "reciprocal" keys, "memory" keys, trigonometric conversion keys, metric mesurement conversion keys, and other auxiliary keys.

The construction and operation of currently available electronic calculators is well known to those familiar with and skilled in the art of electronic calculators.

However, with currently available electronic calculators, calculations in feet, inches and fractions of an inch (hereinafter referred to as "fractions") cannot be directly performed except where "feet" is exact, or in metric equivalent obtained from printed conversion tables, and except where the feet-inch-fraction numeric is converted into decimal equivalent or metric equivalent, also by the use of equivalency tables. For example, two measurements of 2 feet 6 inches and 6 feet 3 inches cannot be directly added together, but must first be converted into decimal equivalents of 2.5 feed and 6.25 feet, respectively, and then entered into the calculator and added, thus: 2.5 plus (+) 6.25 equals (=) 8.75. The user would then have to mentally convert 8.75 feet to 8 feet 9 inches.

SUMMARY OF THE INVENTION

An object of the present invention is to provide a new apparatus which will be capable of performing the arithmetic functions of addition, subtraction, multiplication and division and the functions of conversion where the data entered into the apparatus is in measurement of feet, inches and fractions, and also in decimal and metric measurement equivalents of feet, inches, and fractions.

It is a further object of the present invention to be able to directly convert feet-inch-fraction numerics to decimal and metric equivalents.

It is another object of the instant invention to directly convert decimal and metric measurement numerics to feet-inch-fraction equivalents.

To achieve the afore-mentioned objects of the present invention, the apparatus has three separate and distinct keyboards, together with a visual display and a plurality of auxiliary keys, switches and visible indicators. The apparatus also includes means for selectively and automatically entering feet, inch and fraction numerics into the apparatus and, by depressing the function keys, to selectively and automatically add, subtract, multiply and divide the numbers entered into the apparatus and, by depressing specific auxiliary conversion keys, to directly convert feet-inch-fraction numerics into, and from, decimal and metric measurement equivalents.

BRIEF DESCRIPTION OF THE DRAWINGS

FIGS. 32 and 32A include circuit diagrams for distributing memory outputs to other portions of the apparatus.

DETAILED DESCRIPTION

The Console

Figure 1:
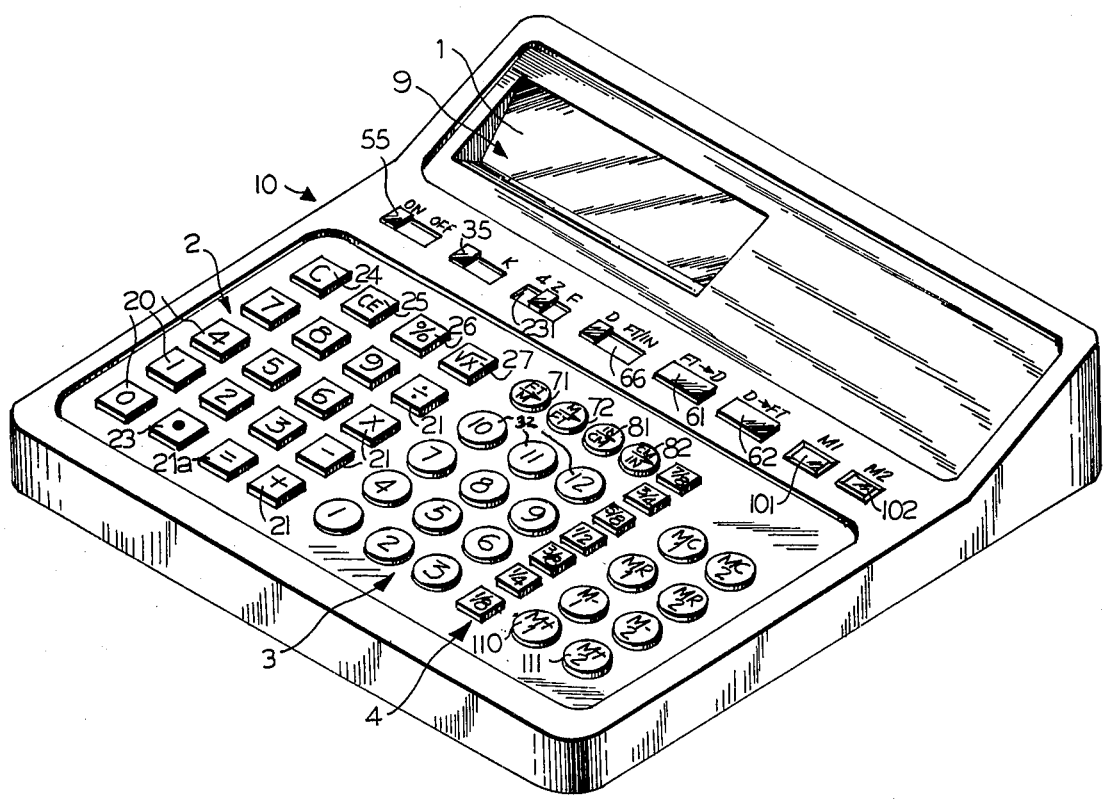
FIG. 1 is an isometric drawing of the apparatus.
Figure 2:
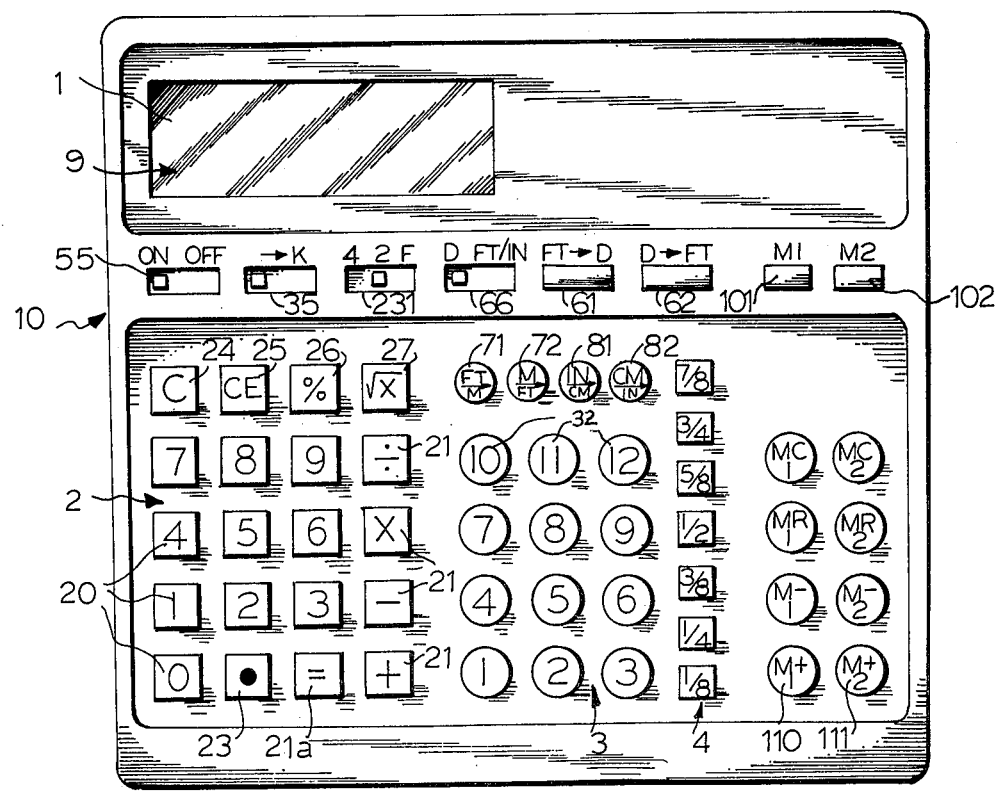
FIG. 2 is a top plan view of the apparatus indicating the keyboards, display, auxiliary keys, switches and visible indicators.

Referring now to FIGS. 1 and 2, there is shown a console, generally designated by the numeral 10, which includes a display 1 having three separate and distinct displays; one for feet, one for inches and one for fractions. These three displays will be referred to hereinafter as the "Primary" Display, for representation of feet and for representation of usual calculations not involving inches and fractions, except for conversions to and from decimal numeric and to and from metric measurement; the "Inch" Display for representation of inches; and the "Fraction Display for representation of fractions. The Primary Display also includes a "negative sign" indicator (not shown) and an "Error" indicator (not shown) and a "remainder" indicator 9 to be illuminated during various functions.

The console 10 also includes a keyboard generally designated by the numeral 2, hereinafter referred to as the Primary Keyboard or decimal keyboard. This keyboard 2 is associated with a "Primary Core" 22 and is similar to those found on most currently available electronic calculators, with a plurality of keys 20 representing the digits zero through nine; four function keys 21 to perform automatically upon command the arithmetic functions of addition, subtraction, multiplication and division; an equals key 21a to perform automatically upon command the final result of the multiplication and division; a decimal key 23 to enter the decimal point into the apparatus; a clear key 24 to automatically upon command clear all numerics entered into the apparatus; a clear entry key 25 to automatically upon command clear the last numeric entered into the apparatus; a percent key 26 to automatically upon command determine the percent of a numeric previously entered into the apparatus; and a square root key 27 to automatically upon command determine the square root of a numeric previously entered into the apparatus.

The potential of providing other capabilities in the apparatus, such as squaring a number entered into the apparatus, may also be included. The inclusion of percent and square root capabilities has been made for convenience in this disclosure and has been made on the basis that these two auxiliary functions would be of significant value to those users of the apparatus who are most frequently involved in measurements of feet, inches and fractions.

In addition, the console 10 includes an inch keyboard 3 associated with an "Inch Core" 33 and having a plurality of keys representing the digits one through twelve, and a Fractions of an inch keyboard 4 associated with a "Fraction Core" 44 and having a plurality of keys representing the following fractions: $\frac{1}{8}, \frac{1}{4}, \frac{3}{8}, \frac{1}{2}, \frac{5}{8}, \frac{3}{4}$ and $\frac{7}{8}$. It should be noted here that indications of keys representing fractions from $\frac{1}{8}$ inch through $\frac{7}{8}$ inch, in $\frac{1}{8}$ inch increments, are not intended to limit the capabilities of the apparatus in performing the required functions only in $\frac{1}{8}$ inch increments, and is indicated for convenience in this disclosure. Measurement in $\frac{1}{8}$ inch increments is most commonly used, but the apparatus will have the capability of performing the required functions should be fraction measurement be in 1/16 inch increments (1/16 inch through 15/16 inch), in 1/32 inch increments (1/32 inch through 31/32 inch), or in any other subdivisions of one inch, with a Fraction Keyboard provided for the desired increments.

The console 10 further includes a series of operational switches such as a switch 55 to turn the apparatus "on" and "off," and an Operation Selector Switch 66 to assign operation of the apparatus to the appropriate keyboards. To operate the apparatus using the Inch 3 and Fraction 4 keyboards, the switch 66 must be placed in the FT/IN position. In that position, the Primary Keyboard 2 will operate. However, when the switch is placed in the D position, only the Primary Keyboard 2 will operate. This is a safeguard measure to prevent the user from mistakenly using the Inch Keyboard 3 as though it were the Primary Keyboard 2.

A switch 35 is provided to enable a numeric entered into the apparatus to function as a constant for use with the four major functions of addition, subtraction, multiplication and division. This capability, however, exists in virtually all electronic calculators currently available.

The console 10 also includes a Decimal Selector Switch 231 to assign to the apparatus that the resultant answer to commands of the function keys be in two or four place decimal numeric or to permit the decimal to "float" to its final position based on the decimal numbers entered into the apparatus and the function determined by the required arithmetic function. It should be noted here that indication of decimal positioning to two or four places is only for convenience of this disclosure. Decimal positioning can be for one to seven positions for an apparatus with an eight digit Primary Display or, more generally, from one to N−1 positions for an N digit Primary Display. It should also be noted here that the Primary Display 1, the Primary Keyboard 2, the on/off switch 55, the constant switch 35 and the Decimal Selector Switch 231 are common to most currently available electronic calculators and, as such, permit the apparatus disclosed herein to operate and function as most currently available electronic calculators when not making use of the capabilities of the Inch and Fraction Displays, keyboards and auxiliary keys, switches and visual indicators.

In addition, the console 10 includes an array of conversion keys. The array includes conversion key 61 to permit a feet, inch and fraction numeric entered into the apparatus, recorded in the Primary, Inch and Fraction Displays, to be automatically and directly converted upon command to decimal equivalent with the decimal positioned to two or four places as assigned by the Decimal Selector Switch 231 and recorded in the Primary Display 1.

A conversion key 62 permits a number entered into the apparatus, recorded in the Primary Display 1, with or without decimal point, to be automatically and directly converted upon command into feet, inches and fractions recorded in the Primary, Inch and Fraction Displays 1.

A conversion key 71 permits a feet, inch and fraction numeric entered into the apparatus to be automatically and directly converted upon command to meters in metric measurements with the decimal point positioned to two or four places as assigned by the Decimal Selector Switch 231 and recorded in the Primary Display 1.

A conversion key 72 permits a number entered into the apparatus and recorded in the Primary Display 1, with or without decimal point, to be automatically and directed converted upon command into feet, inches and fractions, and recorded in the Primary, Inch and Fraction Displays 1.

A conversion key 81 permits an inch and/or fraction numeric entered into the apparatus to be automatically and directly converted upon command into centimeters in metric meaasurement with the decimal point positioned to two or four places as assigned by the Decimal Selector Switch 231 and recorded in the Primary Display 1.

A conversion key 82 permits a number entered into the apparatus and recorded in the Primary Display 1, with or without decimal point, to be automatically and directly converted upon command into inches and/or fractions, and recorded in the Inch and Fraction Displays 1.

It should be noted here that the indication of conversions to and from centimeters is not intended to limit conversion only to and from centimeters. The apparatus will be capable of conversion to and from millimeters or any other mode of linear measurement. The indication of centimeters is only for the convenience of this disclosure.

In order to coordinate operation of the various keys and switches on the console 10 with one another, a keyboard 110, referred to hereinafter as Memory Keyboard One, is utilized with a plurality of keys designated as M + 1 (Memory Plus One), M − 1 (Memory Minus One), M R 1 (Memory Recall One) and M C 1 (Memory Clear One). In addition, a keyboard 111, referred to hereinafter as Memory Keyboard Two, is included with a plurality of keys designated as M + 2, M − 2, M R 2, M C 2, similarly to keyboard 110.

In order to indicate when numerics have been entered into Memory One, an indicator lamp 101 is lighted and, in order to indicate when numerics have been entered into Memory Two, an indicator lamp 102 is lighted.

ADDITION

Figure 3:
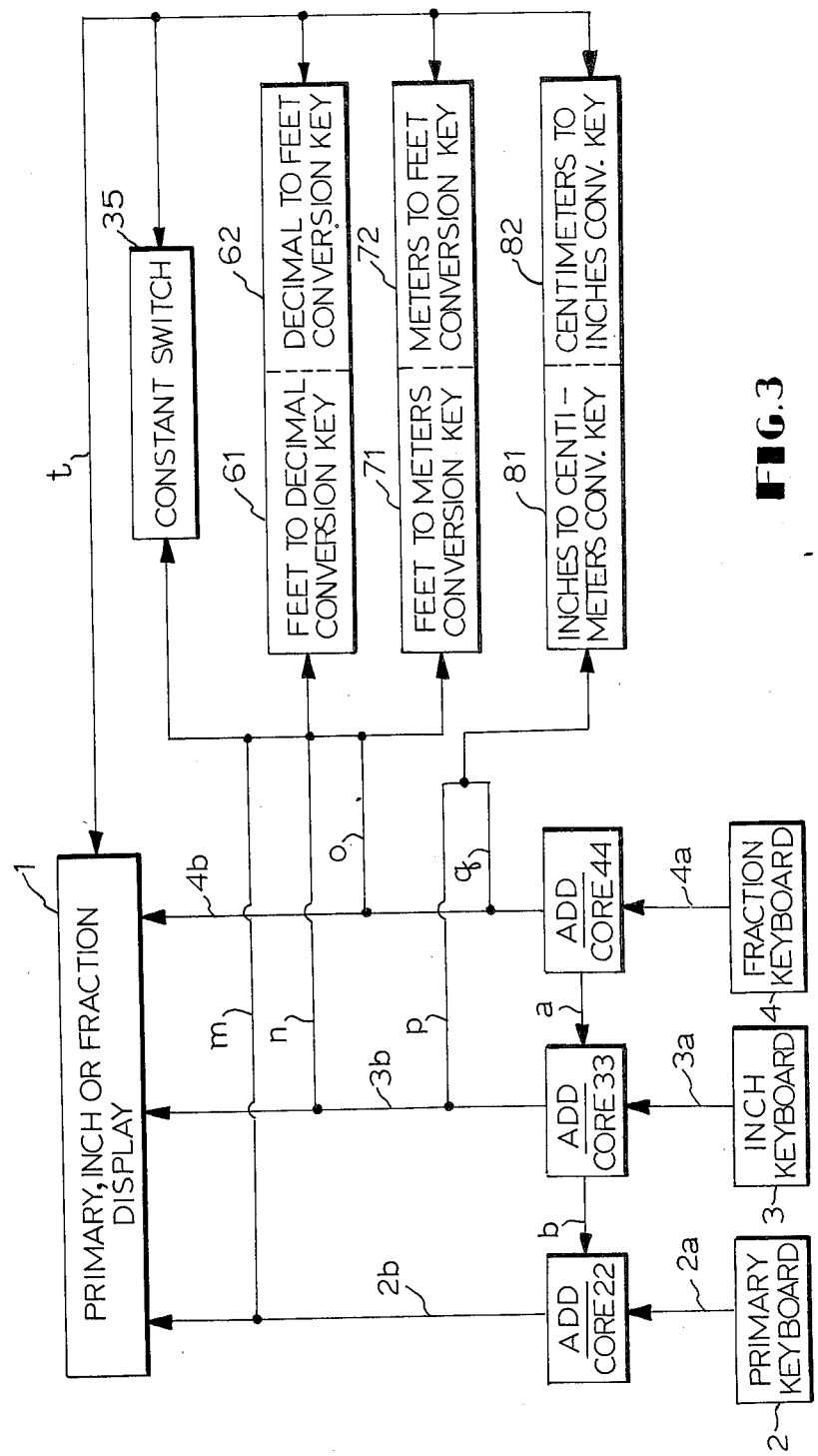
FIG. 3 is a block diagram illustrating the apparatus for performing addition.

FIG. 3 is a block diagram illustrating the method by which addition of feet, inches and fractions will be performed in the apparatus. Beginning with the Fraction Keyboard 4, there are seven character keys representing the fractions ⅛, ¼, ⅜, ½, ⅝, ¾ and ⅞, with the characters ⅛ thru ⅞ etched on the upper surface of the keys. When an initial fraction character key is depressed, a momentary contact is made within the apparatus and the selected fraction is entered into the apparatus via impulse 4a and is retained there in Fraction Core 44 until the addition key 21 is depressed. When the addition Key 21 is depressed, making momentary contact within the apparatus, the selected fraction retained in Fraction Core 44 is, by appropriate means via impulse 4b, recorded in the Fraction Display 1 while still being retained within Fraction Core 44. When a second fraction character key is depressed, a momentary contact is made within the apparatus and the second selected fraction is entered into the apparatus via impulse 4a and is retained there in Fraction Core 44 until the addition Key 21 is depressed. When the addition Key 21 is depressed, making momentary contact within the apparatus, the second fraction is automatically added to the first fraction and the sum of the two fractions is, by appropriate means via impulse 4b, recorded in the Fraction Display 1 while the sum of the two fractions is retained within Fracton Core 44.

Note that each character key, in each keyboard, is normally in a rest position and, after being depressed, automatically returns to the rest position by means of a spring or other appropriate means.

When third and subsequent fraction character keys are depressed, the same sequence will be followed as described when the second fraction character keys and addition keys 21 are depressed.

At some point in the addition of fractions, whether by depressing the second or subsequent fraction character keys and the addition key 21, the sum of the fractions will be equal to or will exceed unity. When this happens, momentary contact within the apparatus will cause the second or subsequent fraction to be entered into the apparatus via impulse 4a and will be retained there in Fraction Core 44. When the addition key 21 is depressed, a unit impulse will be transferred via impulse "a" to the Inch Core 33 of the apparatus. At that time, the unit (one) will be automatically added to whatever inches are retained within the Inch Core 33 of the apparatus, while the remainder, if any, is retained in the Fraction Core 44 of the apparatus.

Almost simultaneously, depending on the operating speed of the apparatus, the sum of the two fractions will be recorded in the Inch Display via impulse 3b and in the Fraction Display via impulse 4b, while the sums are retained, individually and respectively, in the Inch Core 33 and Fraction Core 44. Continued addition of fractions will, as described herein, automatically transfer one unit via impulse "a" to the Inch Core 33 when the sum of fractions equals or exceeds unity.

During the addition of fractions, there will be a time when the sum of two fractions is exactly unity, in which case the unit, one, will be automatically added to whatever inches are retained within the Inch Core 33 of the apparatus. However, since there is no remainder, the Fraction Core 44 will retain the number 0 and the Inch Display 1 will record the accumulated sum of Inches (1 to 11), and the Fraction Display 1 will not be activated.

It should be noted here that the equals (=) function key 21a has yet to be used to finalize the sums of two or more fractions. The sums of two or more fractions will be cumulatively recorded in the Fraction Display 1 or in both the Inch Display 1 and the Fraction Display I. In general, all sums of Feet, Inches and Fractions will be cumulative.

There are twelve character keys representing the inches 1 thru 12 with the characters "1"–"12" etched on the upper surface of the keys in the Inch Keyboard 3. When an initial inch character key is depressed, a momentary contact is made within the apparatus and the selected inch is entered into the apparatus via impulse 3a and is retained in the Inch Core 33 until the addition key 21 is depressed. When the addition key 21 is depressed, making momentary contact within the apparatus, the selected inch retained within Core 33 is, by appropriate means via impulse 3b, recorded in the Inch Display 1 while still being retained within the Inch Core 33. When a second inch character key is depressed, a momentary contact is made within the apparatus and the second selected inch is entered into the apparatus via impulse 3a and is retained in Inch Core 33 until the addition key 21 is depressed. When the addition key 21 is depressed, making momentary contact within the apparatus, the second inch is automatically added to the first inch and the sum of the two inches is, by appropriate means via impulse 3b, recorded in the Inch Display while the sum of the two inches is retained in the Inch Core 33. When third and subsequent inch character keys are depressed, the same sequence will be followed as described for when the second inch character keys and addition keys 21 are depressed.

At some point in the addition of inches, or when the addition of fractions results in the transfer of a unit via impulse "a" to the Inch Core 33, the sum of the inches will be equal or will be greater than "12".

When the second or subsequent inch character key is depressed, the momentary contact within the apparatus will cause the second or subsequent inch to be entered into the apparatus via Impulse 3a and retained in Inch Core 33. When the addition key 21 is depressed, a unit impulse will be transferred via impulse "b" to the Primary Core 22 of the apparatus. At that time the unit, one, will be automatically added to whatever feet are retained within the Primary Core 22 of the apparatus while the remainder, if any, is retained in the Inch Core 33 of the apparatus.

Transfer of a unit, one, via impulse "b" to the Primary Core 22 may be actuated by adding a fraction to the inches and fractions retained in Cores 33 and 44, respectively. The added fraction adds the unit, one, to the Inch Core 33 which, in turn, adds the unit, one, to the Primary Core 22, and the remainder, if any, of the additions of fractions is itself retained in the Fraction Core 44 of the apparatus.

Nearly simultaneously, depending on the operating speed of the apparatus, the sum of 2 Inches, plus the sum of two Fractions, will be recorded in the Primary Display 1 by appropriate means via Impulse 2a, in the Inch Display 1 by appropriate means via Impulse 3b, and in the Fraction Display 1 by appropriate means via Impulse 4b, while the sums are retained individually and respectively in the Primary Core 22 in the Inch Core 33 and in the Fraction Core 44. Continued addition of Inches and/or Fractions will, as described herein, automatically transfer one unit, via impulse "a" to the Inch Core 33 and via impulse "b" to the Primary Core 22 when the sum of inches and/or fractions equals or exceeds twelve and/or unity, respectively.

It should be noted, by reference to FIG. 2, that the Inch Keyboard 3 contains a character key with the number 12 etched on the upper surface of the key, representing twelve inches. This character key is included in the Inch Keyboard 3 for the convenience of the user when the user's reference dimensions are listed as twelve inches instead of one foot. When the character key representing twelve inches is depressed, a momentary contact is made within the apparatus and "12 inches" is entered into the Inch Core 33 via impulse 3a and is retained there until the addition key 21 is depressed. When the addition key 21 is depressed, making momentary contact within the apparatus, the "12 inches" retained in Inch Core 33 will, via impulse "b", be transferred as one unit to the Primary Core 22 of the apparatus and one unit will automatically be added to whatever "feet" are retained in the Primary Core 22. Nearly simultaneously, as described hereinbefore, the sum of the Feet will be recorded in the Primary Display 1 by appropriate means via impulse 2b. The sum of feet will be retained in the Primary Core 22. Inasmuch as there will not be a representation of "12" in the Inch Display 1 and there is no remainder from the addition of 12 inches, there will not be a retention of twelve in the Inch Core 33 of the apparatus. However, if the Inch Core 33 has previously retained one thru eleven inches, those inches will continue to be retained in the Inch Core 33 and will continue to be recorded in the Inch Display 1.

There are ten Primary Keyboard Character Keys 0 thru 9 representing Feet, with the digits 0 thru 9 etched on the upper surface of the keys in Primary Keyboard 2. When initial Primary Character Keys (1 thru 9) are depressed, a momentary contact is made within the apparatus and the selected "feet" is entered into the apparatus via impulse 2a and is retained in Primary Core 22 until the addition key 21 is depressed. When the addition key 21 is depressed, making momentary contact within the apparatus, the selected "feet" retained in Primary Core 22 is, by appropriate means via impulse 2b, recorded in the Primary Display 1 while still being retained in the Primary Core 22 of the apparatus. When subsequent Primar keys are depressed, a momentary contact is made within the apparatus and the second and subsequent "feet" is entered into the apparatus via Impulse 2a and is retained in Primary Core 22 until the addition key 21 is depressed. When the addition key 21 is depressed, making momentary contact within the apparatus, the second and subsequent "feet" is automatically added to the "feet" retained in the Primary Core 22 and the sum of the "feet" is, by appropriate means via Impulse 2b, recorded in the Primary Display 1, while the sum of the "feet" is retained in the Primary Core 22.

In the manner described, the apparatus will be capable of adding feet, inches and fractions, retaining the sums in the appropriate Cores, and recording the sums in the appropriate displays. In adding feet, inches and fractions, it will not be necessary for the user to first add feet, then inches and then fractions, or similarly to first add fractions, then inches and then feet. It will be possible, as an object of the present invention, for the user to add feet, inches and fractions in any sequence and, thus, obtain the true sum of all feet, inches and fractions entered into the apparatus. In any sequence of entering feet, inches and fractions, the transfer of one unit will be accomplished from the Fraction Core 44 to the Inch Core 33 and from the Inch Core 33 to the Primary Core 22, as herein described.

THE CONSTANT SWITCH

The constant switch 35 will permit the apparatus to function in a similar manner as the constant found in most electronic calculators. When the constant switch 35 is placed in the "on" position denoted by the letter "K" embossed on the face of the apparatus, any Primary, or Feet, Inch, or Fraction entered into the apparatus in the appropriate Core by depressing one of the Feet, Inch or Fraction keys, as described herein, will be made a constant additive. The Feet, Inch, or Fraction thus entered into the apparatus via impulses 2a, 3a or 4a, will, respectively, be retained in the appropriate Cores. When the addition key 21 is depressed, making a momentary contact within the apparatus, the entered Feet, Inch, or Fraction, via impulses 2b, 3b or 4b, respectively, will be recorded in the Primary, Inch, and Fraction Displays 1, while being, respectively, still retained in the Primary Core 22, the Inch Core 33 or the Fraction Core 44. To achieve constant or repetitive addition, the user need only depress the addition key 21 and the entered Feet, Inches, or Fractions will automatically be added to themselves as often as the addition key 21 is depressed. Each time the addition key 21 is depressed, the sums of the additions will be recorded in the Primary, Inch or Fraction Displays 1. After initially entering the Feet, Inches or Fractions via impulses 2a, 3a or 4a, respectively, N additions will be obtained by depressing the addition key 21 N times. After each depression of the addition key 21, the sum of the additions of Feet, Inches or Fractions will be recorded in the Primary, Inch, or Fraction Displays 1. During the operation of constant or repetitive addition unit transfer from the Fraction Core 44 via impulse "a" to the Inch Core 33 and from the Inch Core 33 via impulse "b" to the Primary Core 22 will function as described hereinbefore. Constant or repetitive addition will function for Feet, Inches and Fractions, either individually, coupled, or all together.

FEET TO DECIMAL CONVERSION KEY

The Feet to Decimal conversion key 61 and the Decimal to Feet conversions key 62 will be used to automatically and directly convert Feet, Feet and Inches, Feet, Inches and Fractions or Feet and Fractions into decimal equivalents, and conversely, to convert a decimal numeric into Feet, Feet and Inches, Feet, Inches and Fractions or Feet and Fractions.

As described hereinbefore, Feet, Inches and Fractions will be entered into the apparatus via impulses 2a, 3a and 4a, respectively, and then recorded in the Primary, Inch and Fraction Displays 1 via Impulses 2b, 3b and 4b respectively. Any numeric entered in any one, any two, or all three displays 1 will be automatically and directly converted into decimal equivalent by depressing the Feet to Decimal Conversion Key 61. When the Feet to Decimal Conversion Key 61 is depressed, making momentary contact within the apparatus, the Feet, recorded in the Primary Display 1, by appropriate means via impulses "m" and "t" will be recorded in the Primary Display 1 with the decimal point positioned to two or four places as assigned by the Decimal Selector Switch 231. It will be recommended that all Conversions to decimal and metric measurement equivalent to be four decimal places. Note that the floating decimal cannot be used with any conversion key. Inasmuch as the apparatus will be provided with a zero suppression capability, the converted Feet will be shifted in the Primary Display 1 so that there will be the assigned places to the right of the decimal point, but no zeros will be illuminated in the Primary Display 1 to the right of the decimal point.

Similarly, the Inches recorded in the Inch Display 1, by appropriate means via impulses "n" and "t", will be recorded in the Primary Display 1 to the right of the decimal point, in decimal equivalent. And, again, similarly, the Fractions recorded in the Fraction Display 1, by appropriate means via impulses "o" and "t", will be recorded in the Primary Display 1 to the right of the decimal point, in decimal equivalent.

Thus, the decimal equivalent of Feet, Feet and Inches, Feet Inches and Fractions or Feet and Fractions will be recorded in the Primary Display 1 automatically and directly by depressing the Feet to Decimal Conversion Key 61.

Decimal numerics will be entered into the apparatus by means of the Primary Keyboard 2. Depressing Primary character keys 0 thru 9 in any sequence with the decimal point character key depressed at the proper place during depression of the Primary Character keys 0 thru 9 will enter the numerics into the apparatus via impulse 2a, and will record the numerics in the Primary Display 1 via impulse 2b. Note that the maximum number of individual numerics or integers entered into the apparatus and displayed in the Primary Display 1 will be equal to or less than the number of "digits" available in the Primary Display 1 to be recorded. Should the user attempt to enter more than the maximum number of "digits" which the Primary Display 1 is capable of recording, the Error Indicator (not shown) will be illuminated and Conversion to Feet, Inches and Fractions will not be possible.

As described hereinbefore, it will be recommended that numerics entered into the Primary Display 1 be to four decimal places. Therefore, the maximum number of digits to the left of the decimal point will be four in an eight digit display although, if required, two place decimal can be used and the maximum number of digits to the left of the decimal point will be six in an eight digit display. This might be useful for certain conversions.

After the decimal numeric has been recorded in the Primary Display 1, said numeric will be converted to feet, inches or fractions by depressing the Decimal to Feet Conversion Key 62. When the Decimal to Feet Conversion Key 62 is depressed, making momentary contact within the apparatus, the decimal numeric recorded in the Primary Display 1, by appropriate means via impulse "t" and via impulses "m", "n", and "o" will be separated into equivalents of feet, inches and fractions and will be automatically and directly converted into feet, inches and fractions and will be recorded in the Primary Inch and Fraction Displays 1 as appropriate. Inasmuch as Feet, in decimal numeric, is recorded in the Primary Display 1 to the left of the decimal point, the recordation of feet as part of a Feet-Inch-Fraction numeric will occur in the Primary Display 1 beginning with the right-hand digit display in the Primary Display 1, in essence a shift to the right in the Primary Display 1.

It should be noted here that all numerics recorded in the Primary Display 1 will always begin at the right-hand digit display of the Primary Display 1, unless assigned otherwise by the position of the decimal point by means of the Decimal Selector Switch 231. Thus, the individual numbers 1 thru 9 will be recorded in the extreme right-hand digit display, the "tens" will appear in the second from right digit display, the "hundreds" will appear in the third from right digit display, and so on until all digit displays are accounted for. This feature of the apparatus is similar to currently available electronic calculators.

The impulses "*t*", "*m*", "*n*" and "*o*" will operate in reverse direction during conversion from Decimal to Feet compared to the described direction of said impulses during conversion from Feet to Decimal.

The preceding descriptions of conversions from Feet to Decimal equivalent and Decimal to Feet indicated the method by which numerics are entered into the apparatus and recorded in the Displays 1. For convenience in this disclosure, the numerics to be converted were entered into the apparatus and recorded in the Displays 1 as initial entries. The apparatus will be capable, by the method as specifically described, of converting from Feet to Decimal equivalent and from Decimal to Feet at any time said numerics are recorded in the Displays 1, whether by initial entry into the apparatus and recorded in the Displays 1, or whether recorded in the Displays 1 as a result of any arithmetic functions of addition, subtraction, multiplication or division or by use of other auxiliary function keys such as the square root key. Thus, regardless of the operations by which a numeric is recorded in the Displays 1, said numeric can be automatically and directly converted by use of any of the conversion keys: the Feet to Decimal Conversion Key 61, the Decimal to Feet Conversion Key 62, the Feet to Meters Conversion Key 71, the Meters to Feet Conversion Key 62, the Inches to Centimeters Conversion Key 81, or the Centimeters to Inches Conversion Key 82.

The Feet to Meters Conversion Key 71 and Meters to Feet Conversion Key 72 will be used, respectively, to automatically and directly convert Feet, Feet and Inches, Feet, Inches and Fractions or Feet and Fractions into metric measurement equivalents and conversely, to convert a metric measurement numeric into Feet, Feet and Inches, Feet, Inches and Fractions, or Feet and Fractions.

As described hereinbefore, for conversions using the Feet to Decimal Conversion Key 61 and the Decimal to Feet Conversion Key 62, the same method will be used to enter Feet, Inches and Fraction numerics into the apparatus via impulses 2*a*, 3*a*, and 4*a*, respectively, and to record said numerics in the Primary, Inch and Fraction displays 1 via impulses 2*b*, 3*b*, and 4*b*, respectively. As also described hereinbefore, any numeric entered into the apparatus and recorded in the Display 1, either initially or as a result of other operations within the apparatus, will be capable of being converted from Feet, Inches and Fractions to metric measurement, and vice versa. The method hereinbefore described for Feet to Decimal Conversion will apply for Feet to Meters conversion with depression of the Feet to Meters Conversion Key 71 causing, via impulses "*m*", "*n*", "*o*" and "*t*", the recordation of the metric measurement equivalent of feet, feet and inches, feet, inches and fractions, or feet and fractions in the Primary Display 1. The selection and positioning of the decimal point will also be similar to the method described hereinbefore for Feet to Decimal conversion.

The method hereinbefore described for Decimal to Feet Conversion will apply for Meters to Feet conversion with Meters recorded in the Primary Display 1 via impulse 2*b* and with depression of the Meters to Feet Conversion Key 72 causing, via impulses "*t*", "*m*", "*n*" and "*o*", the recordation of the feet, inch and fraction equivalent of the metric numeric, in the Primary, Inch, and Fraction Displays 1, as appropriate.

The Inches to Centimeters Conversion Key 81 and the Centimeters to Inches Conversion Key 82 will be used, respectively, to automatically and directly convert Inches or Inches and Fractions into centimeters in metric measurement and conversely, to convert a centimeter numeric into Inches or Inches and Fractions.

As described hereinbefore for conversions of Feet to Decimal, Decimal to Feet, Feet to Meters, and Meters to Feet, the method will similarly apply for conversions of Inches to Centimeters and Centimeters to Inches, except that the impulses will be different.

After Inches and/or Fractions have been entered into the apparatus via impulses 3*a* and 4*a*, respectively, and have been recorded in the Inch Display 1 and Fraction Display 1 via impulses 3*b* and 4*b*, respectively, conversion to centimeters in metric measurement will be accomplished by depressing the Inches to Centimeters Conversion Key 81. Via impulses "*p*" and/or "*q*" and "*t*", Inches and/or Fractions will be automatically and directly converted to centimeters, which will be recorded in the Primary Display 1. As also hereinbefore described in the decimal point will be appropriately positioned.

In a similar manner, after centimeters have been recorded in the Primary Display 1 via impulse 2*b*, depression of the Centimeters to Inches Conversion Key 82 will cause, via impulses "*t*", "*p*" and/or "*q*", the recordation of Inches and/or Fractions in the Inch Display 1 or Fraction Display 1, as appropriate.

The Clear Key 24 will clear all data entered into the apparatus, except memories which will be described later in this disclosure.

The Clear Entry Key 25 will clear only the last individual piece of data entered into the apparatus.

The Percent Key 26 and the square root key 27 will function in a similar manner to those in currently available electronic calculators.

SUBTRACTION

Figure 4:
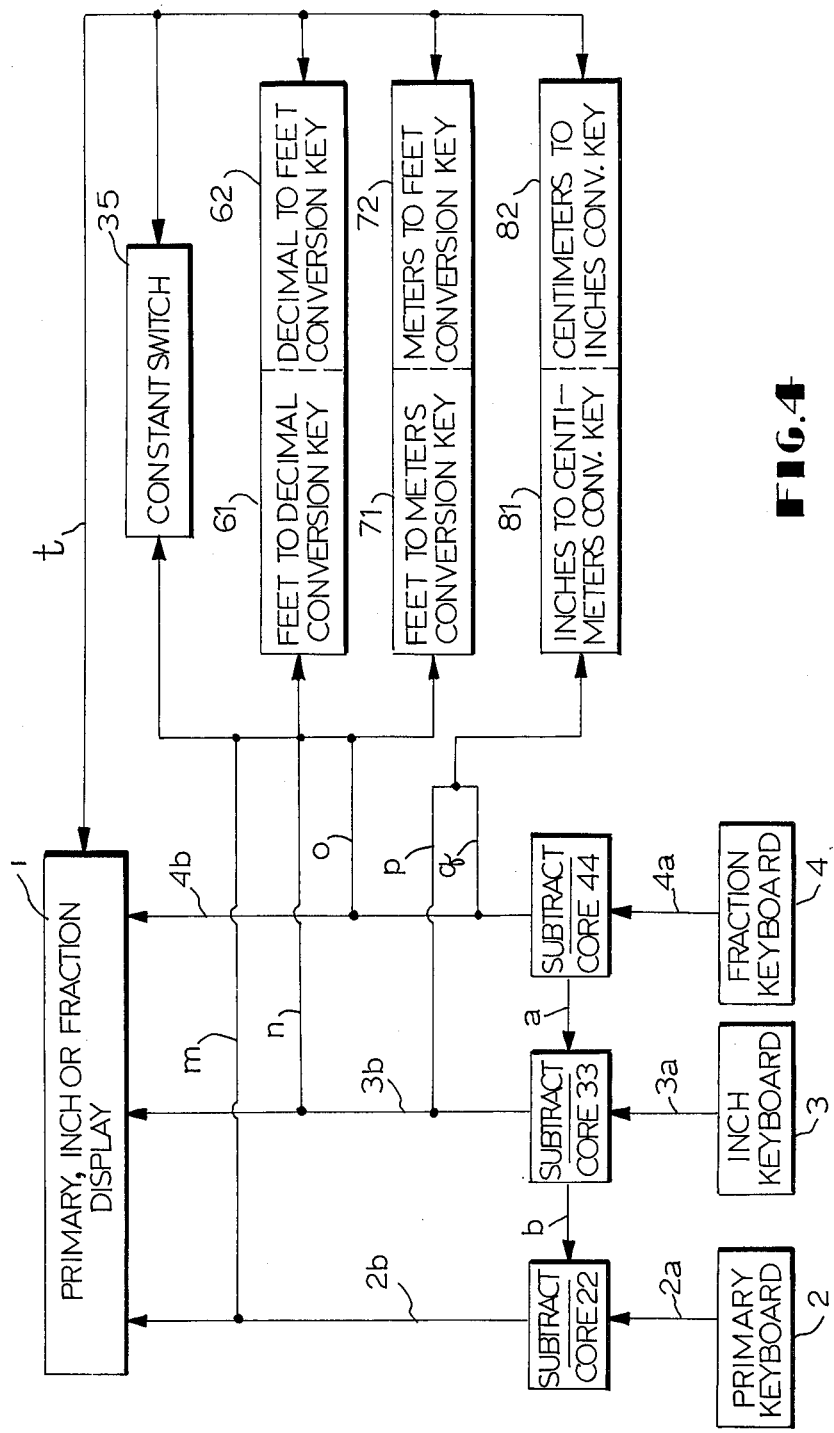
FIG. 4 is a block diagram illustrating the apparatus for performing subtraction.

FIG. 4 is a block diagram illustrating the method by which subtraction of feet, inches and fractions will be performed in the apparatus. The detailed disclosure of addition hereinbefore described will be applicable for subtraction, except that the substraction key 21 will be used instead of the addition key 21. When numeries have been entered into the apparatus via impulses 2*a*, 3*a*, and 4*a*, these same numerics will be recorded in the Displays 1 after the subtraction key 21 has been depressed. When the subtraction key 21 is depressed, making momentary contact within the apparatus, the specific feet, inches and fractions retained, respectively, in the Primary Core 22, the Inch Core 33 and the Fraction Core 44 will be recorded, respectively, in the Primary Display, the Inch Display, and the Fraction Display. Note that the Negative Sign indicator (not shown) will be activated. Continued and repeated depression of Primary, Inch, and Fraction Keys will enter, respectively, Feet, Inches, and Fractions into the apparatus. When the subtraction key 21 is depressed, making momentary contact within the apparatus, the newly entered Feet, Inches, and Fractions will be automatically subtracted from the previously entered Feet, Inches and Fractions. Note that the continued subtractions are actually the sums of negative numbers, and so each repeated substraction is, in fact, the arithmetic sum of two numerics, with a negative sign. For convenience of this disclosure, the terms negative feet, negative inches and negative fractions will be used to represent subtraction.

At some point in the subtraction of fractions, whether by depressing the second or subsequent fraction character keys 4 and the subtraction key 21, the sum of the negative fractions will be equal to or will exceed unity, and will be negative. When the second or subsequent fraction character key 4 is depressed, the momentary contact within the apparatus will cause the second or subsequent negative fraction to be entered into the apparatus via impulse 4a and wll be retained there in Fraction Core 44. When the subtraction key 21 is depressed, a negative unit impulse will be transferred via impulse "a" to the Inch Core 33 of the apparatus. At that time the unit, one, will be automatically subtracted from whatever inches are retained within the Inch Core 33 of the apparatus while the remainder, if any, is retained in the Fraction Core 44 of the apparatus. Nearly simultaneously, depending on the operating speed of the apparatus, the sum of the two negative fractions will be recorded in the Inch Display 1, via impulse 3b, and in the Fraction Display 1, via impulse 4b, while the sums are retained, individually and respectively, in the Inch Core 33 and in the Fraction Core 44. Continued subtraction of fractions will, as described herein, automatically transfer one negative unit, via impulse "a", to the Inch Core 33 when the sum of negative fractions equals or exceeds unity.

Similarly, in the subtraction of inches, at some point the sum of the negative inches will be equal to or will exceed twelve, and will be negative. When second or subsequent inch character keys are depressed, the momentary contact within the Apparatus will cause the second or subsequent negative inch to be entered into the apparatus via impulse 3a and will be retained there in Inch Core 33. When the subtraction key 21 is depressed, a negative unit impulse will be transferred via impulse "b" to the Primary Core 22 of the apparatus. At that time the unit, one, will be automatically subtracted from whatever feet are retained within the Primary Core 22 of the apparatus while the remainder, if any, is retained in the Inch Core 33 of the apparatus.

Nearly simultaneously, depending on the operating speed of the apparatus, the sum of the two negative inches will be recorded in the Primary Display 1, via impulse 2b, and in the Inch Display 1, via impulse 3b, while the sums are retained, individually and respectively, in the Primary Core 22 and in the Inch Core 33. Continued substraction of inches will, as described herein, automatically transfer one negative unit, via impulse "b" to the Primary Core 22 when the sum of negative inches equals or exceeds twelve.

Transfer of a negative unit, one, via impulse "b" to the Primary Core 22 may be actuated by subtracting a fraction from the inches and fractions retained in Cores 33 and 34, respectively. The subtracted fraction subtracts the unit, one, from the Inch Core 33 which, in turn, subtracts the unit one from the Primary Core 22 and the remainder, if any, of the subtractions of fractions is itself retained in the Fraction Core 44 of the apparatus. Recordation of Feet, Inches and Fractions in appropriate Displays 1 will be as hereinbefore described.

As hereinbefore described, the number twelve character key in the Inch Keyboard 3 will function in the same manner during subtraction as during addition, except that the subtraction, being negative, will reduce recorded feet by one unit, while inches retained in Inch Core 33 will continue to be retained and will continue to be displayed.

As hereinbefore described, Feet will be represented by the Primary Keyboard 2 and subtraction of feet will be accomplished in the same manner as addition of feet, but by use of the subtraction key 21. Representation of negative feet in the Primary Display 1 will be indicated by the Negative Sign Indicator (not shown). The functioning of the apparatus by use of auxiliary keys and switches during subtraction, by use of negative numbers, will be the same as that function described for addition, and the representation of negative numerics will be indicated by the Negative Sign Indicator (not shown). Negative feet, inches and fractions may be used as constants, may be converted to and from negative decimal equivalents and may be converted to and from negative metric equivalents. The clear key 24, the clear entry key 25, the percent key 26 and the square root key 27 will function as hereinbefore described.

Note that, as also hereinbefore described, the equals (=) function key 21 will not be used to finalize the sums of subtractions of two or more fractions. The sums of two or more negative feet, inches and fractions will be cumulatively recorded in the Displays 1.

DIVISION

Figure 5:
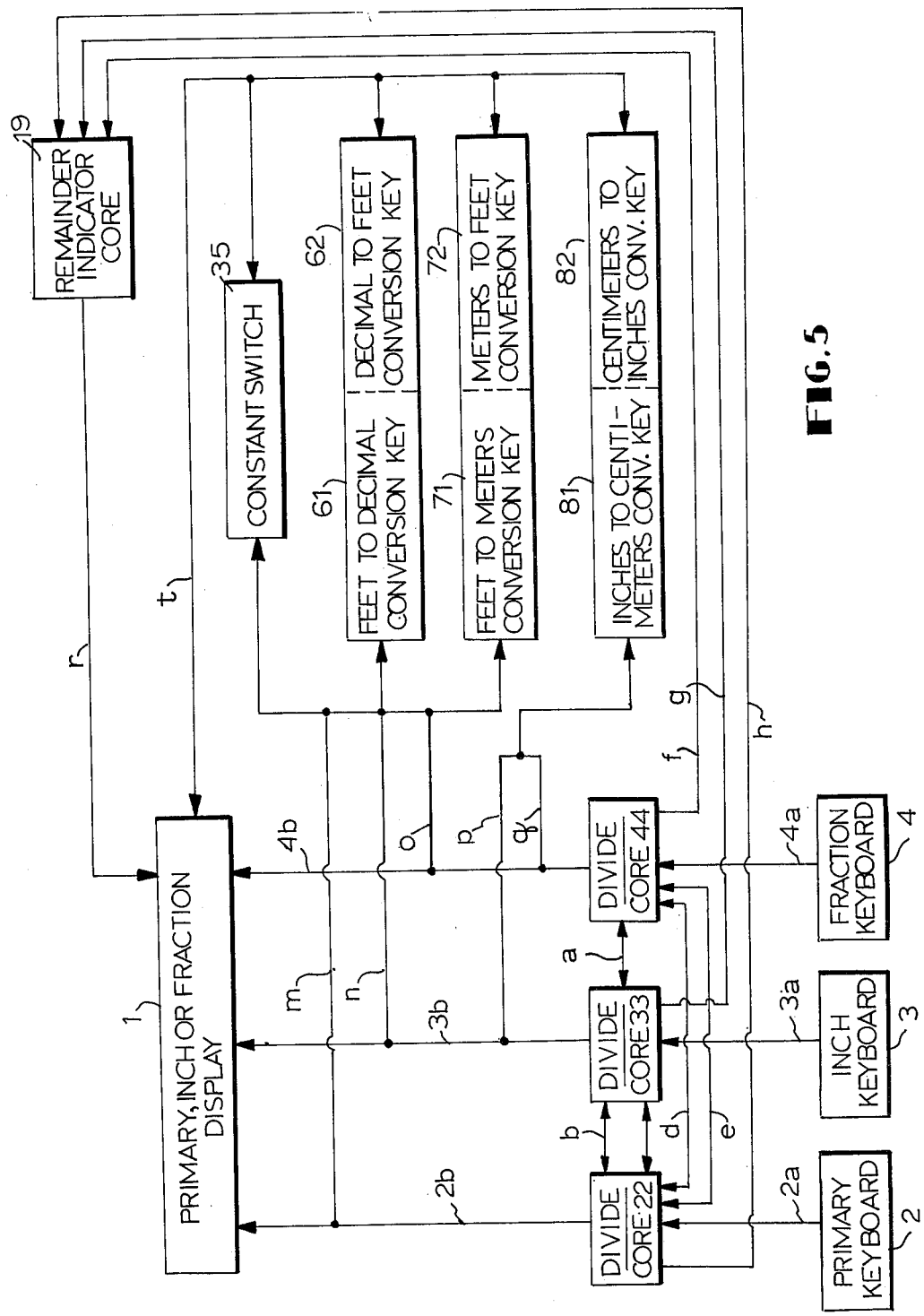
FIG. 5 is a block diagram illustrating the apparatus for performing division.

FIG. 5 is a block diagram illustrating the method by which division of feet, inches and fractions will be performed in the apparatus.

There will be 22 categories of division, as follows:
(1) Feet by Inches
(2) Feet by Fractions
(3) Feet by Inches and Fractions
(4) Feet by Decimal numbers
(5) Inches by Fractions
(6) Inches by Decimal numbers
(7) Fractions by Decimal numbers
(8) Feet and Inches by Inches
(9) Feet and Inches by Fractions
(10) Feet and Inches by Decimal numbers
(11) Feet and Inches by Inches and Fractions
(12) Feet and Fractions by Fractions
(13) Feet and Fractions by Inches and Fractions
(14) Feet and Fractions by Decimal numbers
(15) Inches and Fractions by Fractions
(16) Inches and Fractions by Decimal numbers
(17) Feet, Inches and Fractions by Fractions
(18) Feet, Inches and Fractions by Decimal numbers
(19) Feet, Inches and Fractions by Feet, Inches and Fractions
(20) Feet, Inches and Fractions by Feet and Inches
(21) Feet, Inches and Fractions by Feet and Fractions
(22) Feet, Inches and Fractions by Inches and Fractions Category (4), Feet by Decimal numbers is actually Decimal number by Decimal number inasmuch as Feet is represented by the Primary Keyboard 2 and in the Primary Display 1. This category of division is possible in currently available electronic calculators. It is an object of the present invention to be capable of performing division under categories (1) thru (3) and (5)

thru (22). Metric Measurement Numerics are actually decimal numbers and division by metric numerics will fall under category (4).

Decimal numbers are defined for the purposes of this section of the disclosure to be numerics without decimal points; that is, whole numbers.

For the purposes of this disclosure, the dividend will be a single numeric or numerics recorded in the Displays 1; the divisor will be a single numeric or numerics entered into the apparatus and retained in Primary Core 22, Inch Core 33 and Fraction Core 44. The quotient of the function of division will be recorded in the Primary, Inch and Fraction Displays 1, as appropriate. Any numerics recorded in the Displays 1, whether by initial entering or by the result of other operations of the apparatus, will be a dividend and capable of being divided by a divisor as hereinafter described.

Inasmuch as division will not always be exact, provision will be made in the apparatus to retain and record the final "remainder." This will be accomplished by retaining the final remainder in the Remainder Core 19 and by recording the final remainder in the Primary, Inch and Fraction Displays 1. A remainder indicator 9 light will be actuated to alert the user of the apparatus that there is a final remainder. The quotient of the division, having been recorded in the Display 1, will be cleared from the Display when an appropriate key is depressed, making momentary contact within the apparatus, which will cause the final remainder to be recorded in the appropriate display, as hereinafter described.

Any numeric or numerics recorded by any means in the Display 1 will also be retained in the Primary Core 22, Inch Core 33 and Fraction Core 44. Depression of the division key 21 will establish the sequence of impulses, $a, b, c, d, e$, between the cores. The divisor will be entered into the apparatus via impulses $2a, 3a$ and $4a$, as appropriate, and will be retained in the Primary Core 22, Inch Core 33 and Fraction Core 44. When the Equals key 21a is depressed, making momentary contact within the apparatus, the dividend will be divided by the divisor, via impulses $a, b, c, d$ and $e$. The dividend, previously recorded in the Displays 1, will be automatically cleared from the Displays 1, and the quotient will be recorded in the Display 1, via impulses $2b, 3b$ and $4b$. Should there be a final remainder as a result of division, the final remainder will be transferred, via impulses $f, g$, and $h$, to the Remainder Core 19, at which time the remainder indicator 9 will be actuated in the Display 1. Depression of the equals key 21a, making momentary contact within the apparatus, will cause the final remainder, retained in Remainder Core 19, via impulse r, to be recorded in the Display 1.

Impulses $a, b, c, d$ and $e$, between the Primary Core 22, Inch Core 33 and Fraction Core 44 are indicated to be two-directional. One direction will serve to divide a fraction into an inch via impulse $a$, to divide a fraction into feet via impulse $d$, to divide an inch into feet via impulse $b$, to divide a decimal numeric into an inch via impulse $c$ and to divide a decimal number into a fraction via impulse $e$.

Use of the same impulses will allow division of feet by Inches and Fractions, Feet and Inches by fractions, and so on as described hereinbefore for the various categories of division.

During some divisions, there will be internal or sub-remainders. These subremainders will occur, for example, when feet and inches are divided by decimal numerics. The division may result in there being a sub-remainder of say, 1 foot. The one foot, equal to 12 inches, would be transferred via impulse $b$, to the inch core 33 and the number twelve would be automatically added to whatever inches are retained in the Inch Core 33. Thus, the Inch Core 33 will retain, considering the present example, from twelve to twenty-three inches. The division will continue with the inches (12 to 23) retained in the Inch Core 33 divided by the decimal numerics. In such case, the division may be exact and there will be no final remainder or there may be a final remainder which, via impulse $g$, would be retained in Remainder Core 19 with the Remainder Indicator 9 actuated in the display 1, and the final remainder would be recorded in the Display 1 as hereinbefore described.

Similarly, inches and fractions divided by a decimal numeric could result in a sub-remainder of one inch, for example, in which case eight-eighths would be transferred via impulse a to the Fraction Core 44 and the eight-eighths would be automatically added to whatever eighths are retained in the Fraction Core 44. Thus, the Fraction Core 44 will retain, considering the present example, from eight to fifteen eighths. The division will continue with the fractions retained in the Fraction Core 44 divided by the decimal numeric. As described hereinbefore in the prior example a final remainder, if any, will be recorded in the Display 1.

In some cases, for example dividing Feet and Fractions by a decimal numeric, the transfer of twelve inches from Primary Core 22 to Inch Core 33 will create inches where none were previously entered into the apparatus and recorded in the Display 1.

The same principal will be applicable for many of the division categories enumerated hereinbefore, with the transfer of multiples of twelve inches from the Primary Core 22 to the Inch Core 33 and with the transfer of multiples of eight-eighths from the Inch Core 33 to the Fraction Core 44. The functioning of the apparatus by use of auxiliary keys and switches during division will be the same as that function described for addition. The quotient recorded in the Displays 1, as long as there is no final remainder, will be capable of operations with the use of the percent key 26, square root key 27, constant switch 35 and conversion keys 61, 62, 71, 72, 81 and 82. When a final remainder occurs and is recorded in the Display 1 by use of the equals key 21a, the quotient will be cleared from the apparatus. To continue use of the apparatus for any function, the final remainder will have no significance and the apparatus must be cleared by use of the Clear Key 24. If, in division, an erroneous divisor is entered into the apparatus, said divisor can be cleared by use of the clear entry key 25 without affecting the dividend retained in the Primary Core 22, Inch Core 33 and Fraction Core 44 and recorded in the Display 1.

For division involving feet, inches and fractions, the Operation Selector Switch 66 must be set at FT/IN. The Decimal Selector Switch 231 will have no effect on the function of division involving inches and fractions and so may rest in any position. It should be noted here that, as described hereinbefore, division by decimal numeric will be confined to division by whole numbers. Should the user attempt to divide a numeric including inches and fractions by a numeric with a decimal point, the Error Indicator (not shown) will be actuated. Thus, should the user, using Primary Keyboard 2, depress in sequence character keys representing any numeric, followed by depressing the decimal point Character Key 23, the apparatus will be capable of performing divison. However, after depressing the decimal point Character Key 23, depressing any other character key will actuate the Error Indicator (not shown) and an interlock within the apparatus will prevent the equals key 21a from being depressed.

MULTIPLICATION

Figure 6:
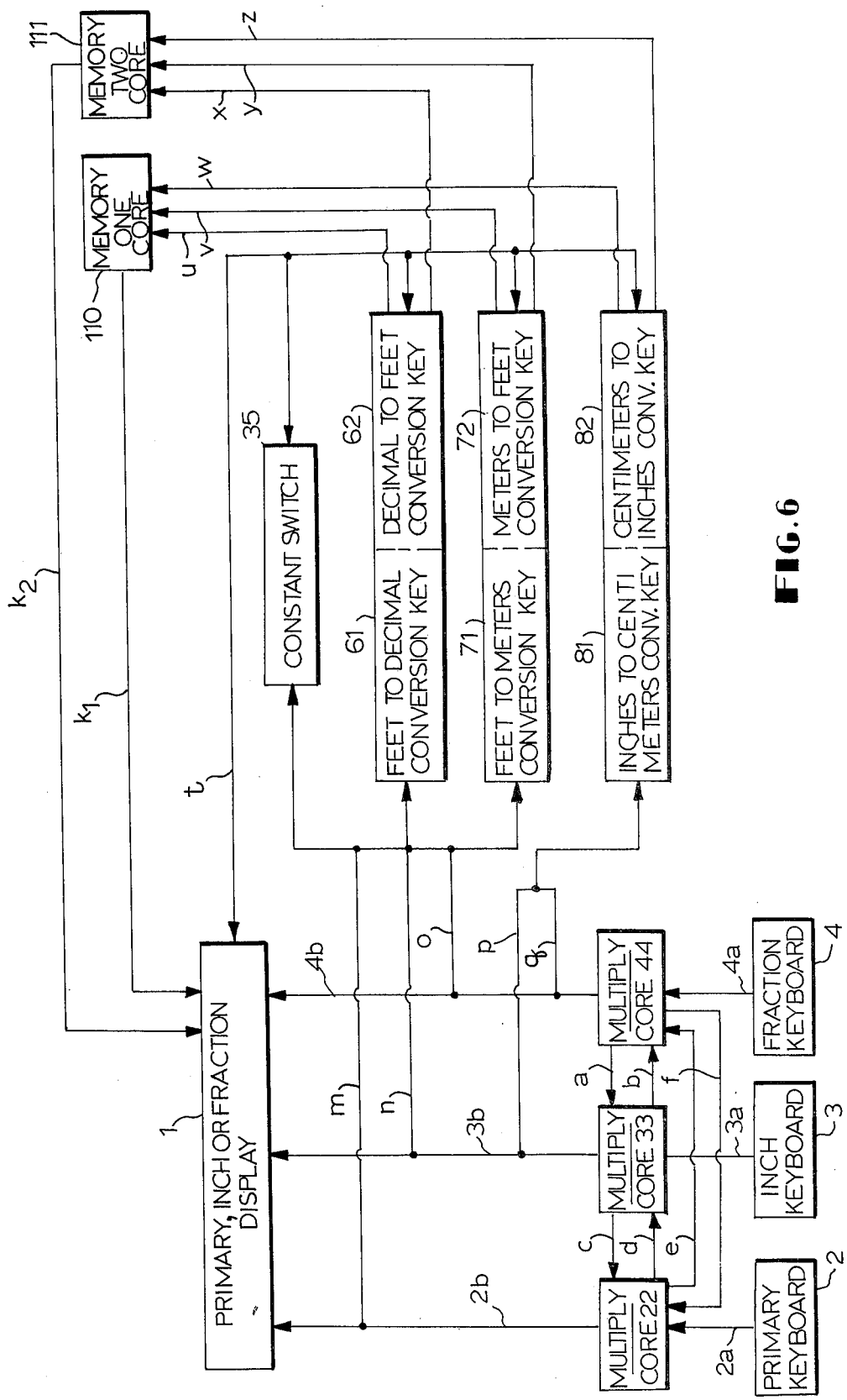
FIG. 6 is a block diagram illustrating the apparatus for performing multiplication.

FIG. 6 is a block diagram illustrating the method by which multiplication of feet, inches and fractions will be performed in the apparatus.

One of the important considerations in multiplication is in the presentation of the result. Multiplication of one feet, inch and fraction numeric by another feet, inch and fraction numeric will result in an answer normally referred to as "square feet" or "square inches," commonly termed "area." However, area might not always be exactly N square feet or N square inches. It also might not be exactly N + 1 square feet or N + 1 square inches but may fall between N and N + 1, for example between 1 and 2. It is the representation of that portion of the numeric between N and N + 1 which is of importance. That portion, for convenience in this disclosure, is termed "fractional," a fraction of unity.

A specific example will best illustrate the representation of fractional area: while an area may be called one and one-quarter square feet, the most common form of presentation is to call the area 1.25 square feet. Area is almost invariably referred to in decimal terms when representing feet, inches and fractions.

An object of this invention is to present the product of multiplication of one feet, inch and fraction numeric by another feet, inch and fraction numeric in decimal form. The apparatus will have two means to accomplish this object. First, by direct multiplication of one feet-inch-fraction numeric by another feet-inch-fraction numeric followed by conversion of the product, in feet-inch-fraction numeric, to decimal equivalent and second, by conversion of each feet-inch-fraction numeric to decimal equivalent and then by multiplying one decimal equivalent by the other decimal equivalent. To accomplish this object, the Feet to Decimal Conversion Key 61 and two memories, Memory One and Memory Two have been provided in the apparatus, with each memory having its own memory core, referred to herein as Memory One Core 110 and Memory Two Core 111.

As described hereinbefore, a Feet-Inch-Fraction numeric (Feet, Inches and Fractions, Feet and Inches, Feet and Fractions, or Inches and Fractions) will be entered into the apparatus via impulses 2a, 3a and 4a, as appropriate. The Feet-Inch-Fraction numeric will be retained in the Primary Core 22, the Inch Core 33 and the Fraction Core 44 and, by depressing the multiplication key 21, the Feet-Inch-Fraction numeric, via impulses 2b, 3b and 4b, will be recorded in the Primary Display, the Inch Display and the Fraction Display 1. Also, as hereinbefore described, a Feet-Inch-Fraction numeric can be retained in the cores 22, 33, 44 and recorded in the Displays 1 as the result of other functions of the apparatus. Thus, any Feet-Inch-Fraction numeric retained in Cores 22, 33, 44 and recorded in Display 1 can be a multiplicand.

To multiply a multiplicand by a Feet-Inch-Fraction multiplier, first the multiplication key 21 is depressed and the sequence of impulses a, b, c, d, e and f between the Primary Core 22, Inch Core 33 and Fraction Core 44 will be established. The multiplier will be entered into the apparatus via impulses 2a, 3a and 4a as appropriate and will be retained in the Primary Core 22, Inch Core 33 and Fraction Core 44. When the equals key 21a is depressed, making momentary contact within the apparatus, the multiplicand will be multiplied by the multiplier via impulses a, b, c, d, e and f, the multiplicand, previously recorded in the Displays 1, will be automatically cleared from the Displays 1 and the product will be recorded in the Displays 1 via impulses 2b, 3b and 4b. The product thus recorded will be in Feet, Inches and Fractions and, as stated above, is not considered a valid representation of area. Therefore, the Feet-Inch-Fraction numeric must be converted to decimal equivalents, and this conversion is accomplished by use of the Feet to Decimal Conversion Key 61 as hereinbefore described.

During multiplication, there will be internal additions of inches and fractions. These additions will occur, for example, when inches and fractions of multiplied by decimal numerics. The multiplication of inches by a decimal numeric may result in a total of inches greater than eleven. When that occurs, any total of inches which is equal to or greater than a multiple of twelve will be added via impulse c, as one or more units (total inches divided by twelve) to whatever feet are retained in the Primary Core 22, with the remainder of inches, eleven or less, being retained in the Inch Core 33. Similarly, the multiplication of fractions by a decimal numeric may result in a total of eighths (of an inch) greater than seven. When that occurs, any total of fractions (in eighths) which is equal to or greater than a multiple of eight will be added, via impulse a, as one or more units (total eights divided by eight) to whatever inches are retained in the Inch Core 33 with the remainder of eighths of an inch, seven or less, being retained in the Fraction Core 44.

The multiplication of fractions and inches by decimal numerics will be performed in the apparatus so that whenever the multiplication of fractions transfers, via impulse a, sufficient units to the Inch Core 33 to create within the Inch Core 33a sum of inches twelve or greater, a unit, one, will automatically be transferred to the Primary Core 22 via impulse c.

Thus, it can be seen that multiplication will involve the transfer of units from the Fraction Core 44 to the Inch Core 33 and from the Inch Core 33 to the Primary Core 22. Multiplication of Feet-Inch-Fraction numerics by decimal numerics or by another Feet-Inch-Fraction numeric will result in a product determined by sequential operations via impulses a, b, c, d, e and f in such a manner as to add units to appropriate cores and upon depressing the equals key 21a to record the product in the appropriate Displays 1.

The alternate method of multiplying one Feet-Inch-Fraction numeric by another Feet-Inch-Fraction numeric, as hereinbefore described, requires conversion of each Feet-Inch-Fraction numeric into decimal equivalents by use of the Feet to Decimal Conversion Key 61. Also, as hereinbefore described, any numeric recorded in the Displays 1 can be considered the multiplicand and by virtue of its being so recorded in the Displays 1 can be converted into decimal equivalent by use of the Feet to Decimal Conversion Key 61. Once conversion to decimal equivalent is accomplished, the decimal equivalent, recorded in the Primary Display 1, will be the multiplicand. For the apparatus to function in multiplication, the multiplier must then be entered into the apparatus. The Multiplier, however, will be a Feet- Inch-Fraction numeric and it must also be converted to decimal equivalent. To be converted, the multiplier must itself be entered into the apparatus and recorded in the Displays. This can be accomplished by considering the multiplier as a new multiplicand and, by depressing the appropriate character keys in Keyboards 2, 3 and 4, the Feet-Inch-Fraction numeric will be entered into the Primary Core 22, the Inch Core 33 and the Fraction Core 44. Then, by depressing the multiplication key 21, the Feet-Inch-Fraction numeric will be recorded in the Primary, Inch and Fraction Displays 1. However, depressing the multiplication key 21 will automatically clear the Displays 1 including the numeric previously recorded as the multiplicand in decimal equivalent. To retain the prior multiplicand, the user would have to either memorize or write down the numeric. To avoid such necessity, the memories have been provided in the apparatus.

In the alternate method herein described, in order to convert both Feet-Inch-Fraction numerics into decimal equivalent prior to the actual multiplication, the first entered and recorded Feet-Inch-Fraction numeric will be converted into decimal equivalent by depressing the Feet-to-Decimal Conversion Key 61, following the method hereinbefore described. The decimal numeric thus recorded in the Primary Display 1 will be entered into Memory One Core 110, by appropriate means via impulse u, by depressing the M + 1 character key in Keyboard 110. Simultaneously, the Memory Indicator Light 101 will be illuminated to indicate that a numeric has been entered into and is retained in Memory One Core 110. Entering a numeric into Memory One Core 110 will automatically clear all Displays 1, Primary Core 22, Inch Core 33 and Fraction Core 44.

At this point, the Feet-Inch-Fraction numeric multiplier can be entered into the apparatus via impulses 2a, 3a and 4a, retained in the Primary Core 22, Inch Core 33 and Fraction Core 44, respectively, and can be recorded in the Primary Display, Inch Display and Fraction Display 1 as appropriate by depressing the multiplication key 21, or by any one of the other three function keys 21. Having been recorded in the appropriate Displays 1, the Feet-Inch-Fraction numeric can be converted to decimal equivalent by depressing the Feet to Decimal Conversion Key 61 and the Decimal equivalent will be recorded in the Primary Display 1. Note that the decimal equivalent will also be retained in the Primary Core 22.

Thus, at least decimal numeric recorded in the Primary Display 1 will be considered the multiplicand. By depressing the multiplication key 21, the apparatus will be ready to receive the multiplier. However, the multiplier is already retained in the apparatus, specifically in Memory One Core 110 where the first decimal equivalent was entered as hereinbefore described. When the MR1 key in Keyboard 110 is depressed, the multiplicand will be multiplied by the multiplier and the product retained in Primary Core 22. When the MR1 key is depressed, the decimal numeric retained in Memory One Core 110 will be transferred via impulse k1 to the Primary Display 1 and to the Primary Core 22 via impulse 2b, in reverse, but will still be retained in Memory One Core 110. When the equals key 21a is depressed, making momentary contact within the apparatus, the product will be recorded in Primary Display 1, will be retained in Primary Core 22 and Memory One Core 110 will automatically be cleared.

It should be noted here that determination will have to be made whe Feet-Inch-Fraction numerics are converted to decimal equivalents as to where the decimal point is to be positioned. Therefore, the user will set the Decimal Selector Switch 231 at the appropriate position. It will be recommended that for multiplication of decimal numerics, the Decimal Selector Switch 231 be set at 4 places although, depending on the magnitude of the Feet-Inch-Fraction numerics, two places might be appropriate.

It will also be possible to enter the multiplier, converted into decimal equivalent, into Memory Two Core 111, via impulse x, and then to multiply the two decimal numerics retained within the two Memory Cores 110, 111 by each other, that is, the multiplicand retained in Memory One Core 110 by the multiplier retained in Memory Two Core 111.

This will be accomplished in the following manner: The decimal numeric retained in Memory One Core 110 will be recorded in the Primary Display 1 via impulse K1 when the MR1 key is depressed, making momentary contact within the apparatus. That decimal numeric will also be transferred to the Primary Core 22 via impulse 2b, in reverse, and will be considered the multiplicand. The decimal numeric retained in Memory Two Core 111 will now become the multiplier. The user will now depress the multiplication key 21, thus establishing the sequence for multiplication in Primary Core 22. When the MR2 key is depressed, making momentary contact within the apparatus, the decimal numeric retained in Memory Two Core 111 will be recorded via impulse k2 in the Primary Display, at which time the prior decimal numeric is cleared from the Primary Display 1, but will still be retained in the Primary Core 22. The multiplier decimal numeric will also be transferred to Primary Core 22 via impulse 2b, in reverse, and the multiplicand will be multiplied by the multiplier. When the equals key 21a is depressed, making momentary contact within the apparatus, the product will be recorded in the Primary Display 1 via impulse 2b and will also be retained in the Primary Core 22.

The product recorded in Primary Display 1 and retained in Primary Core 22 will be the decimal numeric termed "area." This decimal numeric will be useful as a multiplicand when the user wishes to determine "Volume," in cubic feet, which will be described hereinafter. In a very similar manner to the method described hereinbefore of converting two Feet-Inch-Fraction numerics to decimal equivalents and of multiplying the two decimal numerics which have been retained in Memory One Core 110 and Memory Two Core 111, respectively, will also apply when the user wishes to convert Feet-Inch-Fraction numerics to metric measurement equivalents, both in meters and in centimeters.

For conversion of Feet-Inch-Fraction numerics to metric measurement equivalents, the Feet to Meters Conversion key 71 will be depressed, as hereinbefore described. The metric measurement numeric, which will be in decimal form, will be entered into Memory One core 110 by depressing the M + 1 key in Keyboard 110 and the metric measurement numeric will be entered into Memory One Core 110 via impulse v. Similarly, a metric measurement numeric can be entered into Memory Two Core 111 via impulse y.

And in a similar manner, Inch-Fraction numerics can be entered into Memory one Core 110 via impulse w and into Memory Two Core 111 via impulse z.

Multiplication of metric measurement numerics, meters or centimeters, will be accomplished by means of depressing, in sequence as described hereinbefore, the MR1 key, the multiplication key 21, the MR2 key and the equals key 21a. The product of said multiplications will be recorded in the Primary Display 1 and retained in the Primary Core 22 and, if required, will be considered the multiplicand when the user wishes to determine "volume," in cubic meters or in cubic centimeters. The determination of volume, that is, area times height, recorded as cubic feet, cubic inches, cubic meters or cubic centimeters can easily be obtained by following the procedure described hereinbefore. The area determined, square feet, square inches, square meters or square centimeters, can be considered as one multiplier and can be entered into Memory One Core 110 as hereinbefore described. The second multiplier, a Feet-Inch-Fraction numeric, can be converted to the equivalent in decimal numeric, the equivalent in meters or the equivalent in centimeters. These equivalents can be entered into Memory Two core 111 as hereinbefore described and then, by depressing the appropriate keys in sequence: MR1 key, multiplication key 21, MR2 key and equals key 21a, the product will be recorded in the Primary Display 1 and will be retained in the Primary Core 22.

The use of the memories has been indicated as being of prime importance during the function of multiplication. Many electronic calculators currently available have a "memory" and the present invention will be capable of functioning in a similar manner for other functions such as addition, subtraction, division or taking a percent. The present invention, with two memories, will have greater capabilities than electronic calculators currently available with only one memory. The present invention will, by nature of its similarity to electronic calculators currently available, be able to perform "chain" and "mixed" calculations, where numerics entered are in feet, inches and fractions of an inch. Included in the present invention will be those specialized features found in currently available electronic calculators such as a clock circuit to provide the timing base for operations which must operate in a sequenced manner, integrated circuits, control mechanisms, registers, decoders and segment converters.

The present invention will have three possible sources of power. One will be electric, 110 volt 60 cycle, "household" current. The second will be with use of rechargeable batteries. The third will be by use of commonly available "throw-away" alkaline or similar batteries.

POWER TURN ON

Figure 7:
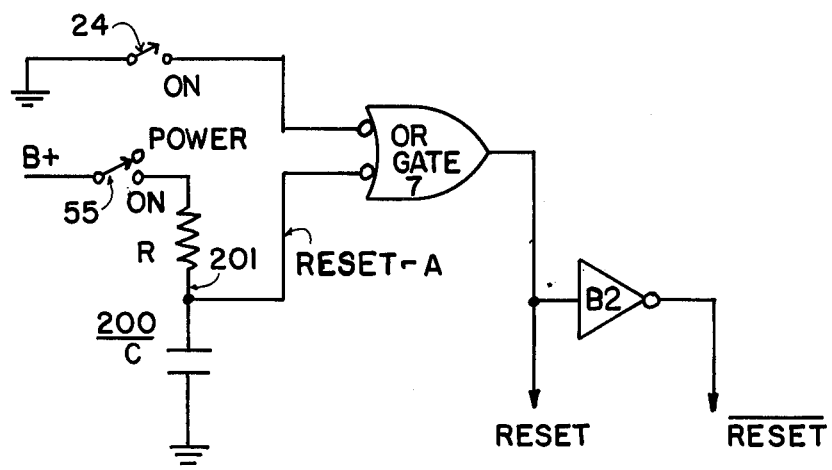
FIG. 7 is a circuit diagram illustrating a circuit for starting and resetting the apparatus.

Referring now to FIG. 7, when the power to the unit 10 is initially turned on by switch 55, a general reset to the system occurs, which causes various flip-flops, shift registers, memory registers to reset to their "zero" state. Resetting is accomplished by a reset generator circuit 200, consisting of an R-C network 201, as is shown on FIG. 7. When the power to the system is turned on, the RESET-A line is in a "low" state and remains low until the capacitor C of the R-C network charges above the threshold level. This low voltage, which passes through GATE OR7 and Inverter B2 is applied to the reset terminal of various devices and assures that these units initially assume their "reset" or "zero" state. After the reset -A voltage passes through its threshold, as capacitor C charges, these devices remain in the "zero" state until otherwise activated. Inverter B2 is a buffer, which produces a $\overline{RESET}$ signal, where required in the system. Switch 24 is a reset switch which allows for manual reset throughout the system.

DECIMAL KEY INPUT

Figure 8:
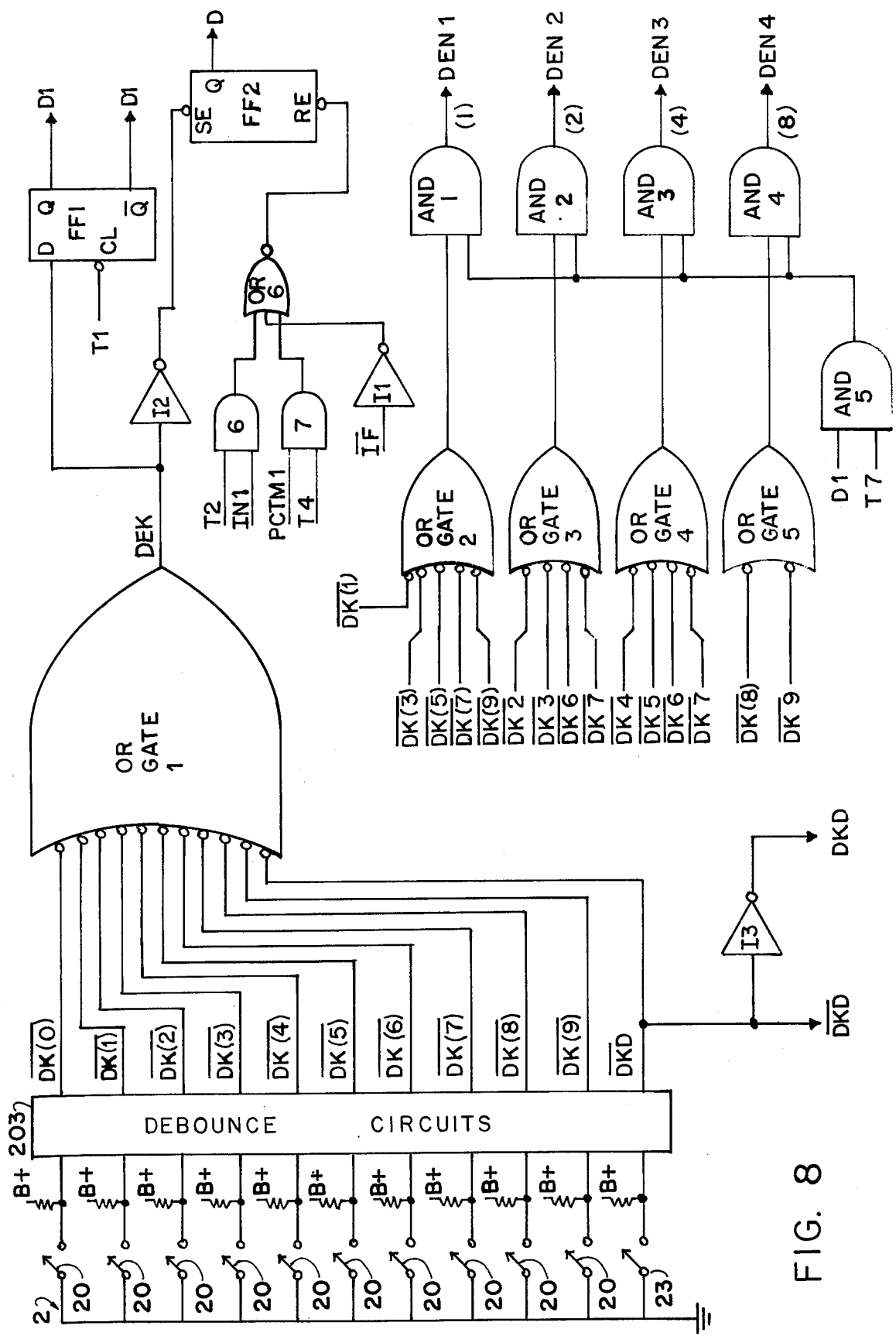
FIG. 8 is a circuit diagram illustrating a circuit for providing a decimal input for the apparatus, which is also used to represent the measurement of "feet"
Figure 34:
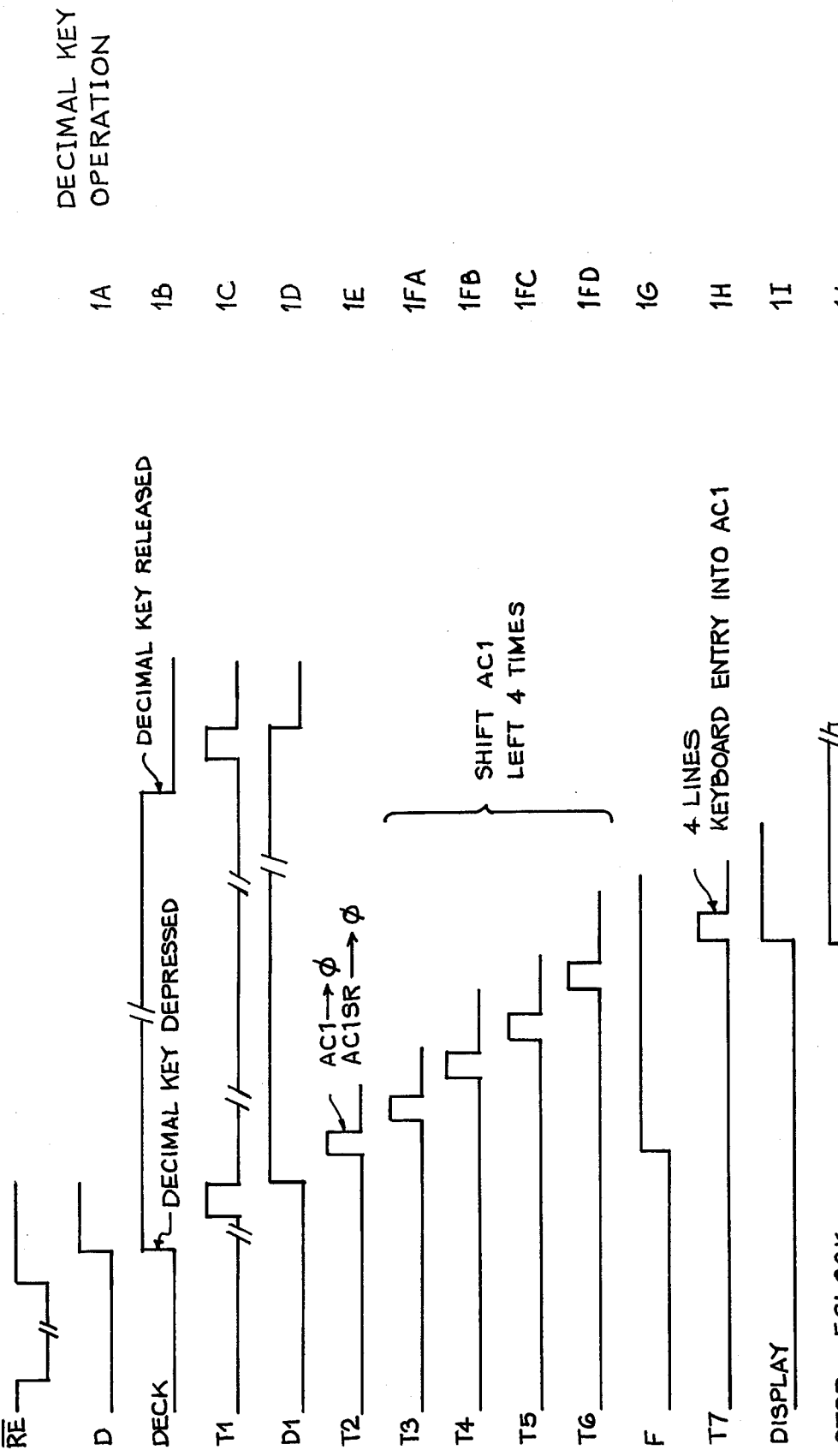
FIGS. 34–50 are diagrams illustrating various wave forms and pulse sequences for operating the circuitry of the apparatus, wherein the numeral designation of each figure corresponds to the circuitry to which the wave forms and pulse sequences apply.

Referring now to FIG. 8 and FIG. 34, the decimal keyboard switches are shown. Whenever any one of the ten keys 20, representing the digits 0 to 9 or the decimal point key 23, is depressed, a low voltage appears at the output of the associated switch $\overline{DK\,(O)}$ to $\overline{DK\,(O)}$ and $\overline{DKD}$. The invert sysmbols are used to show that a "zero" logic level is produced, when any of these keys are depressed. The decimal keyboard is generally used for calculations involving feet.

The decimal keyboard outputs are applied to an inverted input OR GATE OR1. An output line DEK from OR GATE OR1 becomes "high," whenever one of the decimal keys 20 is depressed. When a first clock pulse T1 appears, a flip-flop FF1 is set to "one." The line DEK (which is at "one") is applied to the "D" input of the flip-flop FF1. A "one" output on the D1 line is created on the leading edge of the clock pulse T1. Waveforms 1D and 1E of FIG. 34 show this operation.

At time T2, shown by waveform IE, an accumulator AC1 is reset to zero. This clears the accumulator AC1 for entry of subsequent data from the decimal keyboard 2 at a time T7, represented by waveform 1H. Clearing of AC1 is only required, when the first decimal key 20 is depressed during entry of a series of numerals from the keyboard 2. Subsequent entries cause AC1 to shift left by one decade, allowing room in the least significant decade (LSD) for entry of the next digit.

The keyboard entries are debounced by a convenient debouncing circuit 203, in order to eliminate spurious multiple entries. Since the keyboard entries have durations of over 5 milliseconds, and since clock pulse periods are on the order of 1 $\mu$ second, then no data will be lost from the keyboard even when entry of keyboard data into AC1 is delayed by many clock periods. In this case, entry is delayed by seven clock times plus the time is takes for the first clock pulse to appear. During the time that no keys 20 are depressed, the clock generator is free running, providing 64 counts before returning to zero (T$\phi$) clock time. This results in up to a 64 $\mu$ seconds delay before a T1 pulse appears.

At time T3 (waveform 1F-A, FIG. 34), a FF2 (FIG. 9) is set "high", thus preventing further resets to AC1, after entry of the first digit. This inhibits AND GATE AND1 of FIG. 10, as the signal $\overline{F}$ goes to zero. The T2 clock pulse no longer reaches GATE OR3 (FIG. 10) to reset AC1 after the first digit. GATE OR3 has inverted output, which causes all of the AC1 flip-flops to reset and all of the AC1SR flip-flops to reset, if the T2 pulse happens to appear.

FF1 (D1 line) in FIG. 8 controls operation, while any of the keys 20 of the decimal keyboard are depressed. When the DEK line goes high, then FF2 is "set" by line I2. The flip-flop FF2 remains high even after a decimal key 20 is released. This will dictate certain requied functions when keys, other than a decimal key 20, are depressed later on. FF2 receives the general initial reset pulse through "OR-6".

SHIFTING THE DECADE COUNTER AC1 FOR DECIMAL ENTRY

Figure 11:
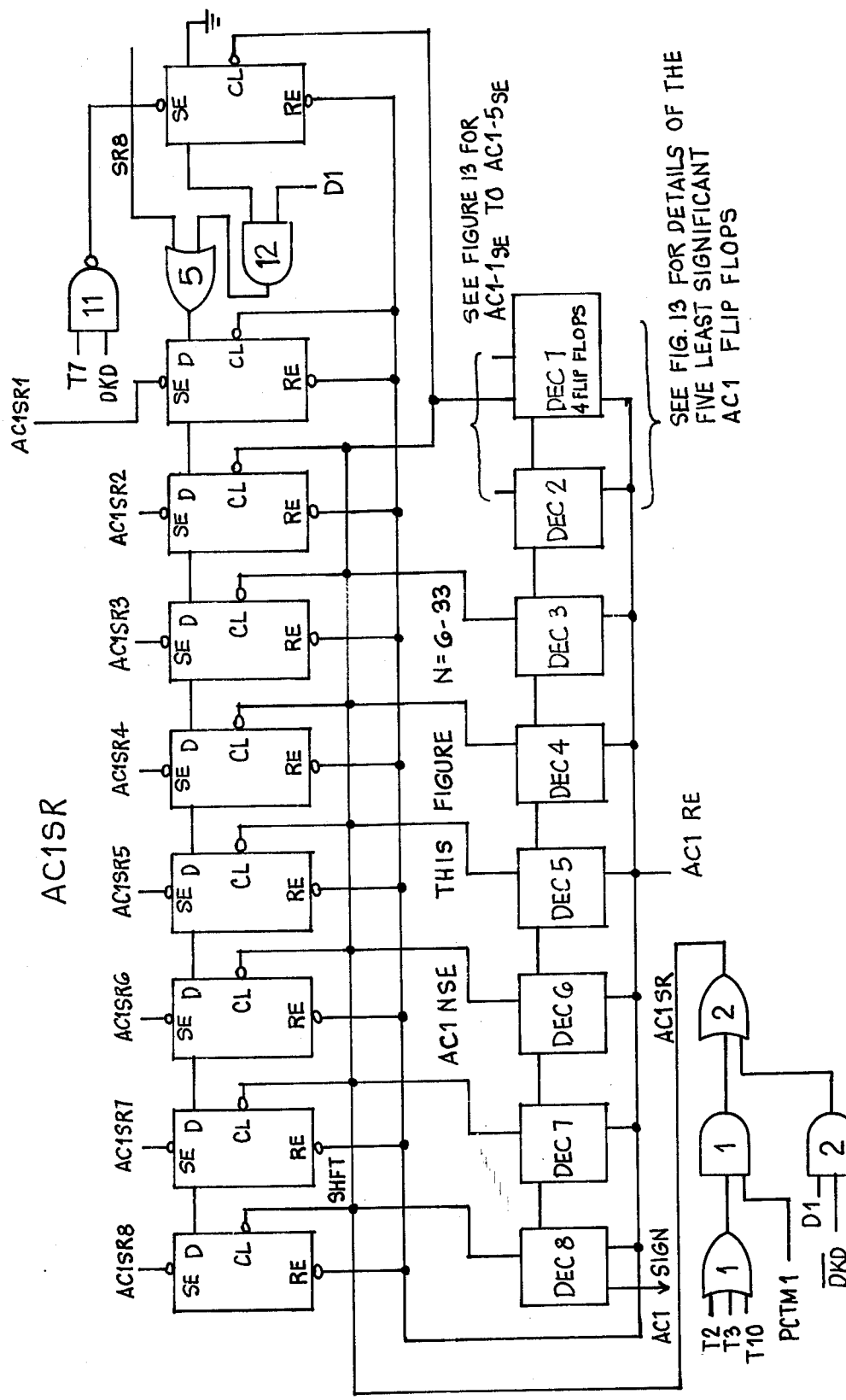
FIGS. 11 and 11A are circuit diagrams showing a plurality of registers or accumulators for storing numbers entered in the apparatus.
Figure 11A:
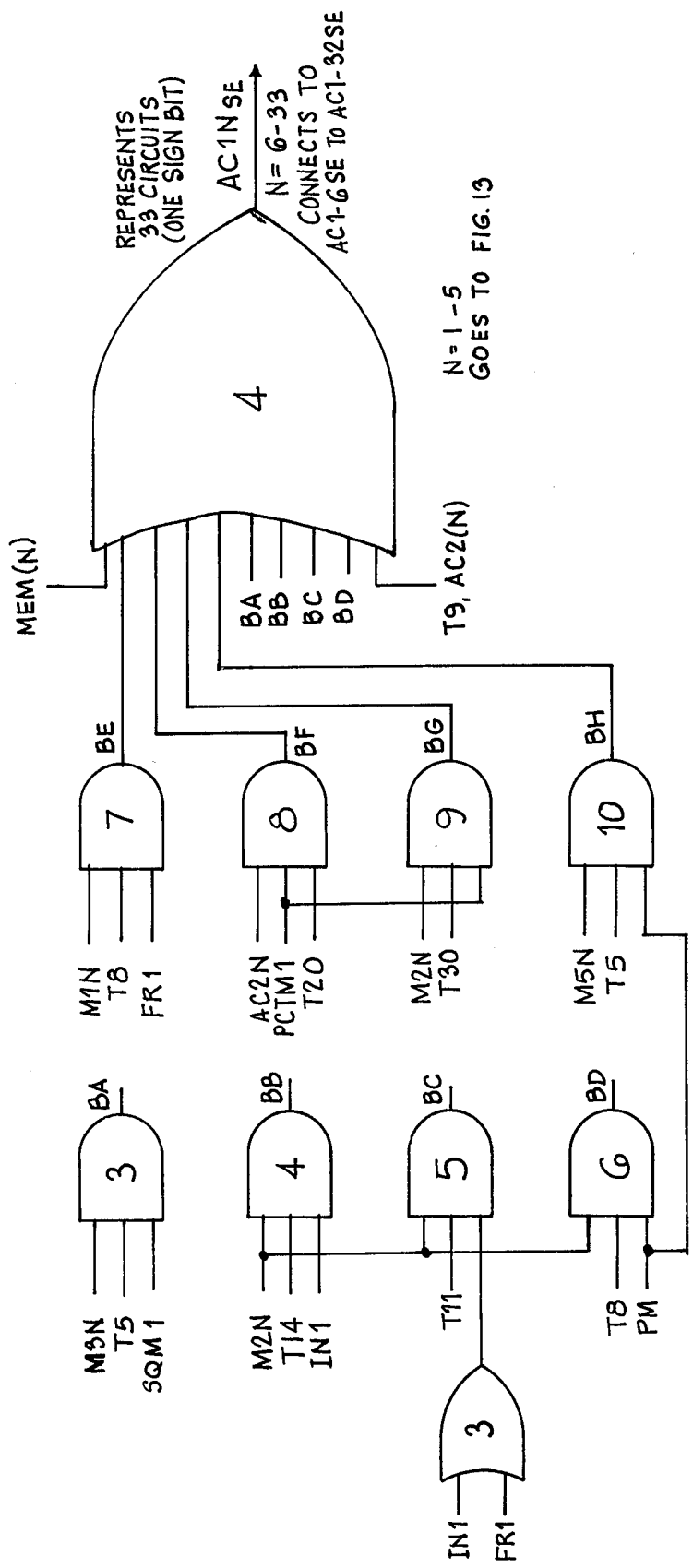
Figure 12:
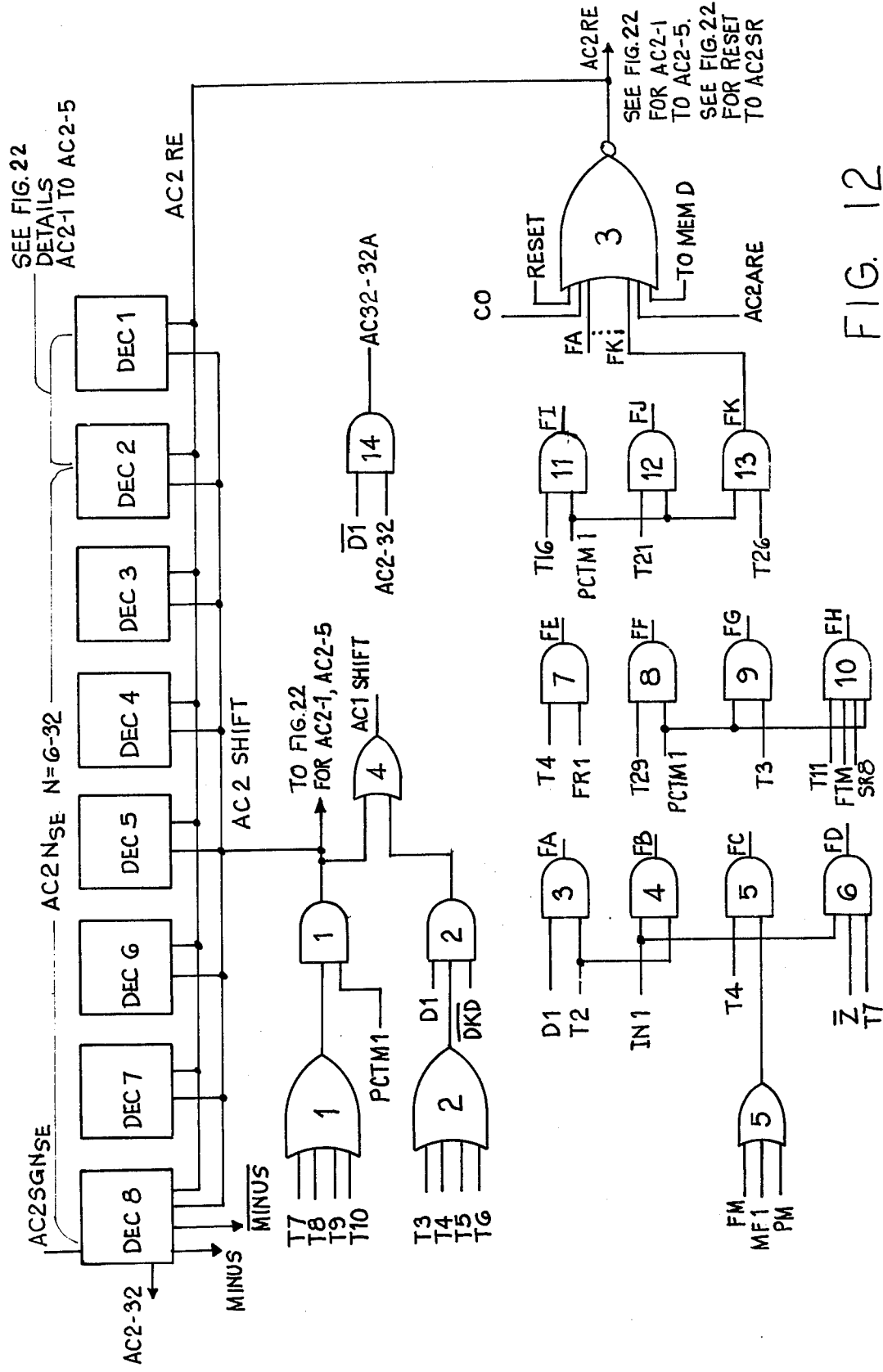
FIG. 12 is a circuit diagram showing various circuits associated with decade counters.

When the D1 line of FIG. 8 goes high, pulses T3, T4, T5 and T6 of FIG. 34 pass through AND GATE 2, FIG. 12, and then to OR GATE 4, shifting the contents of AC1 left four times. Note that each decade of AC1 (FIG. 11) consists of four flip-flops providing a binary coded decimal output (BCD). Thus, with four shifts, the contents of AC1 move left one decade. This is shown in waveforms 1FA through 1FD of FIG. 34. The shifts occur on the traling edge of each of the four clock pulses T3, T4, T4 and T6.

AC1SR (FIG. 11) consists of nine flip-flops AC1SR1-AC1SR8 and AC1SR$\phi$. Only one of these flip-flops is high at a given time. The flip-flop AC1SR1, when "high," indicates that the decimal point of the number in counter AC1 is on the right, the number being an integer. With the flip-flop activated, the number in AC1 is a decimal number less than one. Line AC1SR$\phi$ is connected to the right flip-flop and line AC1SR8 is connected to the flip-flop, with the flip-flop lines in between numbered accordingly. AC1SR is shifted by T6, when D1 of FIG. 8 is high. This pulse passes through "AND GATE 2" (FIG. 11) and then to OR GATE-2 to create the left shift of the decimal point, whenever the AC1 decade counter shifts left.

It is also to be noted that after the shift process, a zero resides in the least significant decade of AC1 and in AC1SR$\phi$. This is so, because the D inputs of AC1-1 and AC1SR$\phi$ (See FIGS. 11 and 13) are zero. With each shift of AC1, a zero passes into AC1-1, and consequently into all four flip-flops of the LSD decade. AC2-32 (FIG. 12), which provides the D input to AC1, is zero because $\overline{D1}$ at the input to AND14 (FIG. 12) is $\phi$ during this period.

ENTRY OF DATA INTO AC1

The entry from the decimal keyboard 2 occurs with clock pulse T7 (waveform 1H of FIG. 34). These signals are derived from OR GATES 2-5 of FIG. 8. This logic converts depressions of keys 20 into (BCD) binary coded decimal language. For instance, if a "one" is depressed, line DEN1 is activated. The clock pulse T7 passes through AND GATE 5 to AND GATE 1, which is enabled through OR GATE 2 (Page 1), Line $\overline{DK1}$ from the keyboard 2 passes through OR GATE 2.

Figure 13:
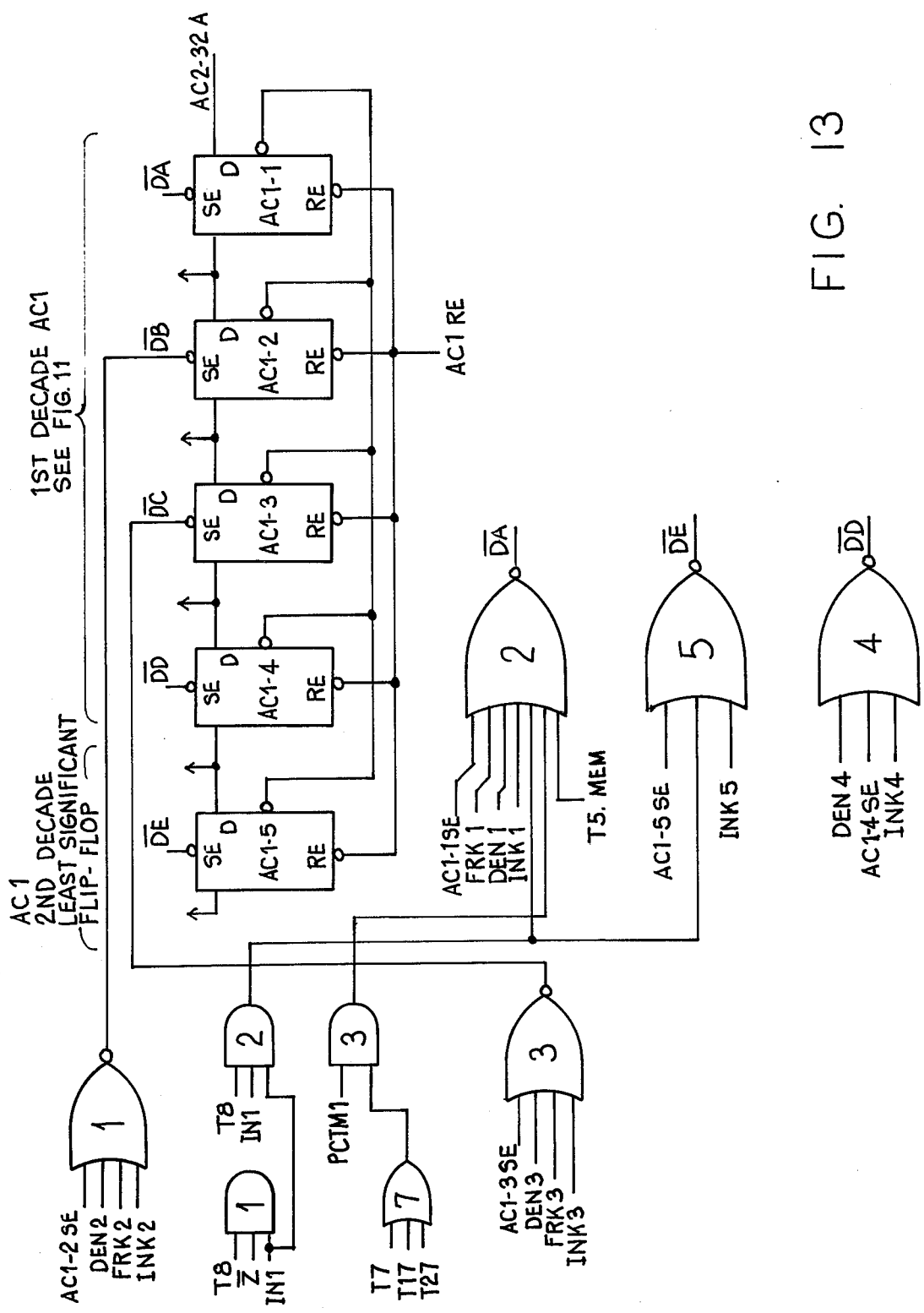
FIG. 13 is a circuit diagram showing decade registers.

If a seven is depressed on the decimal keyboard, DEN1, DEN2, DEN3 are switched to the high state. If an eight is depressed, then the output DEN4 alone is activated. The binary weight of each line DEN1 – DEN4 is noted in (on Page 1). In FIG. 13, these four signals pass through OR GATES 1 through OR GATE 4 is set flip-flops AC1-1 through AC1-5 in the least significant decade of AC1.

Figure 14:
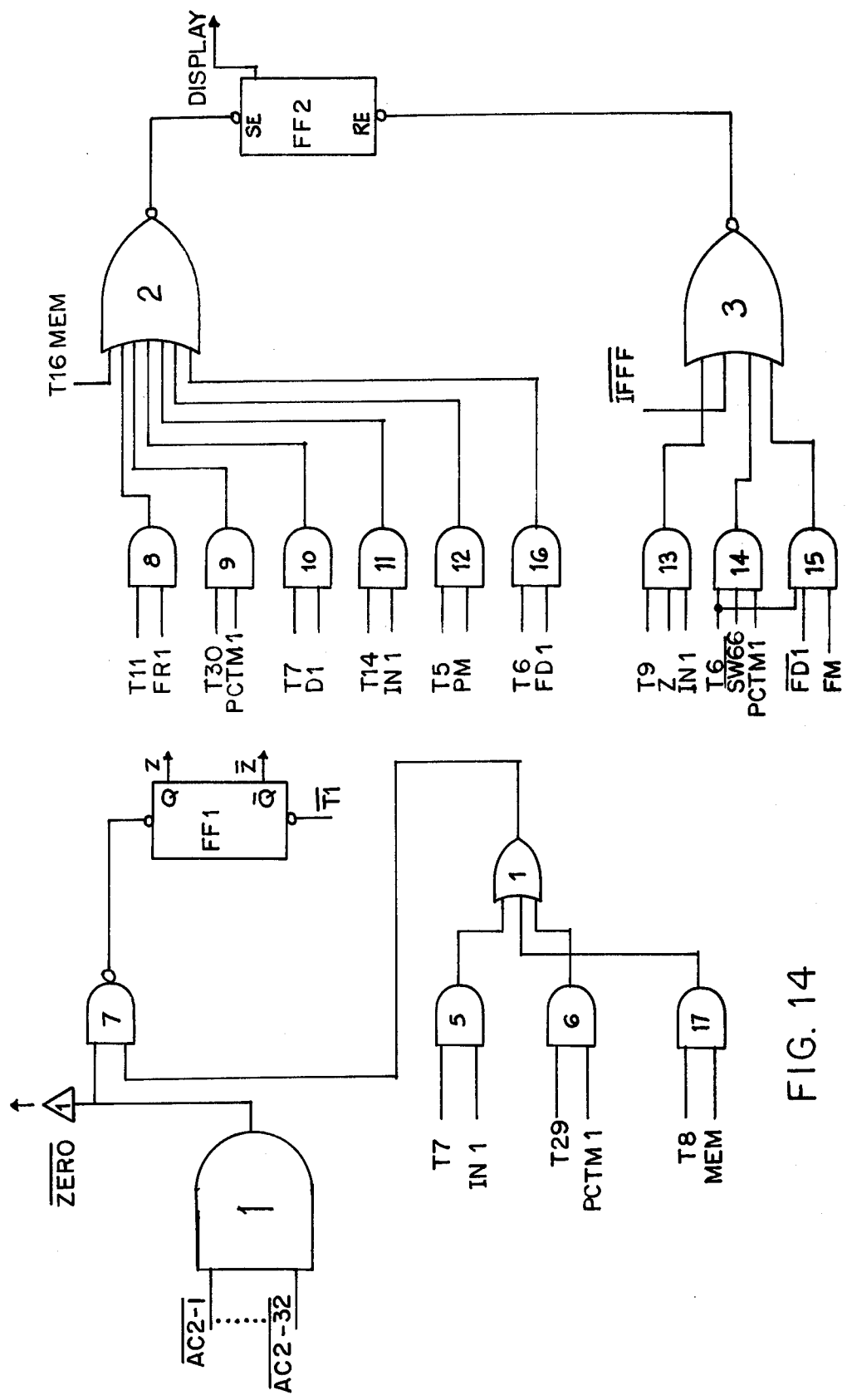
FIG. 14 is a circuit diagram showing circuitry for resetting the display.

The pulse T7 also sets FF2 in FIG. 14 as this pulse through AND GATE 10 and OR GATE 2 of FIG. 14. The flip-flop FF2 of FIG. 14 controls the decimal display 210 of FIG. 15. When the DISPLAY line from FF2 is high, the contents of AC1 will be displayed on the decimal display 210 of FIG. 15. When the DISPLAY line from FF2 is zero, the contents of accumulator AC2 of FIG. 14 will be displayed by the decimal display 210. Thus, register AC1 will be displayed during entry from the decimal keyboard 2, since this register will be the repository for input data. Register AC2 receives the result of any calculation and when an arithmetic result is to be displayed, then FF2 (FIG. 14) will be reset and the display line therefrom becomes zero. The output from register AC2 will then be displayed by display 210 of FIG. 15.

INCH CIRCUITS

Figure 16:
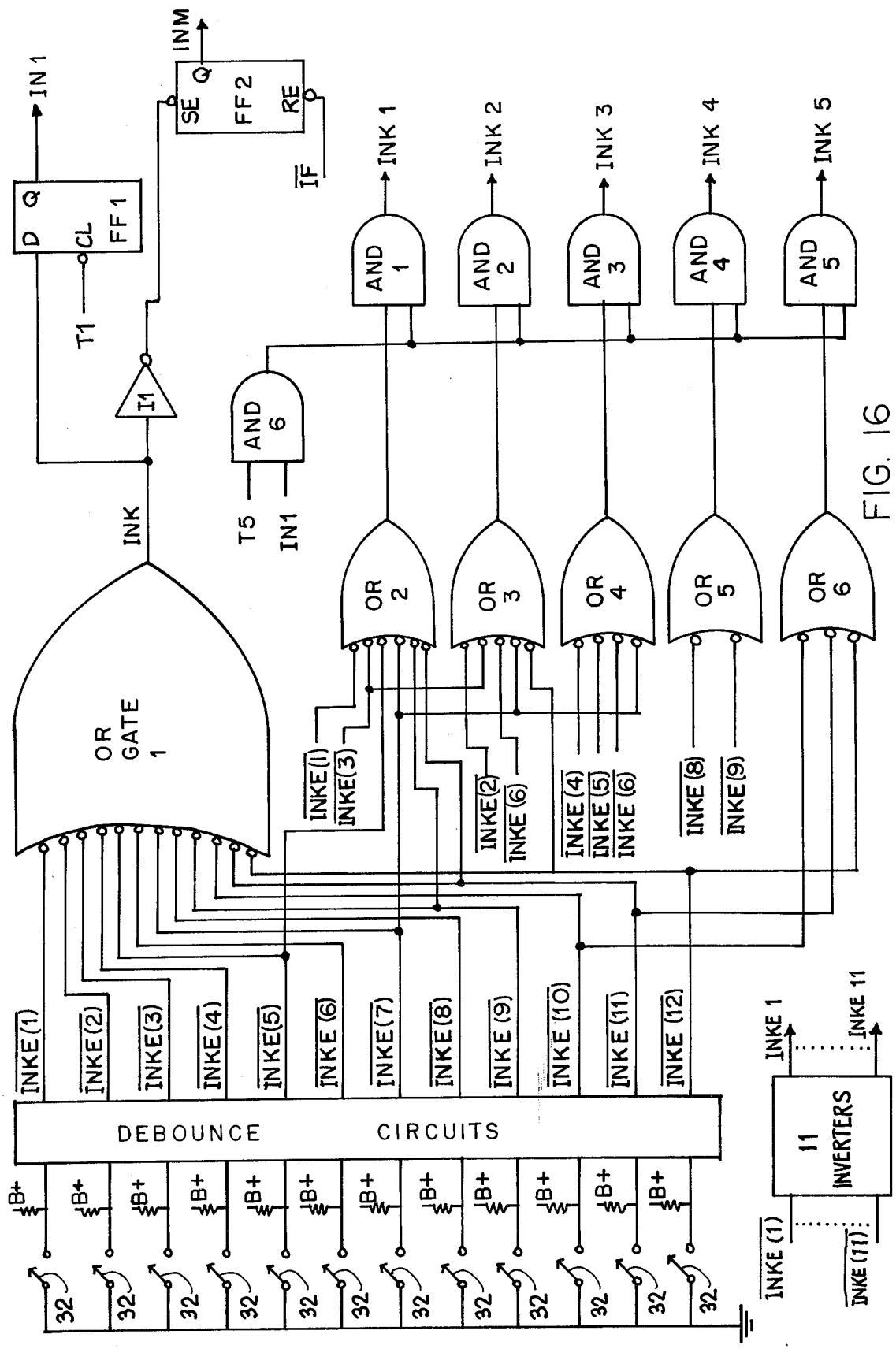
FIG. 16 is a circuit diagram illustrating circuitry for providing an "inch" input into the apparatus.

When any of the twelve keys 32 of the inch keyboard 3 (FIG. 1) are depressed, switches 32 shown in FIG. 16 are depressed, then flip-flop FF2 of FIG. 16 will be set. The INM line from FF2 retains the information that an inch key 32 has been activated even after the key is released. Flip-flop FF2 will be utilized later under conditions to be described below. As is seen in FIG. 16, the set voltage to FF2 comes from OR GATE 1 and inverter I1. A high is impressed on line INK from OR GATE 1 when any of the inch keys 32 are depressed as is the for the OR1 of FIG. 8 connected to the decimal keyboard 2. The INK line is applied to the D input of FF1, which would be set to a "one" state on the trailing edge of pulse T1 (See waveforms 2A, 2B, 2C) FIG. 38). The flip-flop FF1, which drives the IN1 line FIG. 16 controls the various operations which takes place once an inch key 32 has been depressed. Flip-flop FF1 of FIG. 16 in a high state only as long as the inch key 32 is depressed. It turns off with the first T1 pulse that appeaars with none of the keys 32 activated.

Figure 17:
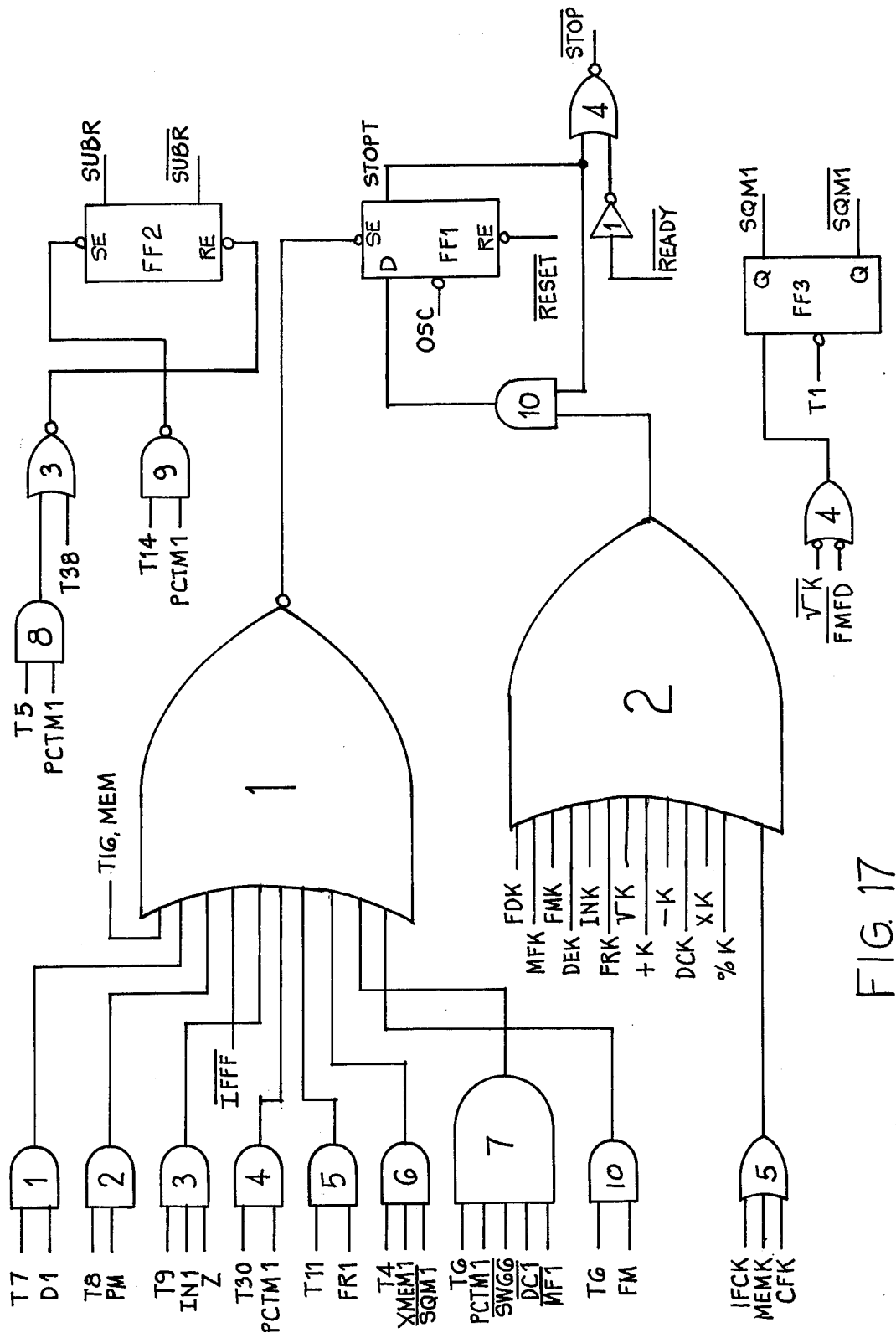
FIG. 17 is a circuit diagram illustrating circuitry for stopping a clock, which generates a series of pulses, which sequentially operate various circuits in the apparatus.

Referring back to the T7 pulse that occurs while the D1 line is high, it is to be noted that no further T pulses appear after T7, as long as D1 is high. This is depicted in waveform 1J of FIG. 34 which shows the stop pulse applied to the T counter at the time of pulse T7. As is seen in FIG. 17, the T7 pulse will pass through AND 1 and OR1 to set the flip-flop FF1. The stop pulse at the output of OR2 is then applied to the T counter JK input in FIG. 18. The $\overline{STOP}$ sets the JK inputs of FF1 in FIG, 18 to zero and effectively prevents the ripple counter comprised of FF1 to FF6 from counting further. The T counter stays at the count of seven until the STOP line goes to zero. This occurs when none of the keys 32 on the keyboard are depressed, consequently, the OR GATE 2 output is at zero and flip-flop FF1 of FIG. 17 is reset.

The logic circuits consisting of OR GATES 2 through OR GATES 6 and AND DATES 1 through AND GATE 5 convert the outputs from the inch keyboard of FIG. 16 to BCD. Entry into AC1 from the inch keyboard will occur at T5 time of FIG. 16.

At time T2, the registers, which are impressed on AND GATE 6 of FIG. 8, INSR, M1, M2, AC2 and D are set to zero in order that data can be entered later. This is shown in waveforms 2D and 2E of FIG. 38. The D line from FF2 of FIG. 8 is reset to zero through AND GATE 6 and OR GATE 6. At time T3 we now transfer the contents of AC1, which contains the BCD conversions from the decimal keyboard 2, to the M2 memory register. AC1 is then cleared at T4 time and loaded with the BCD inch entry at time T5 as shown in waveforms 2G and 2H of FIG. 38. Also at time T5, the inch keyboard 3 directly loads the inch shift register INSR FIG. 25 for the display of inches.

The reset at T2 time is applied to the following circuits: INSR through AND GATE 23 of FIG. 25 and through OR GATE 1; the reset line of M1 (FIG. 19) through AND GATE 1 and OR GATE 1 FIG. 20; M2 (FIG. 19) through AND GATE 1 and OR GATE 2 of FIG. 20 reset line AC2 of FIG. 12 through AND GATE 4 and OR GATE 3; and the D line of FIG. 8 is set to zero by applying reset to FF1 through AND GATE 6 and OR GATE 6.

Figure 19:
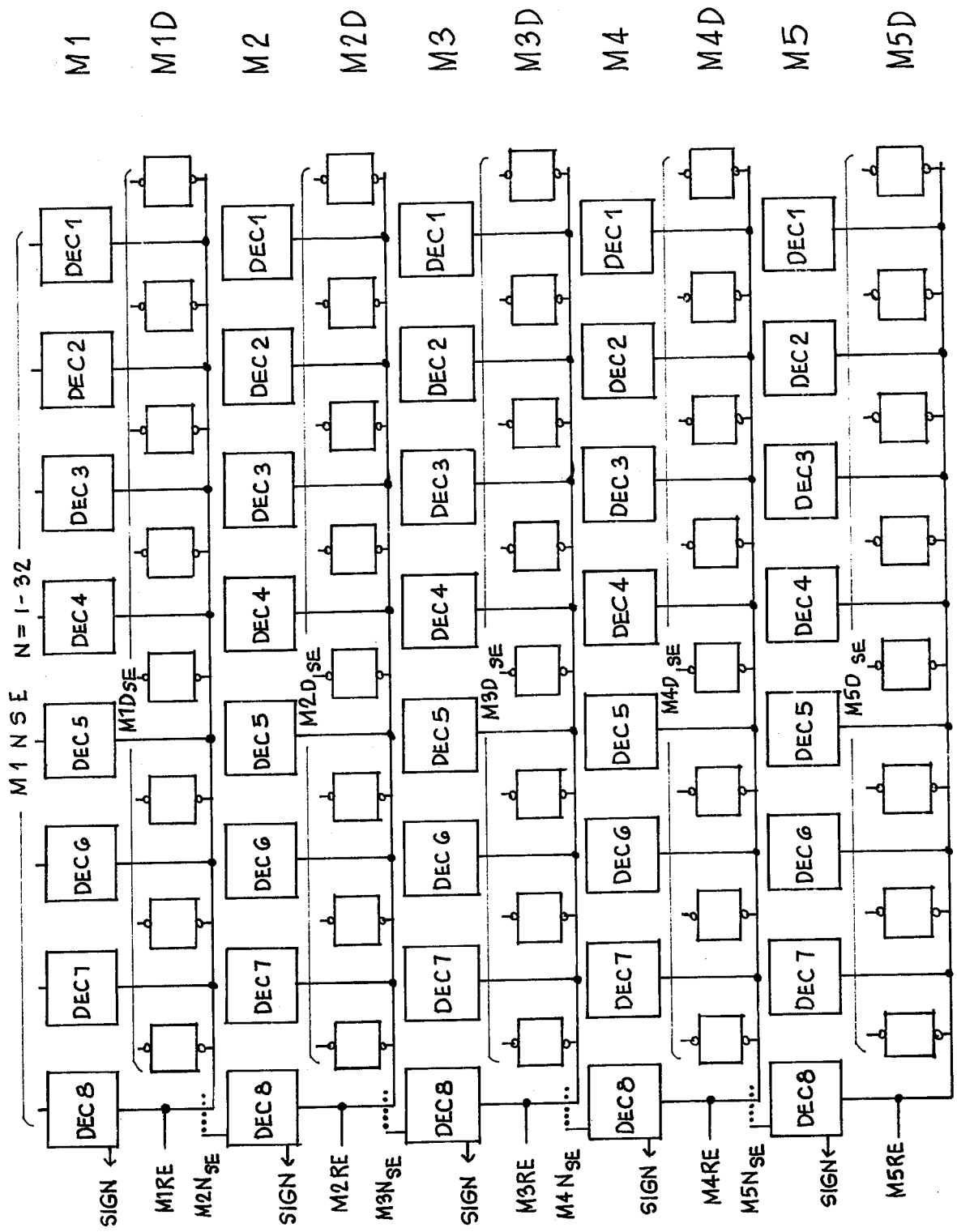
FIG. 19 is a block diagram showing a plurality of registers, which serve as a memory system for the apparatus.
Figure 22:
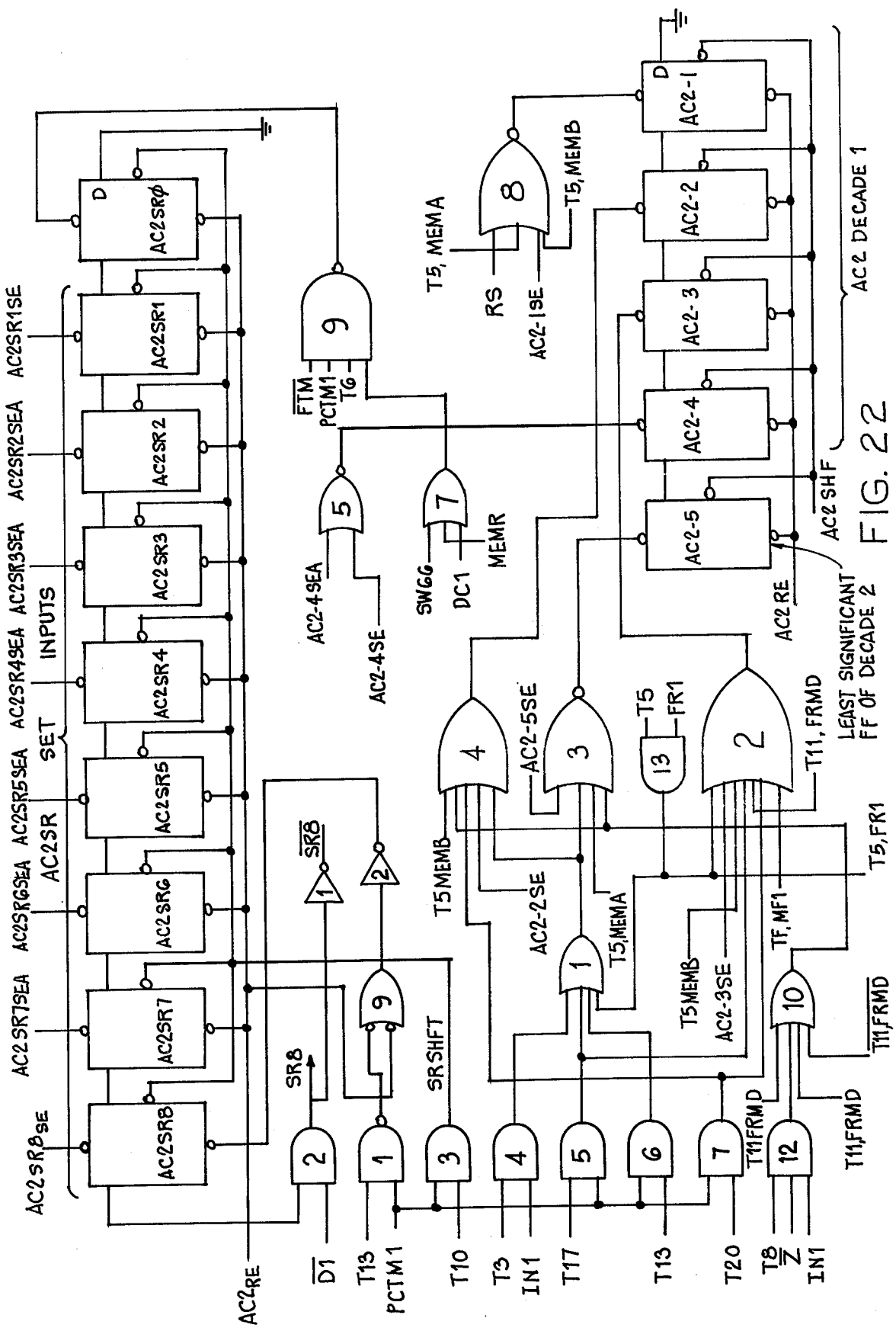
FIG. 22 is a circuit diagram showing accumulators and associate control circuits.
Figure 26:
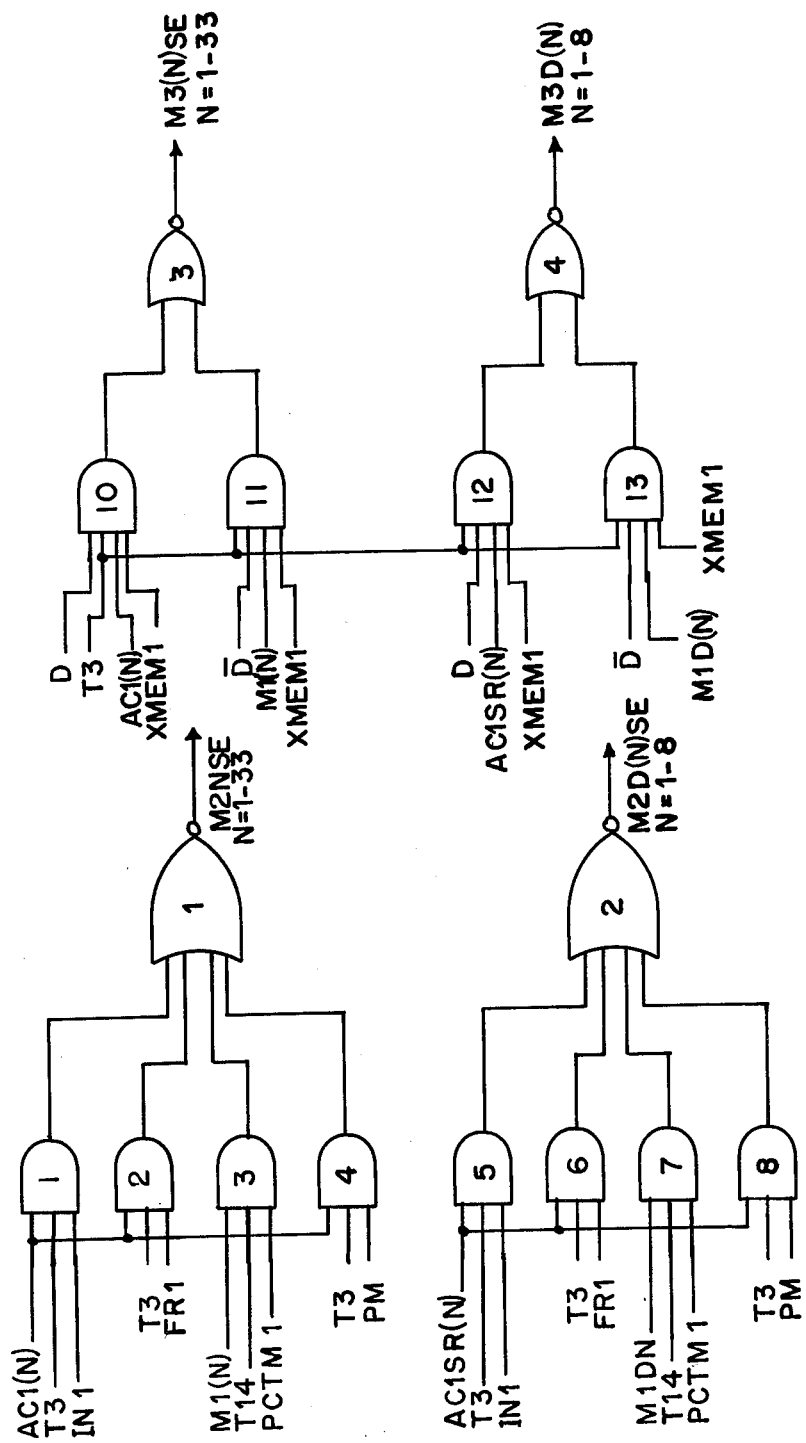
FIG. 26 includes logic circuitry for controlling the memory of the apparatus.
Figure 38:
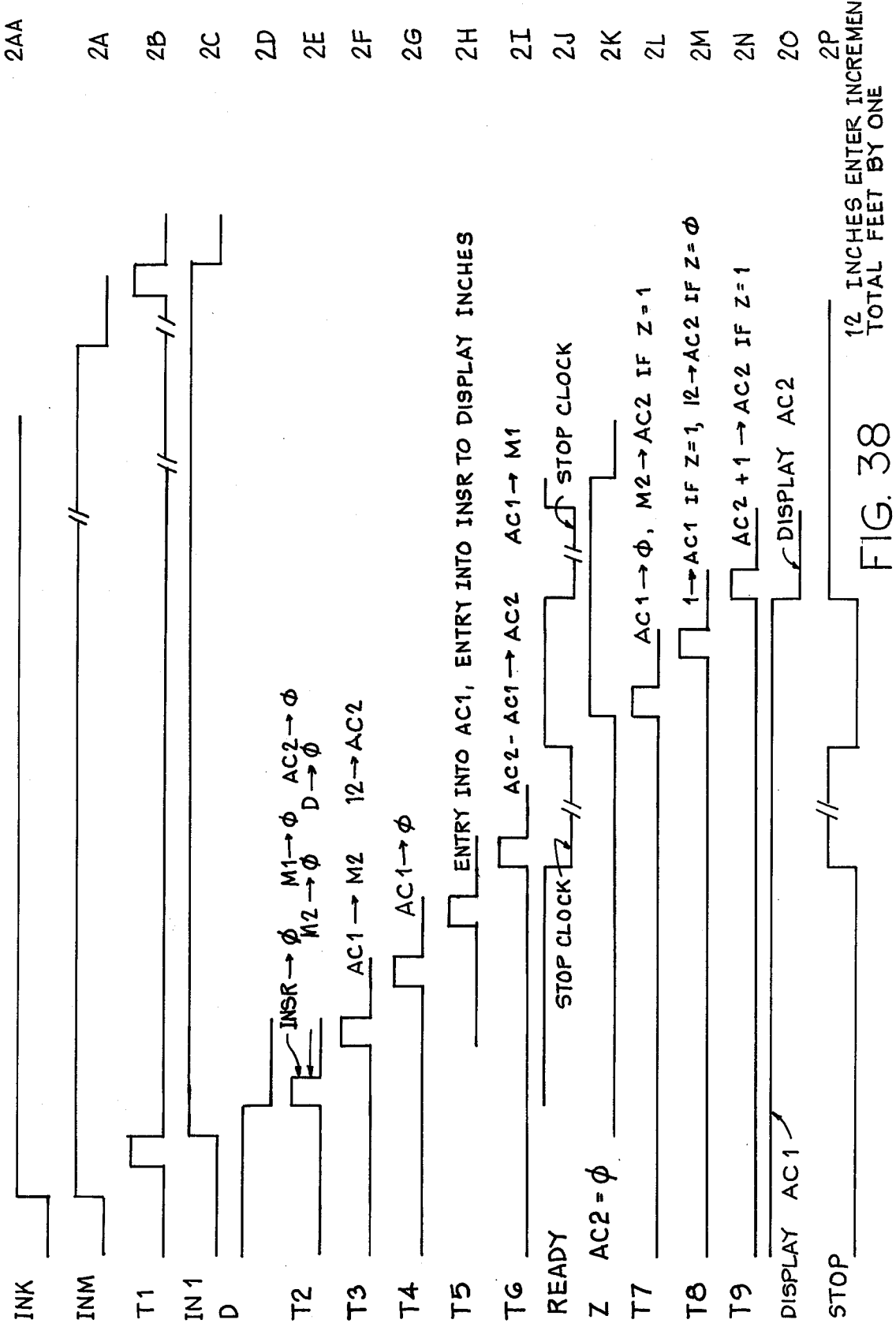

At time T3 we now transfer the contents of register AC1, containing foot measurements in decimal form, to memory register M2 of FIG. 19 through AND GATE 1 and OR GATE 1 of FIG. 26. This circuit of FIG. 26 as noted represents one of thirty three circuits applied to each of the thirty-three set inputs of the flip-flops which comprise the memory register M2 of FIG. 19. At time T3 we also insert the constant 12 into accumulator AC2, which is later used to convert inch entries into decimal feet. Referring now to FIG. 22, flip-flops AC2 and AC2-5 of accumulator AC 2 are each set to "high" through AND GATE 4, OR GATE 1 and OR GATE 4, and OR GATE 3. Thus AC2, having been previously cleared at T2, now contains the number twelve in BCD form. At T4 time AC1 is cleared to allow entry of inch data from the keys 32 of the keyboard 3. The T4 pulse passes through AND GATE 2, and OR GATE 3, all shown in FIG. 10 for resetting the accumulater AC1 shown in FIG. 11. At T5 the data now assembled in BCD form on lines INK1 to INK5 of FIG. 16 is applied through OR GATE 1, OR GATE 2, OR GATE 3, OR GATE 4, OR GATE 5, to flip-flops AC1-1 to AC1-5 of FIG. 13. The waveforms of FIG. 38 illustrate these operations.

Figure 18:
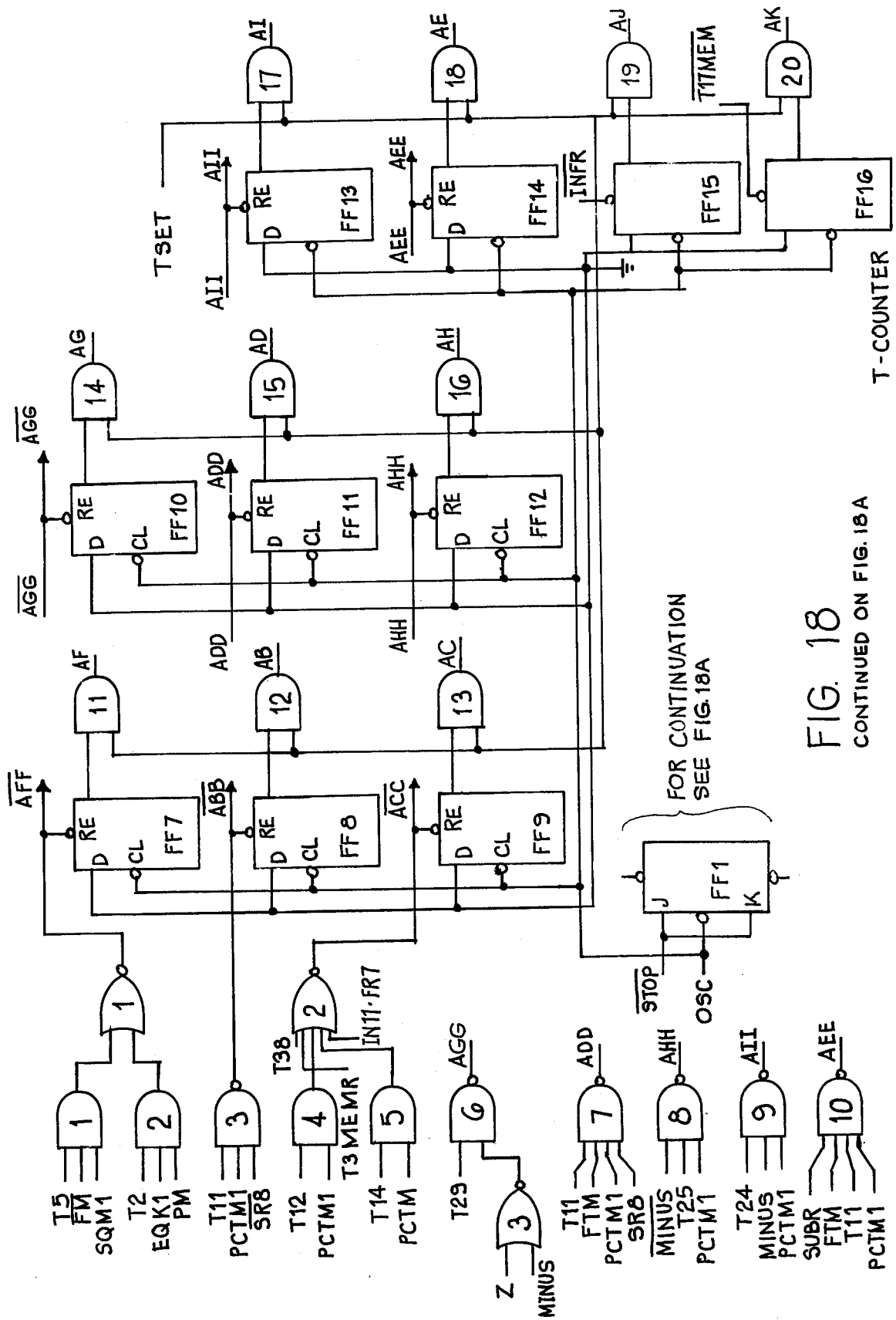
FIGS. 18 and 18A are circuit diagrams illustrating a memory and memory control circuitry.
Figure 21:
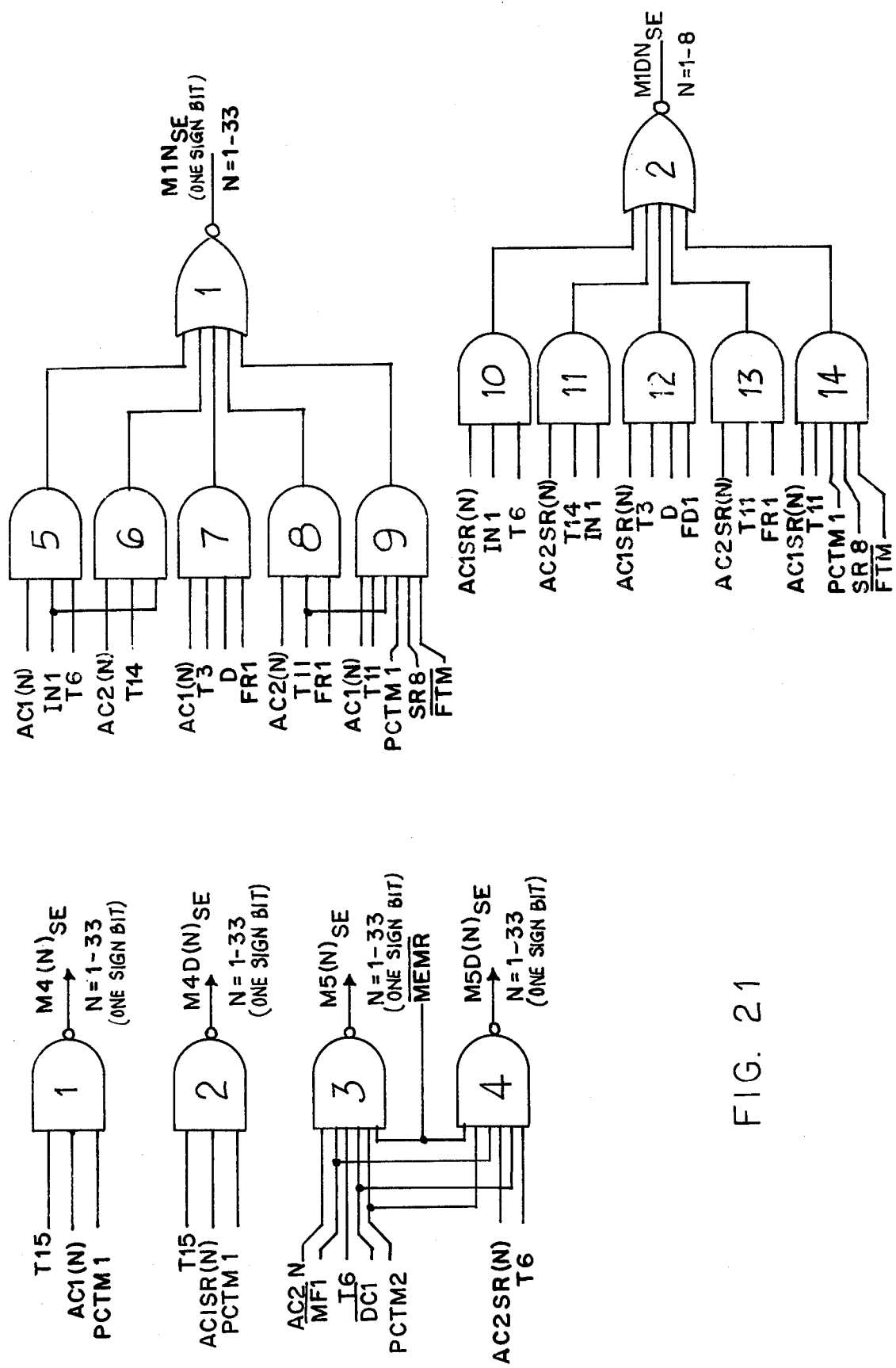
FIG. 21 includes logic circuitry for controlling memory registers.

At time T6 we now perform the subtraction of AC1 from AC2 the result of which resides in AC2. The pulse T6 proceeds through AND GATE 4 and OR GATE 2 of FIG. 23 to the minus control input of the arithmetic unit shown in FIG. 15. Waveform 2I causes the ready line of the arithmetic unit (waveform 2J) to go down. This ready line stays down until the calculation is performed. The stop input to the T counter in FIG. 18 is held at zero as long as the ready line is down and no counts can take place. An inverted STOP signal is applied to the JK input of FF1 in FIG. 18 through I1 and OR GATE 4 in FIG. 17. The T counter is subsequently stopped until the ready line of the arithmetic unit again goes high. At time T6 we also save the contents of AC1 which do not change during the subtraction, by transferring these contents to memory register M1 which is shown in FIG. 21 where AC1-N transfers through AND GATE 5 and OR GATE 1 to set the various flip-flops of M1 shown in FIG. 19. The value N = 1−33 symbolizes the thirty two circuits involved in this parallel transfer.

Figure 10:
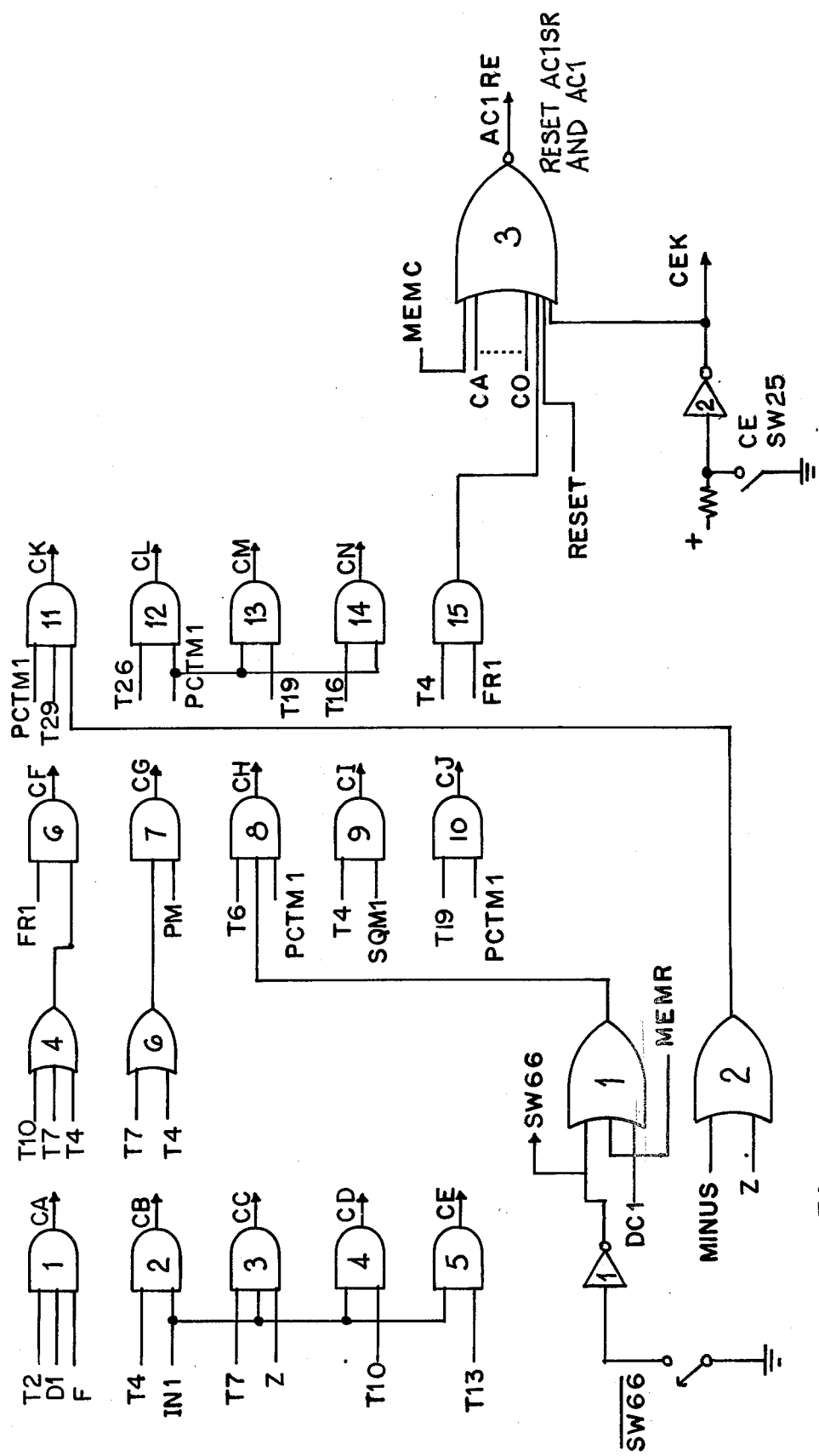
FIG. 10 is a circuit diagram illustrating various circuits and circuit components which, among other things, are used to reset various registers and accumulators in the apparatus.

If the results of the subtraction of time T6 is zero, then since the constant twelve had been loaded into AC2 and T3 time, the entry from the inch keyboard at T5 was a 12. The entry of a 12 is not recorded on the inch display but rather it increments the foot decimal display 210 of FIG. 15 by one. Thus, at T7, AC1 is reset to zero through AND GATE 3 and OR GATE 3. Referring now to FIG. 10, at the input of AND GATE 3 is high when the results of a calculation in AC2 is zero. AND GATE 7 of FIG. 14 be "low" whenever the contents of AC2 is zero and when pulse T7 passes through AND GATE 5 and OR GATE 1 to the input of AND GATE 7. The zero in AC2 is sensed by AND GATE 1 whose output can be high only if every flip-flop in AC2 is zero. The flip-flops FF1 of FIG. 14 is set to one at T7 with the Z line consequently going high.

At time T7 we also transfer M2 which contains decimal feet information, to AC1 through GATES AND 7 and OR2 for N=6−32 (FIG. 24) and through OR GATES 8, OR GATE 4, OR GATE 2, OR GATE 5, OR GATE 3 (FIG. 22) for N=1−5. At time T8, AC1 is loaded with the arithmetic constant one. This occurs through GATES AND 2, OR 2 of FIG. 13, which sets AC1-1 to the logic state "one." At time T9 with accumulator AC2 containing feet and AC1 containing the arithmetic constant one, an addition of the two accumulators take place. The results reside in AC2 and, consequently, the feet display 210 is incremented by one. The plus control signal PLCNT of FIG. 23 for the arithmetic unit is "high" by viture of the T9 signal passing through GATES AND 12 and OR 8 of FIG. 23. This operation is shown in waveforms 2J, 2L, 2M and 2N of FIG. 38. The display flip-flop FF2 of FIG. 14 is set low through GATES AND 13 and OR3, so that AC2 instead of AC1 may be displayed. The STOPT flip-flop FF1 of FIG. 17 is also set high at T9 by the pulse through GATES AND 3 and OR1 to the set side of FF1. $\overline{STOP}$ is low through GATE OR4 of FIG. 17 and this stops the action of the T counter as stated before. The T counter, as in the other cases, remains dormant until the key is released.

Figure 25:
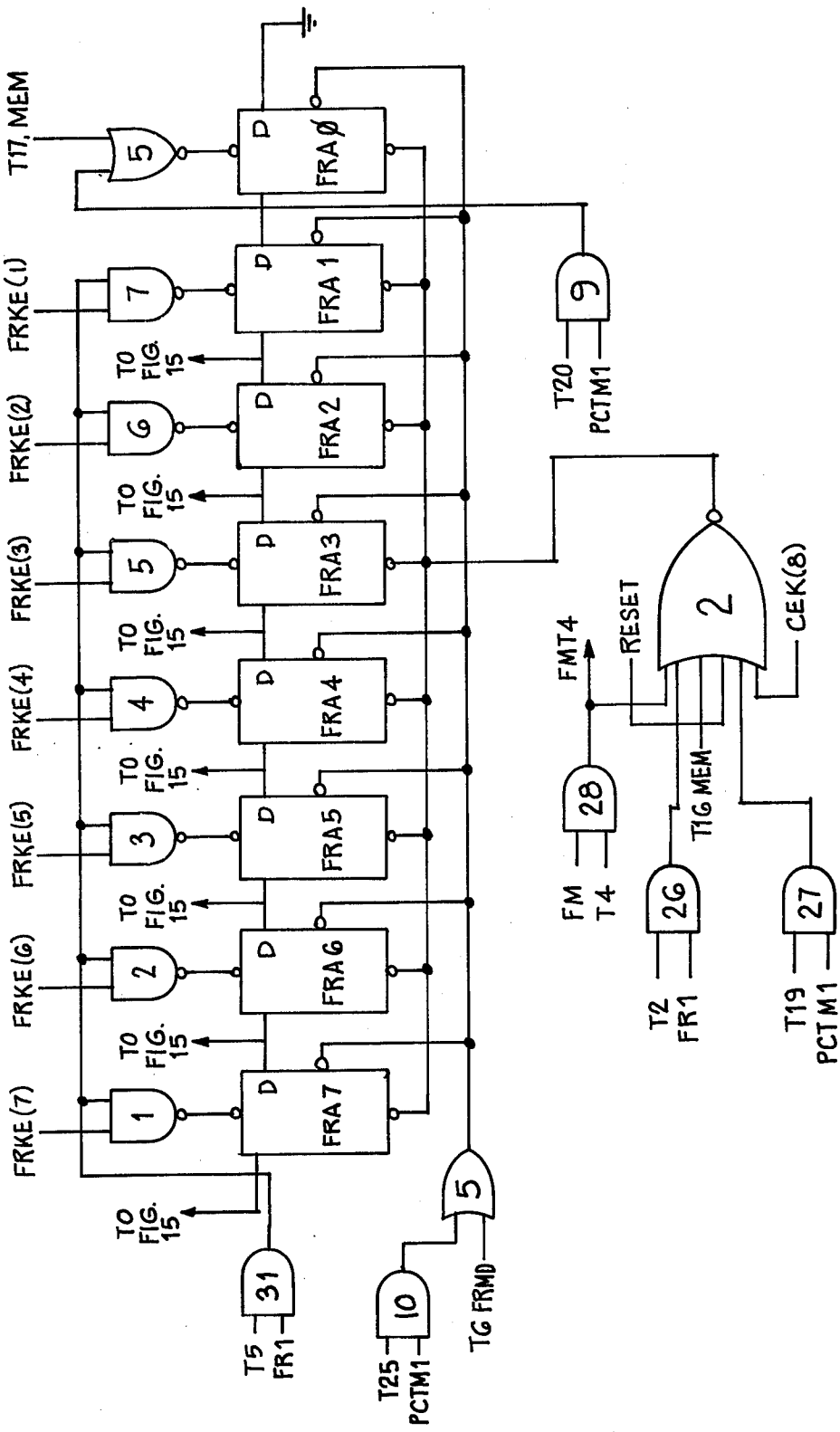
FIGS. 25 and 25A include registers for storing inch and fractions of an inch inputs to the apparatus.
Figure 25A:
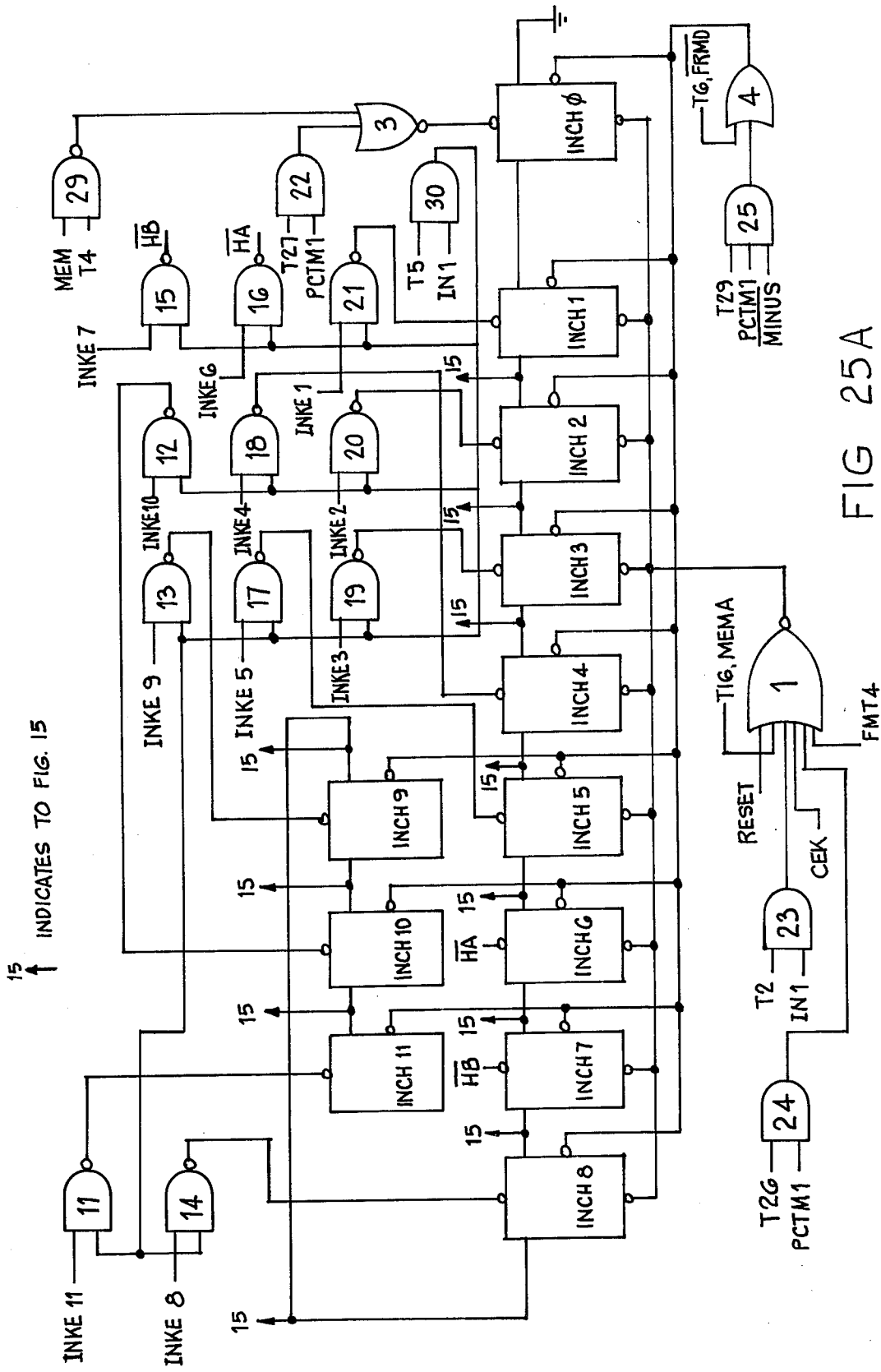

It is to be noted that at T5 the inch display will be set-up by turning on one of the flip-flops in the INSR of FIG. 25. This flip-flop output will be applied to a buffer which drives a lamp in the inch display. This occurs by a direct set from the inch keys of FIG. 16 to the reset inputs of the flip-flops in the inch register INSR in FIG. 25. The resets pass through gate AND11 to GATE AND 21 in FIG. 25.

Each register M1 and AC1, AC2 has an associated register which contains the decimal point. Thus, in all inter-register transfers, we must transfer the decimal point as well as numerical information. At time T3 above, we transfer the contents of register AC1 to M2. This necessarily must include the transfer from AC1SR to the M2 decimal point register. AC1SR for the decimal point of AC1 is shown in FIG. 11. The register for the M1 decimal is shown in FIG. 19. Corresponding to the gates which include OR1 in FIG. 26 comprising 33 circuits, we have the gates that include OR GATE 2 representing eight identical circuits for transfer between the decimal point registers AND GATE 5 and OR GATE 2 which would be utilized in this case at T3 time.

DECIMAL POINT ENTRY

When the decimal point key 23 (see FIG. 1) is depressed during entry of digits, the AC1SR flip-flop of FIG. 11 goes high. Therefor no shifting of AC1 of AC1SR occurs. AND GATE 2 in FIG. 11 inhibits the T6 shift pulse due to the $\overline{DKD}$ signal present at the input of AND GATE 2. AND GATE 2 in FIG. 12 blocks shifts to AC1 due to the zero level on the $\overline{DKD}$ line at the input to AND GATE 2. Thus, with the exception of the decimal point key, all other decimal keys will create shifts of AC1 and AC1SR.

INCH ENTRY FOR KEYS 1-11

If entry from the inch keyboard is not 12, a different sequence of operation begins at time T7. Accumulator AC2 is still reset but the contents in memory M2 do not transfer to AC1 as before, AND GATE 1 of FIG. 24 through which M2 information passes at time T7, is inhibited since the Z input is zero.

Figure 35:
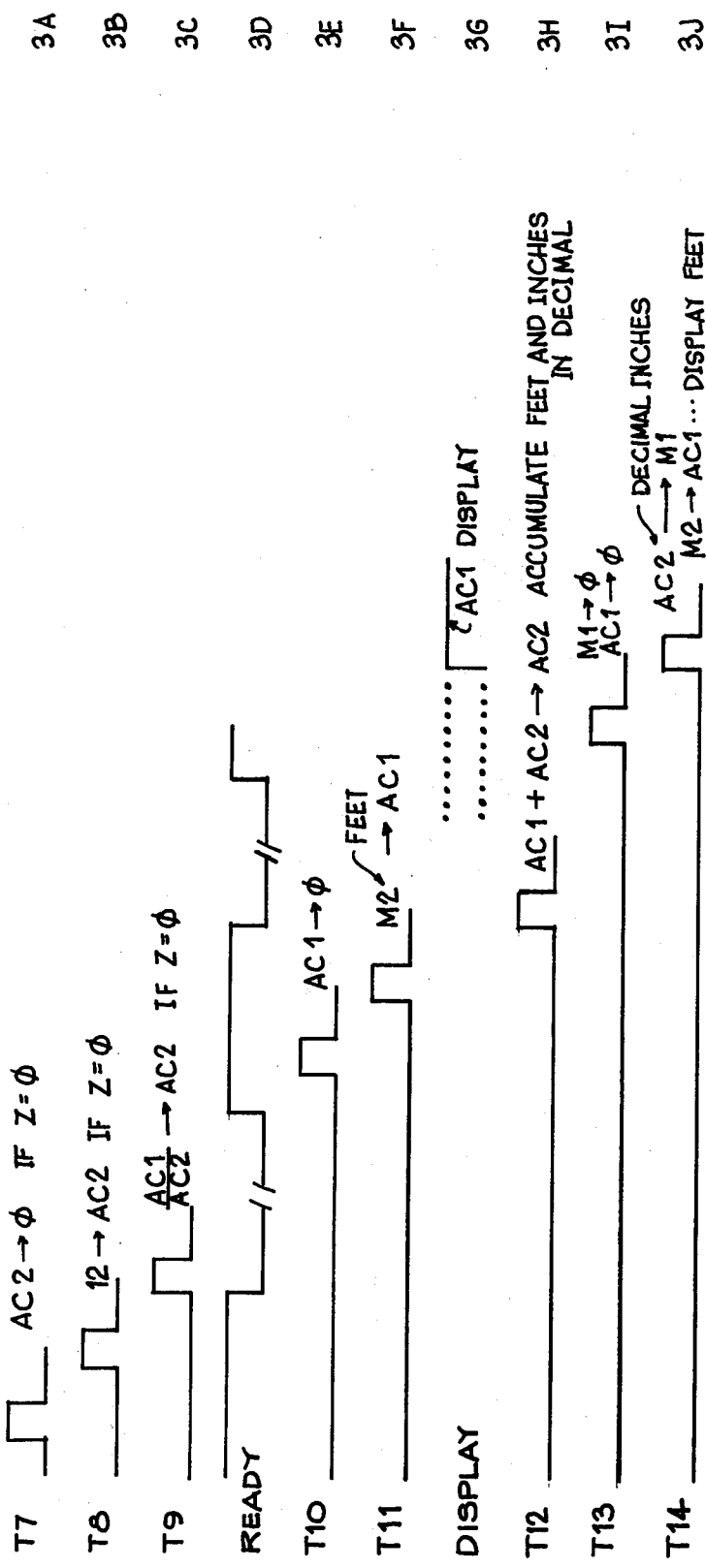

At time T8, with Z=0, the constant 12 will enter AC2 through AND GATE 12, OR GATE 3, OR GATE 4 in FIG. 22. The contents of accumulator AC1 are divided by twelve at time T9 converting the inches entered into decimal feet. The division control DVCNT is activated through AND GATE 1 and OR GATE 1 to divide AC1 by AC2 in the arithmetic unit, FIG. 23, with the results going to AC2. This timing is illustrated in waveforms 3A, 3B and 3C (FIG. 35).

At time T10, the contents of AC1 are cleared to zero for entry of decimal feet from M2 to AC1 at time T11. Clearing of AC1 takes place through AND GATE 4 and OR GATE 3 of FIG. 10. Memory M2 transfers its contents to AC1 through AND GATE 5 and OR GATE 4 of FIG. 11. The decimal point transfer is shown in the corresponding gates of FIG. 27.

At time T12, total decimal feet is accumulated in accumulator AC2 as the command to add AC1 and AC2 is given (FIG. 22). As always, the sum will reside in AC2. The accumulated dimension in decimal form may be augmented later by an entry from one of the fraction keys. At time T13, registers M1 and AC1 will be cleared. Then, on the next clock pulse, the accumulated length in decimal form will be saved by transferring the contents of AC2 to memory M1. The contents of memory M2 which contain only the entry from the decimal keyboard will then be transferred to AC1 for display on the decimal numeric readout. At time T12, the plus control PLCNT goes "high" with signal passing through AND GATE 13 and OR GATE 8 in FIG. 23. Resets for the M1 register and AC1 occur through AND GATE 2 and OR GATE 1 in FIG. 20 and through AND GATE 5 and OR GATE 3 of FIG. 10. AC2 transfers to M1 through AND GATE 6 and OR GATE 1 of FIG. 21 with the corresponding decimal point transfer through AND GATE 11 and OR GATE 2 of FIG. 21. The display flip-flop is set to "one" in order to display AC1 beginning at time T14. The display set signal passes through AND GATE 11 and OR GATE 2 of FIG. 14. This completes the operation for entry of inches from the keyboard 3. Both the decimal display and inch display are activated in the above-described mode.

It might be mentioned that upon transfer from one register to another, the original register still retains the old information. The destination register, of course, will receive the transferred information, and thereby be changed from its zero state. To reduce complication of set and reset gating for the destination register, the registers are generally reset to zero before transferring into a register.

FRACTION KEY ENTRY

Figure 9:
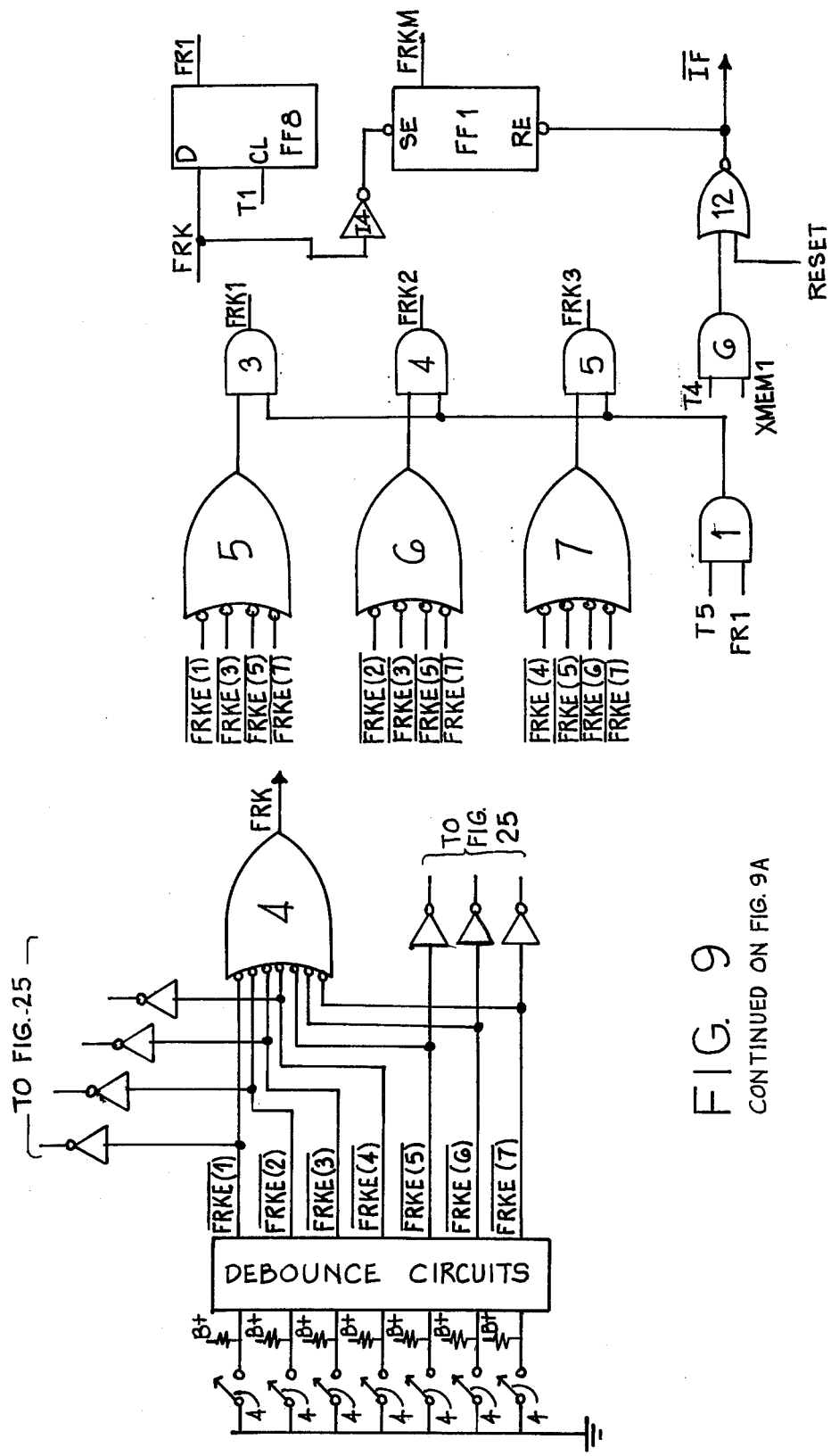
FIGS. 9 and 9A are circuit diagrams illustrating various circuits and circuit components associated with the entry of fractions of an inch into the apparatus.
Figure 9A:
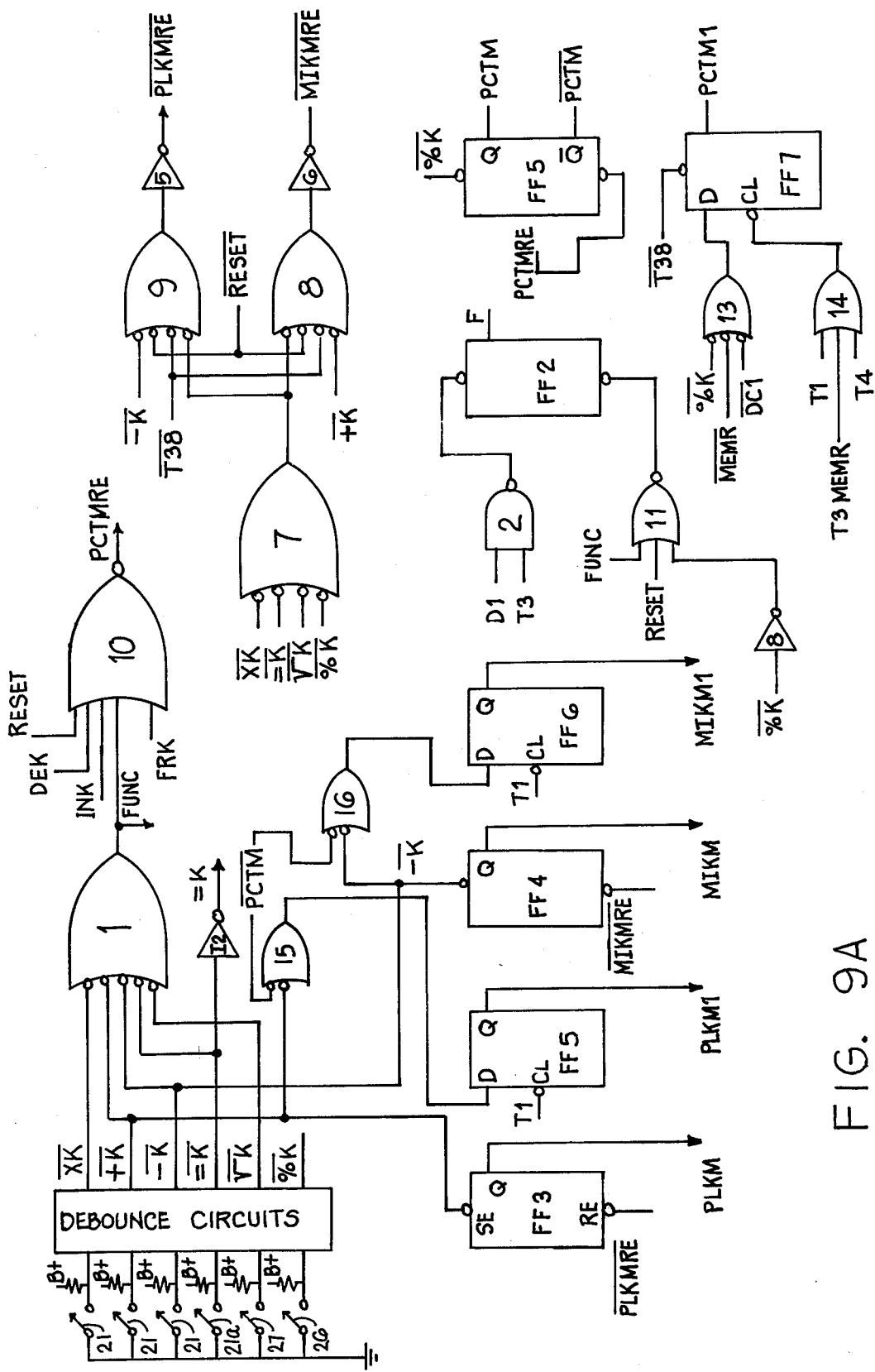
Figure 36:
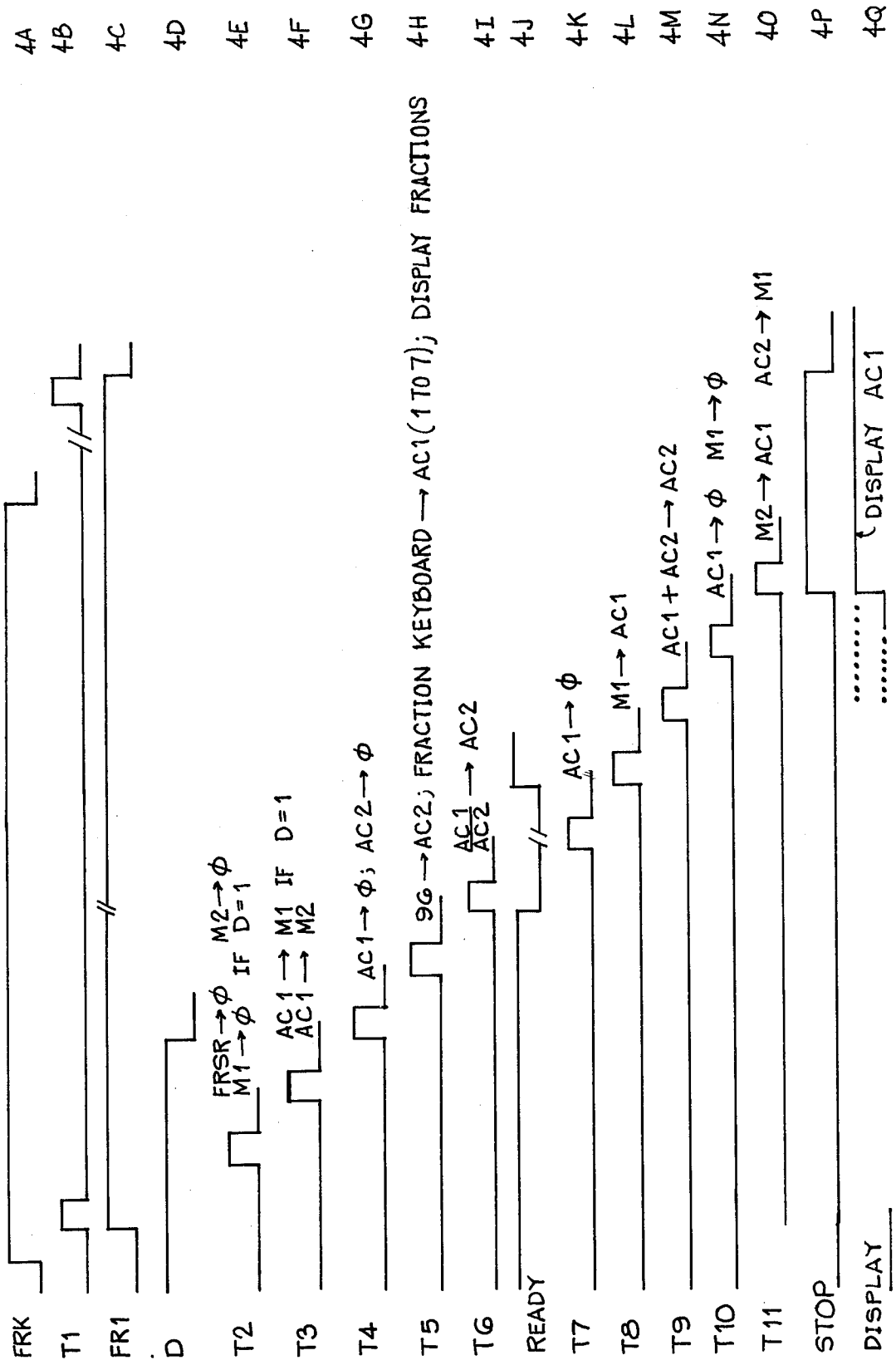

Flip-flop FF1 of FIG. 9 remembers the depression of a fraction key of fraction keyboard (FIG. 1) in the same way as the corresponding flip-flop for the decimal entry and inch entry. Flip-flop FF1 of FIG. 9 is set by the trailing edge of the T1 clock if the D input to flip-flop FF1 is high. Any of the fraction keys of keyboard 4 pass through OR GATE 4 of FIG. 9 to produce a high on the FRK line. The waveforms of FIG. 36 indicate the sequence of operation for entry of a fraction key. The complete sequence of operation for depression of a fraction key of the fraction keyboard 4 is explained in the following paragraph. The circuits involved to accomplish the results to be described will be indicated in a subsequent paragraph.

The FRKM line of FIG. 9 goes high when any of the fraction keys 4 are depressed. As indicated, FR1 goes high on the trailing edge of pulse T1. At time T2 the fractional shift register FRSR is reset to zero, as is the memory of register 2. In this case, M1 register will be reset to zero, only if the D line is high. The D line indicates that a decimal key 20 has been previously depressed. The fact that the D line is still high indicates that an inch key 32 has not been struck and that the feet entered with the decimal entry has not been stored in its normal register M1. At time T3 the information in AC1 is transferred into M1 if D equals 1. At this time we also store AC1 in M2 to retain the feet entry for later usage. This leaves AC1 and AC2 available for performance of several arithmetic operations. The foot information that is now retained in M2 will later be restored back to AC1 to continue the display of feet following release of the fraction key 4. At T4, AC1 and AC2 are cleared. A constant 8 will enter AC2 at time T5. The entry from the fraction keyboard 4 enters AC1 at time T5. This entry will be the numerator of the fraction that has been keyed in. At time T5, the fractional display 4 is also turned on showing the fraction that had been entered. At time T6, AC1 is divided by AC2 with the quotient entering AC2. This accumulator then retains the decimal equivalent of the fractional amount entered. The amount of hardware is reduced by retaining only the constant 8 as the divisor and using the numbers 1 through 7 from the fractional keyboard 4 as the numerator. This decimal equivalent will then be added to the total accumulated decimal feet in M1. To do this, accumulated AC1 is set to zero at time T7 and register or memory M1 which contains the accumulated feet and inches in decimal form is transferred to AC1. At time T9 AC1 and AC2 are added with the new accumulation of feet, inches and fractions now in decimal form residing in AC2. At time T10, AC1 and M1 are cleared to zero allowing for reentry of feet to the AC1 register from M2. Thus, the display of the feet that had been entered will be reinstituted. The accumulated feet, inches and fractions in decimal form will then be transferred back to M1 for storage at time T11.

Referring to the above paragraph, where the sequence of operations for a fractional input is set forth the location of the various circuits involved are explained. The applicable waveforms for this operation is also indicated in the waveform drawings of FIG. 36, OR GATE 5, OR GATE 6 and OR GATE 7 of FIG. 9, provide BCD lines FRK1, FRK2, FRK3, which pass through OR GATE 1, OR GATE 2, and OR GATE 3 of FIG. 13 for entry of AC1. At time T2: FRSR resets through AND GATE 26 and OR GATE 2 OF FIG. 25; M1 resets through AND GATE 3 and OR GATE 1 of FIG. 20 providing that D equals one; M2 resets through AND GATE 6 and OR GATE 2 of FIG. 20. At time T3: the contents of AC1 transfers to M1, if D=1, through AND GATE 7 and OR GATE 1 of FIG. 21, resulting in decimal transfer through AND GATE 12 and OR GATE 2 of FIG. 21; the contents of AC1 also transfer to M2 through AND GATE 2 and OR GATE 1 of FIG. 26. For the decimal point, transfer is through AND GATE 6 and OR GATE 2 of FIG. 26. At time T4: AC1 resets through AND GATE 15 and OR GATE 3 of FIG. 10; AC2 resets through AND GATE 7 and OR GATE 3 of FIG. 12.

At time T5: a constant 8 enters AC2-4 through OR GATE 5 of FIG. 22; fractional keyboard entry is through OR GATE 1, OR GATE 2 and OR GATE 3 in FIG. 13; and one out of the seven fractional display flip-flops FRA shown in FIG. 25 is set through one of the and-gates AND1 to AND 7. At time T6 the division control DVCNT is set high through AND GATE 2 and OR GATE 1 of FIG. 23. Subsequently DVCNT is applied to the arithmetic unit 220 of FIG. 15 to produce the division. At time T7, AC1 is reset through OR GATE 4, AND GATE 6 and OR GATE 3 of FIG. 10. At time T8, M1 transfers to AC1 through AND GATE 7 and OR GATE 4 of FIG. 11. At time T9, the PLCNT line is set high through AND GATE 14 and OR GATE 8 of FIG. 23. At time T10 AC1 is reset through OR GATE 4, AND GATE 6, OR GATE 3, of FIG. 10; M1 is reset through AND GATE 4, OR GATE 1 on FIG. 20. At time T11: M2 transfers to AC1 through OR GATE 3, AND GATE 5, OR GATE 4 of FIG. 11; STOPT is set high through AND GATE 5 and OR GATE 1 of FIG. 17; and the display flip-flop FF2 of FIG. 14 is set to "one" through AND GATE 8 and OR GATE 2.

THE MULTIPLICATION KEY

With depression of the multiplication key 21, flip-flop XMEM goes "high." This flip-flop will remember that the multiplication key 21 had been depressed after the key is released. At the trailing edge of time T1, we set flip-flop XMEM1 to "one." Flip-flop XMEM1 governs the sequence of operations that ensue on striking the multiplication key. The circuit function and location is explained in the following paragraph. At time T2 we will set register M3 to zero, and at time T3 we transfer AC1 to M3 if D=1. The condition D=1 indicates that the feet information has not yet been accumulated. An example of this would be if only decimal information had been entered with no subsequent entry of inches, fractions, or some other function. By "accumulated" we mean that the foot decimal entry is added to the decimal equivalent of the inch or fraction entry to form a combined decimal number stored in one of the memory registers. If accumulation had previously taken place, then D would equal zero; at time T3, the total length which is stored in M1 is transferred to M3. At time T4 we reset D, FRKM and INM, since we would have no further need for remembering that a fraction key, inch key, or decimal key, had been previously struck. At time T4 STOPT goes to "one" and no further T counts occur until after the multiplication key is released. The waveforms applying to depression of the multiplication key are waveforms 5A through 5H shown in FIG. 41.

CIRCUIT OPERATION FOR MULTIPLICATION

Figure 23:
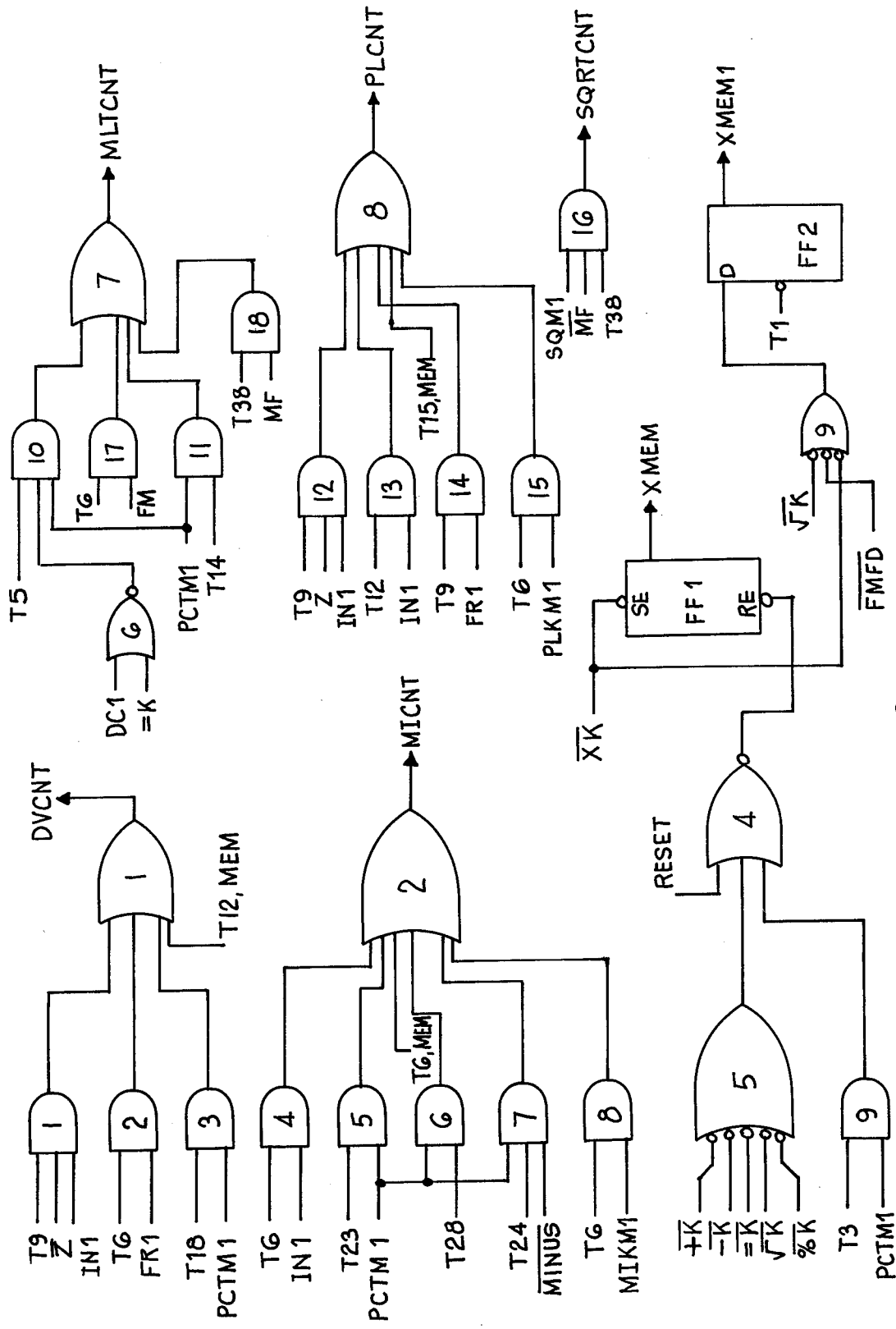
FIG. 23 includes circuit diagrams for initiating arithmetic functions.

Flip-flops FF1 and FF2, shown in FIG. 23, generate signals XMEM and XMEM1. At time T2, register M3 is set to zero through AND GATE 8 of FIG. 20. At time T3, if D=1, AC1 is transferred to M3 through AND GATE 10 and OR GATE 3 of FIG. 26. The corresponding decimal transfer is through AND GATE 12 and OR GATE 4. At time T3, if D=0 M1 transfers to M3 through AND GATE 11 and OR GATE 3; the decimal transfer is through AND GATE 13 and OR GATE 4. At time T4: D of FIG. 8 is set to zero through AND GATE 6 and OR GATE 12 of FIG. 9; FRKM is set to zero through AND GATE 6 and OR GATE 12 of FIG. 9. INM of FIG. 16 is set to zero through AND GATE 6 and OR GATE 12 of FIG. 9; and STOPT of FIG. 17 is set through AND GATE 6 and OR GATE 1.

PERCENTAGE KEY OPERATION

Figure 28:
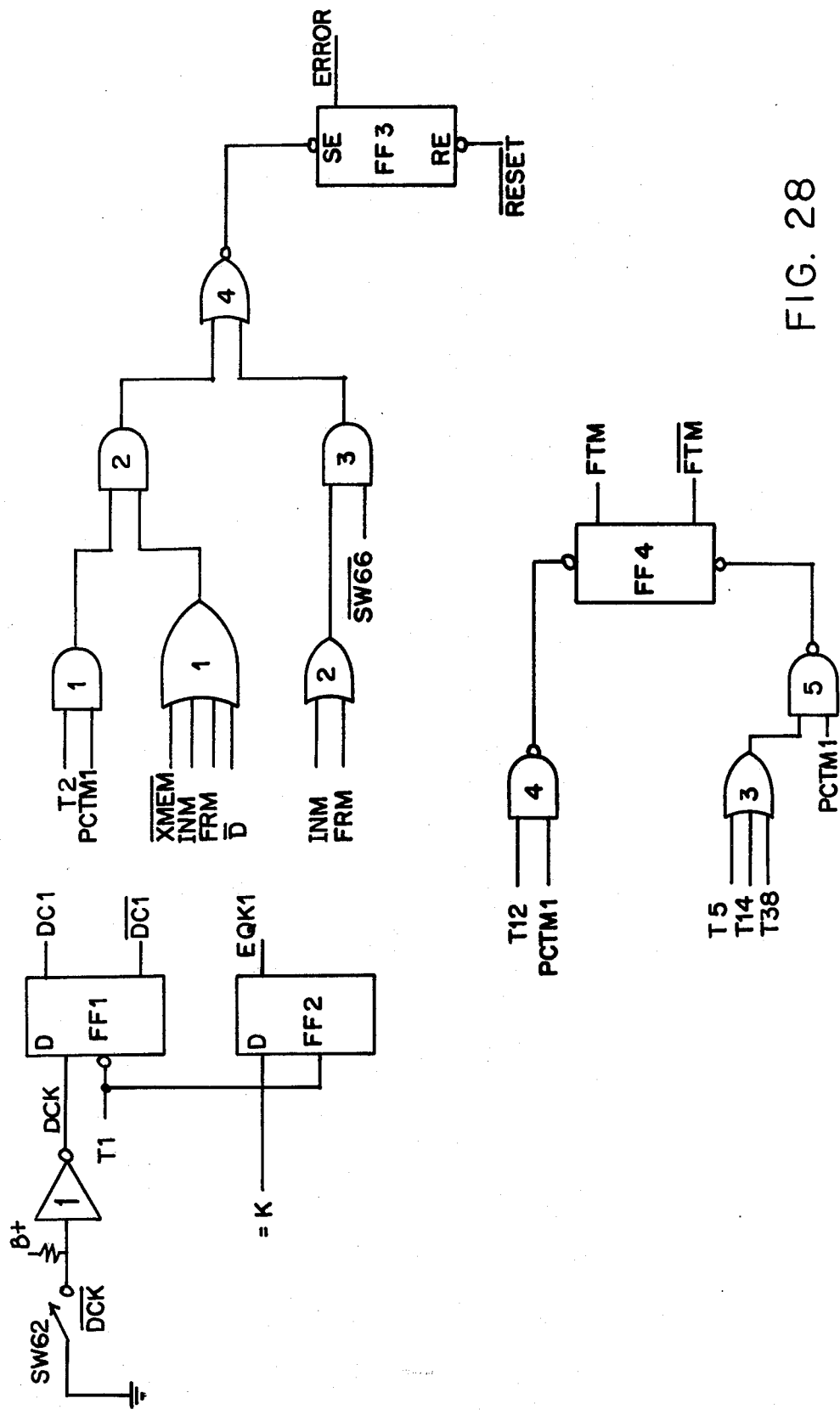
FIG. 28 includes logic circuitry for initiating conversion of parameters, such as converting decimals to feet, etc.
Figure 41:
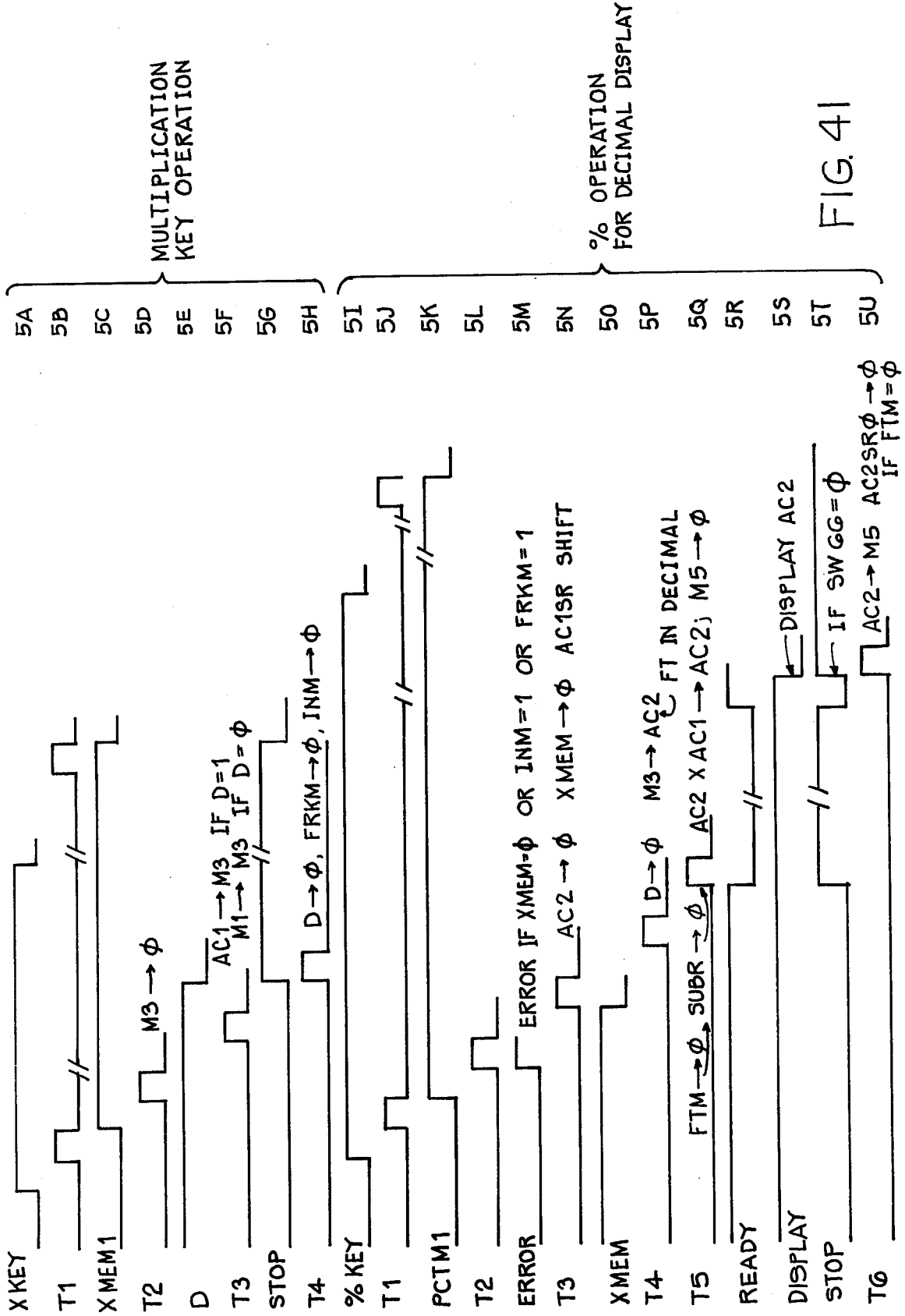

The waveforms for percentage operation are shown at bottom of FIG. 41. PCTM of FIG. 9 is set to "one" whenever the percentage key 26 is depressed. PCTM1 of FIG. 41 sets to "one" on the trailing edge of the T1 pulse. PCTM1 will be high only during the time percentage key is down and until next T1 arrives. At time T2 the error signal is displayed if XMEM = 0, if INM = 1, if D = 0 or if FRKM = 1. If XMEM = 0, this indicates that a mltiplication key 21 has not been depressed previously. This is an error in operation. If INM or FRKM is "high," this would indicate that a pure decimal had not been used for percentage. The ERROR flip-flop FF3 is shown in FIG. 28. It is set at time T2 by means of GATES AND1, OR1, AND2, and OR4 of FIG. 28. The error flip-flop is also set if $\overline{SW66} = 1$. This is done when the calculator is set only for decimal, but a fraction key 4 or inch key 3 has inadvertently been struck. GATES OR2 and AND GATE 3 of FIG. 28 are the gates that would handle this situation. At time T3 we clear AC2 of FIG. 12 and the XMEM flip-flop FF1 of FIG. 23, is reset through GATES AND 9 and OR GATE 4. AC2 is cleared through GATES AND 9 and OR GATE 4. AC2 is cleared through GATES AND9 and OR3 of FIG. 12. Also at time T3 we shift AC1SR, which contains the decimal point, to the left. We shift AC1SR again at time T4. This converts the percentage that had been entered into AC1 to its decimal form. For example, 55% is converted to 0.55. The shift for AC1SR takes place through OR GATE 1, AND GATE 1 and OR GATE 2 of FIG. 11. At time T4 we reset the D flip-flop FF2 of FIG. 8 and transfer M3 contents (feet, inches and fractions combined in decimal form) to AC2. The reset for D goes through GATES AND7 and OR6 of FIG. 8. Transfer of M3 to AC2 is accomplished by means of GATES AND2 and OR1 of FIG. 24.

Figure 20:
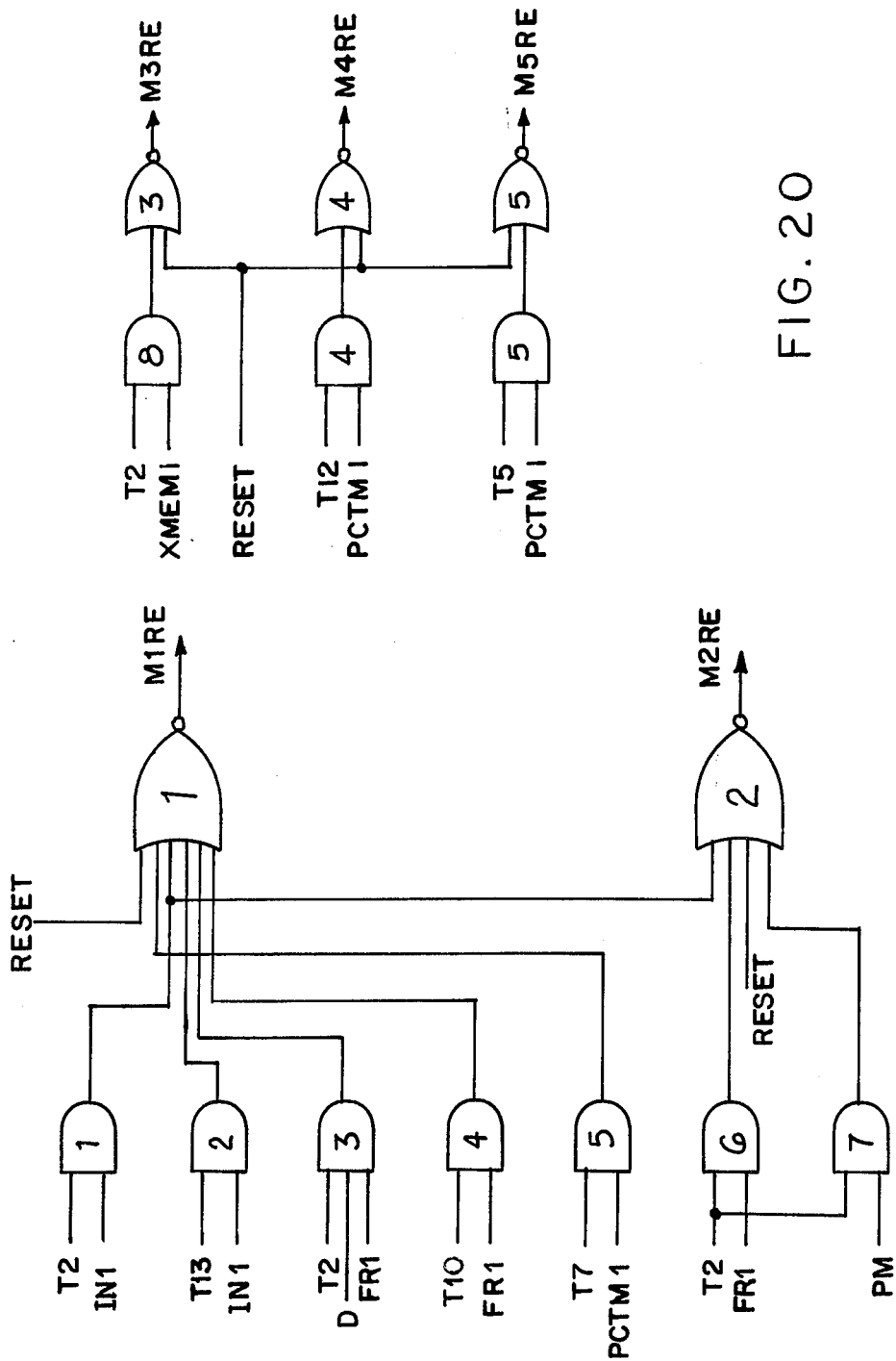
FIG. 20 is a circuit diagram showing logic circuitry for controlling the memory of the apparatus.
Figure 24:
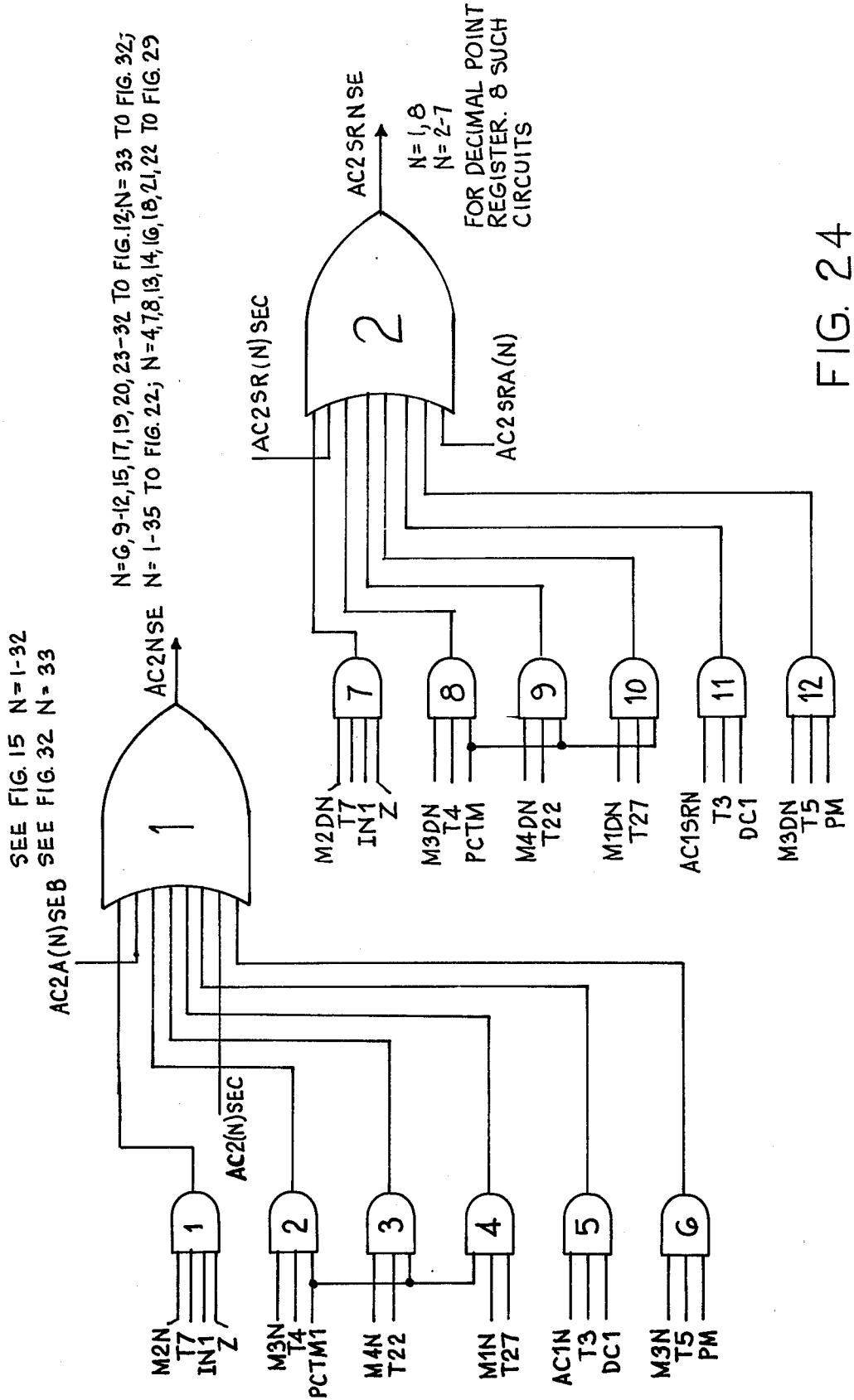
FIG. 24 includes logic circuits for controlling the decimal point register.

At T5 of FIG. 24 AC1 is multiplied by AC2 to take the percentage, and the results are entered into AC2. AND GATE 10 is enabled and T5 passes through OR GATE 7 of FIG. 23 to activate the multiplication control. Also at time T5, we clear FTM, SUBR and register M5. FTM is cleared through GATES OR3 and AND5 of FIG. 28. SUBR is cleared through GATES AND8 and OR GATE 3 of FIG. 17. The gate for clearing M5 is shown in FIG. 20.

At time T6, if in FIG. 14 SW 66 = 0, the multiplication cycle aborts and we display feet in decimal form only. The percentage resides in AC2 and the display flip-flop must be set low to display AC2 instead of AC1. This would be done through GATE AND 14 and OR3 of FIG. 14. At time T6, the STOPT is set through GATES AND7 and OR 1 of FIG. 17, if SW66 = 0. AC2 which contains the total length in decimal units is stored in M5 through GATES AND 3 and AND4 (this latter for the decimal) as is seen in FIG. 21.

In FIG. 14 if SW66 = 1, then we must convert the decimal result residing in AC2 to feet, inches and fractions. This conversion process begins at time T6 by resetting AC1 and AC1SR. The STOPT flip-flop is not set when SW66 = 1. The resetting of AC1 and AC1SR is done through AND8 and OR3 of FIG. 10. At time T7 we start to shift the contents of AC2 left into AC1. When a decimal point is sensed at the output SR8 of AC2 upon AC2 going "high," the feet are isolated in integer form in AC1. However, the decimal portion still resides in AC2. Going back to time T6, we will have set AC2SR$\phi$ to its "one" state. This will be used later to sense that AC2 has been completely shifted into AC1. The gates AND9 and OR7 of FIG. 22 are used for this purpose. At time T7, we also clear M1 for later usage. This is shown by Gates AND5 and OR1 of FIG. 20.

At times T7, T8, T9, T10, we apply four shifts to both AC1 and AC2. The most significant digit of AC2 shifts into the least significant digit of AC1. Four shifts create a shift of one decade since each decade consists of four flip-flops representing a digit in BCD form. At time T10, we shift AC1SR and AC2SR in order to shift the decimal point. The contents of AC2SR8 then shifts into AC1SR1. This is done through AND GATE 2 of FIG. 22, and OR GATE 5 of FIG. 11. The shift pulses are through AND GATE 3 of FIG. 22 and gates OR1, AND1, and OR2 of FIG. 11. For shifting the accumulator AC1, we use gates OR1, AND1, OR4 of FIG. 12. For shifting AC2, we use only gates OR1 and AND1 of FIG. 12.

If the decimal point does not appear in AC2SR8, that is SR8 = $\phi$, after shifting one decade, AC2 into AC1, we will repeat the shifting cycle by setting the T counter back to the state of pulse T6. The next clock pulse will then be pulse T7 and we will resume shifting AC2 to AC1. A second decade from AC2 will have been shifted into AC1. With the D input of AC2-1, FIG. 22, held at zero, this means that the two least significant decades of AC2 are zero. AC1 now contains the two most significant decades formerly in AC2 (in the two least significant decade locations in AC1). At time T11, the T counter is set to the T6 state by means of AND GATE 3 of FIG. 18.

The process of shifting the decades will repeat until the SR8 line does go high, indicating arrival of decimal point in AC2SR8. We proceed to time T11 where we save the contents of AC1, which contains the feet by transferring these contents to M1 (see GATES AND9 and OR1 of FIG. 21). At time T12, we set FTM to "one" through AND GATE 4 of FIG. 28. Register M4 is reset to zero through AND GATE 4 of FIG. 20. We now return the T counter to the T5 state by means of gates AND4 and OR2 of FIG. 18. Shifting of AC1 and AC2 continues with T7, T8, T9 and T10 until SR8 again becomes "one." This indicates that the shifting process is complete with AC2 entirely shifted into AC1 after 32 shifts. AC1 now contains the quantity decimal feet (less than one foot) and AC2 will be zero, with the exception that AC2SR8 representing the decimal point will be "high." At time T11, with FTM = 1, we now clear AC2 through gates AND10 and OR3 of FIG. 12. We advance the T counter so that T13 will appear next, skipping T12. The T counter is set to the T12 state through AND GATE 7 of FIG. 18 for this purpose. When pulse T13 now appears, we load the constant 12 into AC2. To do this, gates AND6, OR1, OR3 and OR4 of FIG. 22 are used. At time T14, we multiply AC1 by the "12" in AC2 with the result in decimal inches going into AC2. The quantity to the right of the decimal point in AC2 represents the fractional portion and will later be converted to the nearest fraction. Gates AND11 and OR7 of FIG. 23 are applied to the multiplication control of the arithmetic unit. At time T14, SUBR is now set to "one" through AND GATE 9 of FIG. 17. FTM is reset through Gates OR3, AND5, of FIG. 28. The contents of M1 are transferred to M2 through GATES AND3, OR1 of FIG. 26. This will free M1 for the operation in which we isolate the integer portion of AC2 into AC1. This integer portion represents the inches associated with the decimal number calculated back at time T5. At time T14, we set the T counter back to the T5 state through GATES AND5 and OR2 of FIG. 18.

Figure 42:
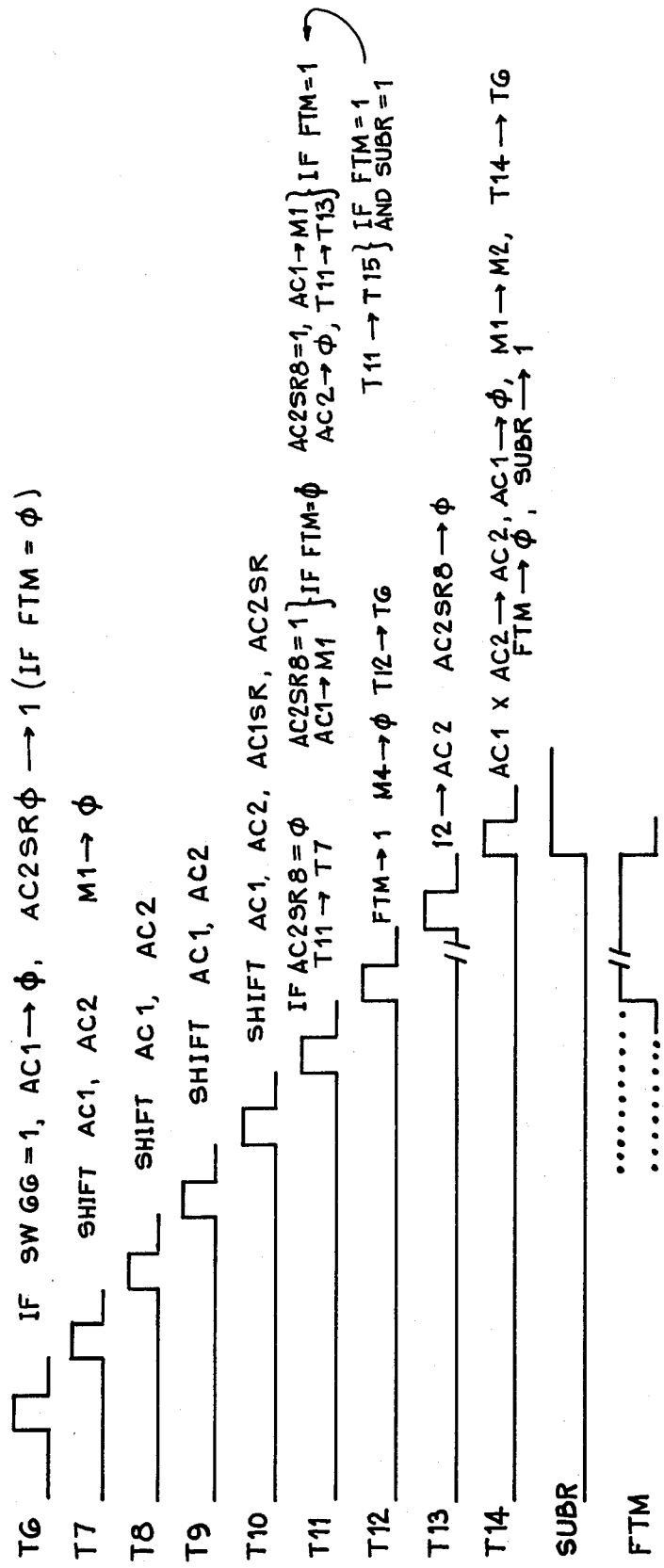

The shift of AC2 into AC1 takes place as previously. When SR8 - 1, AC1, which contains the integer inches, is stored into M1 at time T11. At time T12 FTM again goes to "one" and the T counter is set to five. At time T6, AC1 is reset by AC2SR$\phi$ is not set to "one" because AND GATE 9 of FIG. 22 is inhibited by $\overline{FTM}$ = 0 and AC1SR$\phi$ is set on first pass. Shifting again takes place until AC2 is entirely shifted into AC1, this being indicated when SR8 goes "high." AC1 now contains the decimal portion that will be converted to the nearest fraction. At time T11, the counter T will be set so that the next count will be T15. This occurs through AND GATE 10 of FIG. 18 when SUBR = 1 and FTM = 1. The waveforms of FIG. 42.

Figure 15:
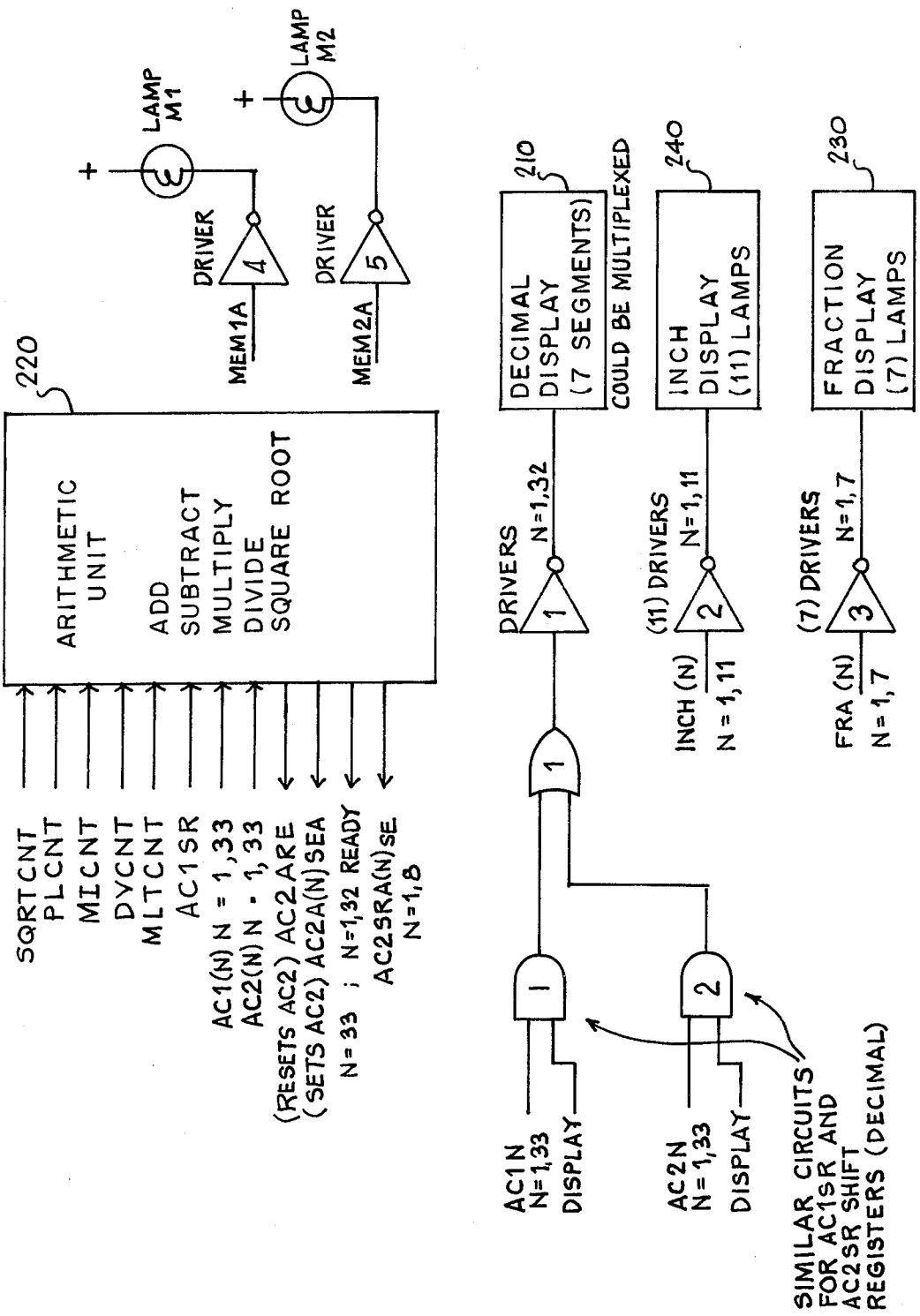
FIG. 15 is a circuit diagram illustrating a display circuit and connections to an arithmetic unit.

We now begin the process at T15 to convert the decimal to a fraction with the FRSR register (FIG. 25) shifted to the correct place for driving the fractional display 230 (FIG. 15). FRSR is a shift register, consisting of eight flip-flops, where one and only one of these flip-flops is "high" to drive the lamp representing the fraction. At time T15, we save the contents of AC1 by transferring them into register M4. This frees AC1 for the operations to follow. Gates AND1 and AND2 of FIG. 21 handle this transfer. At time T16, we clear AC1 through AND14 of FIG. 10 and we clear AC2 through AND GATE 11 of FIG. 12. At time T17, a constant one is inserted into AC1 and the constant sixteen into AC2. Gates AND 3 and OR7 of FIG. 13 are used for AC1 and AND GATE 5 of FIG. 22 is used to insert sixteen into AC2. At time T18, we divide AC1 by AC2, producing the fraction 1/16 in decimal form (which resides in AC2) (see AND GATE 3 of FIG. 23).

At time T19, the task of clearing AC1 and FRSR (the fractional display shift register) AND GATE 13 (FIG. 10) is performed and gates AND27 and OR2 of FIG. 25 are utilized for this clearing. At time T20, we transfer AC2 to AC1 (in parallel) through AND GATE 8 and OR GATE 4 of FIG. 11. At time T20, FRSR$\phi$ which is the right-hand flip-flop of the fractional shift register (FIG. 25) is set to "one" through AND GATE 4. This is in preparation for shifting FRSR to correctly display the fraction representing the decimal quantity now in M4. FRSR$\phi$ does not drive any of the lamps in the fractional display 230 (FIG. 15).

At time T21, AC2 is cleared by AND GATE 12 of FIG. 12 and at time T22, the decimal to be converted to fractions now in M4 is brought back into AC2 through gates AND3, OR1, AND9, OR2 of FIG. 24. At time T23, we subtract AC1 from AC2 with Gates AND5 and OR2 of FIG. 23. If AC2, which receives the results of this subtraction, is negative at time T24, then this indicates that the AC1 contents are less then 1/16th inch. We would then set the T counter with AND gate 9 of FIG. 18 so that the next T pulse is T26 and proceed to display. The fractional display would therefore be inactive.

If, at time T24, AC2 is not negative, then the fraction is greater than 1/16th of an inch. We again subtract AC1 from AC2 with gate AND7 of FIG. 23. If the result is negative, shift FRSR AND1$\phi$ FIG. 25 one place to the left. The fraction displayed would then be "⅛th" inch, since the decimal quantity involved is greater than or equal to 1/16th and less than ⅛th inch. We would then proceed to T26 for the inch display operation.

If, at time T25, the resultant in AC2 is not negative, we will set the T counter to state T22 with AND GATE 8 of FIG. 18 and repeat steps T23, T24 and T25. FRSR of FIG. 25 is always shifted left in this process through AND GATE 10. These steps are repeated until finally AC2 becomes negative and the correct fractional display for the decimal involved is achieved. At time T26, we reset AC1 with Gates AND12 and OR3 of FIG. 10 and AC2 with Gates AND13 and OR3 of FIG. 12. The inches which were previously saved in the M1 register are transferred to AC2 at time T27 by gates AND4, OR1, AND10 and OR2 of FIG. 24. At time T27, we also insert a constant one into AC1 with Gates OR7, AND3 and OR2 of FIG. 13. At time T28, we subtract AC1 from AC2, performing the operation of decrementing the integer inches in AC2 with Gates AND6 and OR2 of FIG. 23. If the result in AC2 is negative or minus, the inches originally contained in AC2 must have been zero. The inch display 240 (FIG. 15) would not be activated. At time T26, INSR of FIG. 25 was reset to zero through Gates AND24 and OR1. At time T27, InSR$\phi$ is set to "one" through AND GATE 22. If at time T29, the result in AC2 was zero (Z=1) or positive, then INSR is shifted left with gate AND25. Thus, one inch would be displayed. AC1 would be reset to zero at time T29 if the results in AC2 are minus or zero with Gates OR2 and AND11 of FIG. 10. If the results of the subtraction at time 29 are positive, instead of passing on to T30, the counter T is set to state T27 with Gates OR3 and AND6 of FIG. 18. The steps T28 and T29 are repeated until AC2 becomes zero. For each of these cycles INSR shifts left with AND GATE 25 of FIG. 25. The INSR register will drive one of the lamps in the inch display 240 (FIG. 15) 1 through 11, in accordance with the number of shifts that have occurred.

Figure 27:
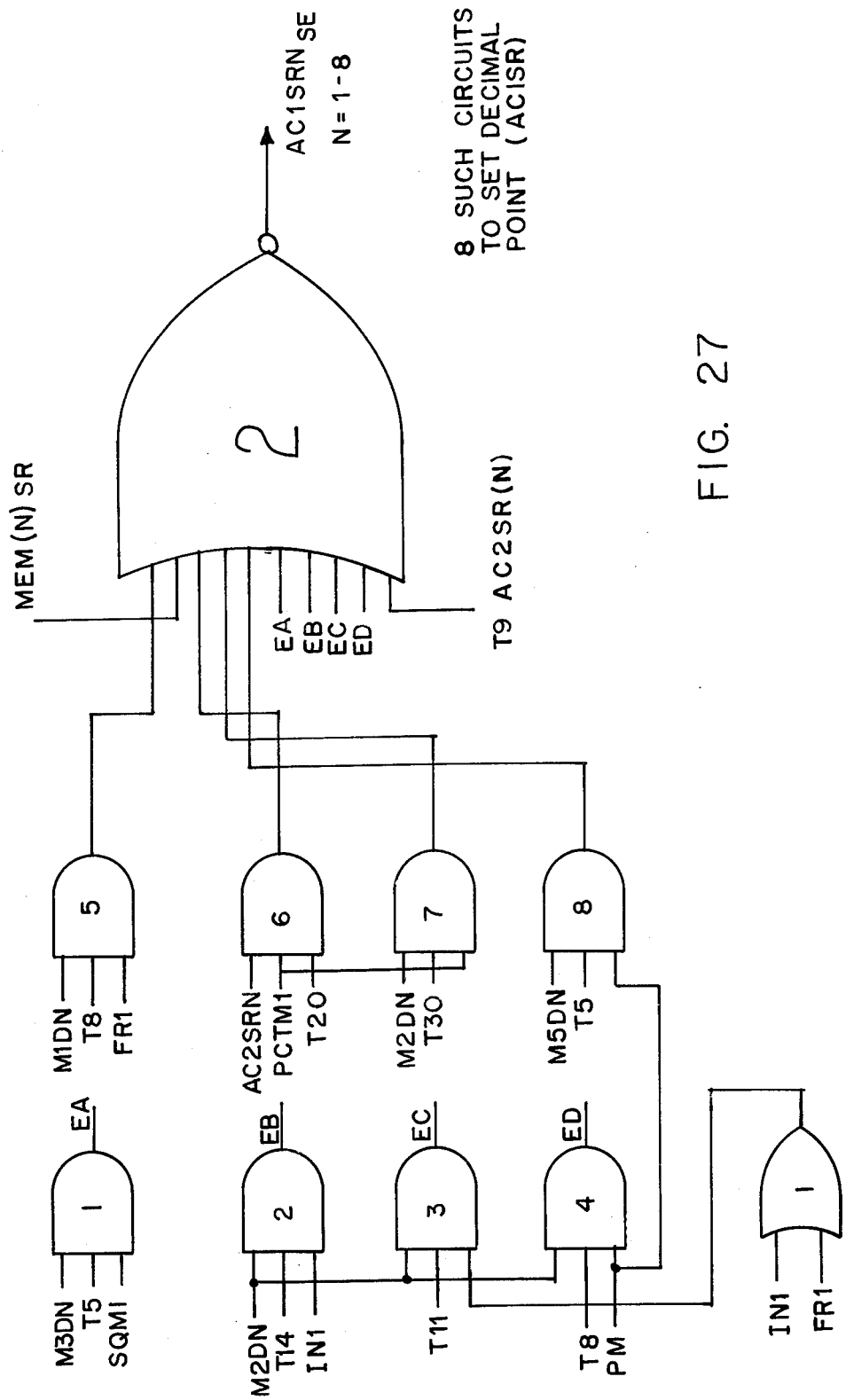
FIG. 27 is directed to logic circuitry for setting the decimal point for inputs to the apparatus.

At T30, we now transfer feet, which resides in M2, to the AC1 register with Gates AND9 and OR4 (FIG. 11), Gates AND7 and OR2 for decimal transfer of FIG. 27. The display flip-flop FF2 of FIG. 14 is set "high" through Gates AND9 and OR2. Thus, having started with a percentage in decimal form at time T5, we achieve the full feet, inch, fraction display at time T30. These waveforms are each set forth in FIG. 42'.

CONVERTING FROM DECIMAL TO FEET

Figure 43:
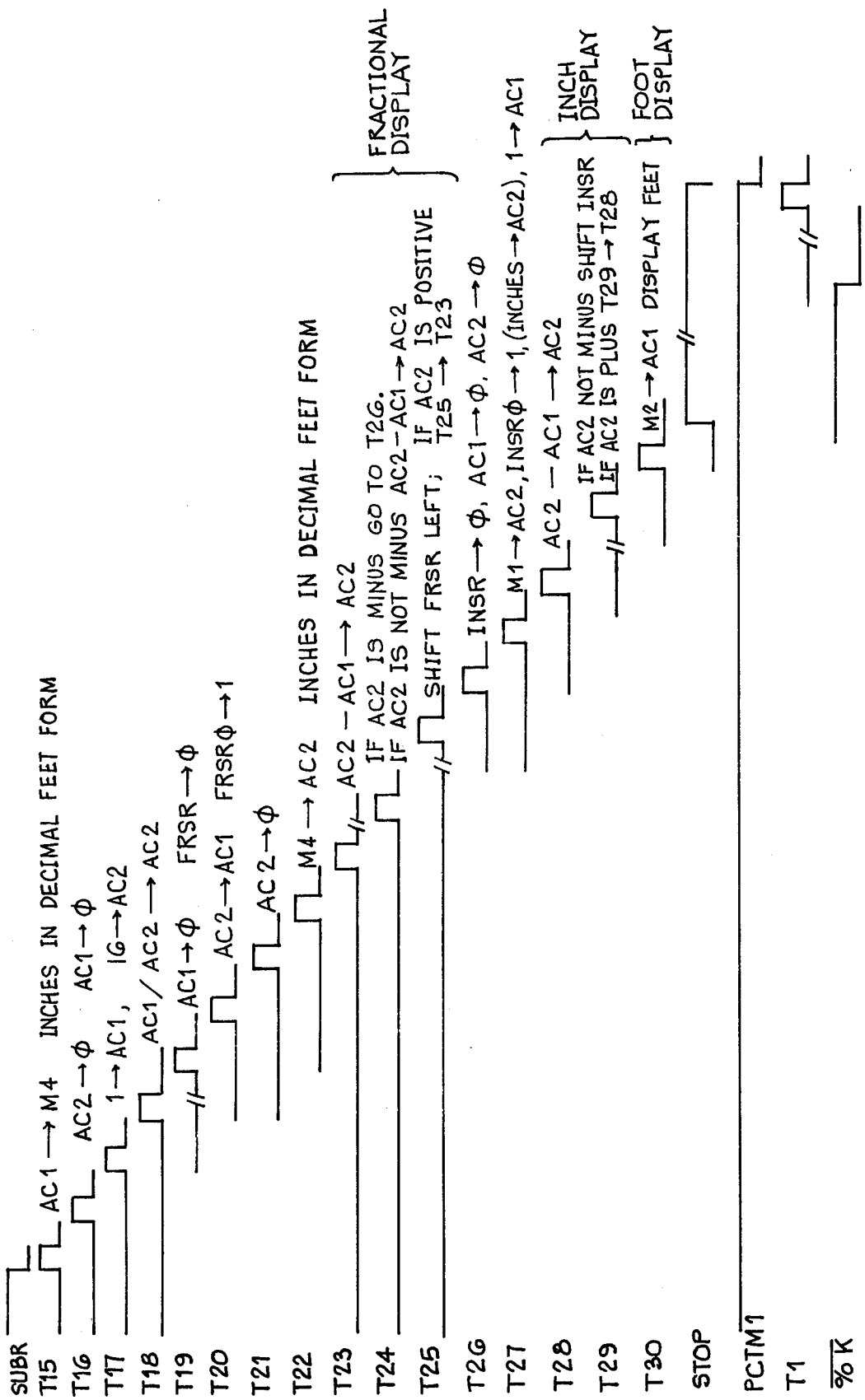
Figure 44:
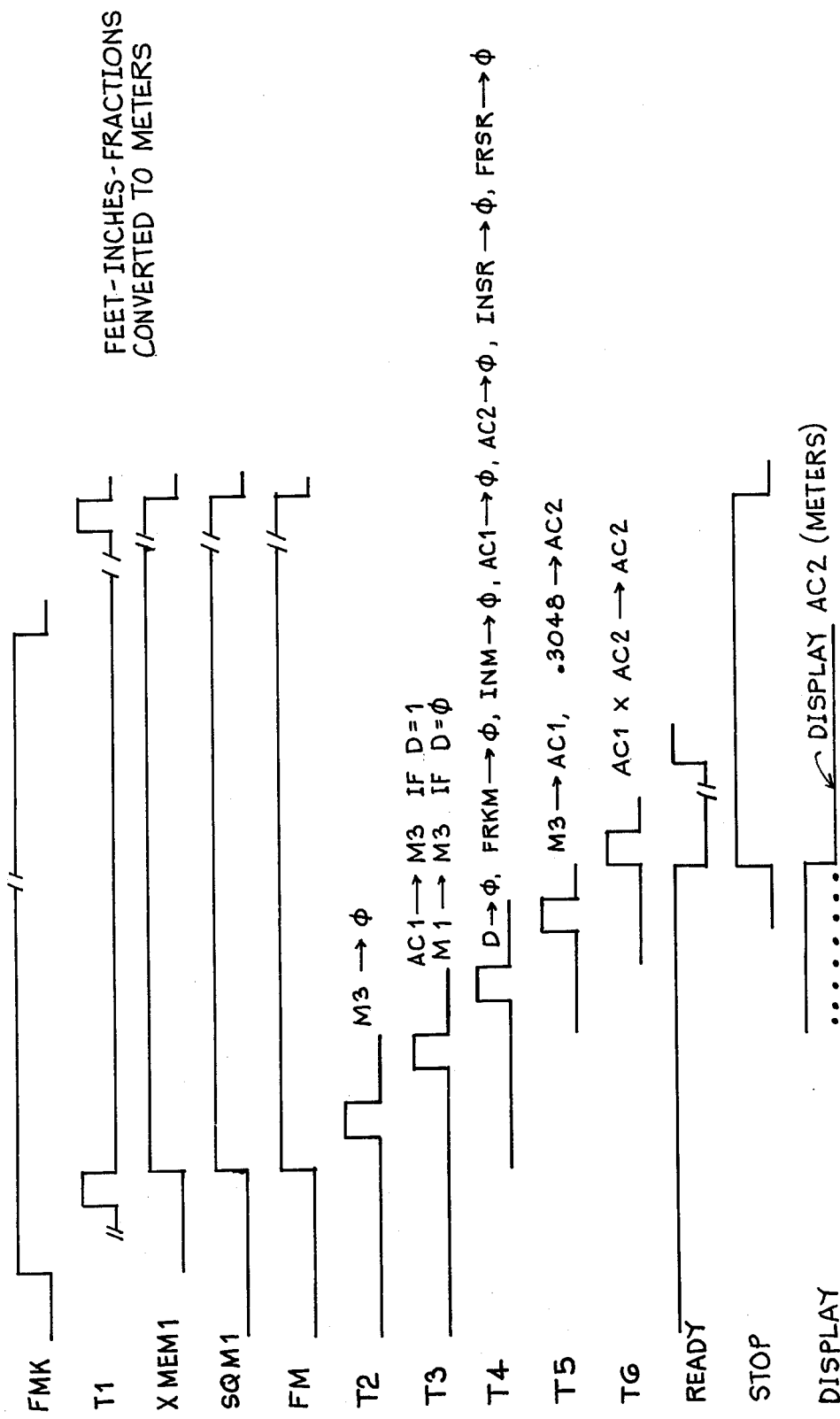
Figure 45:
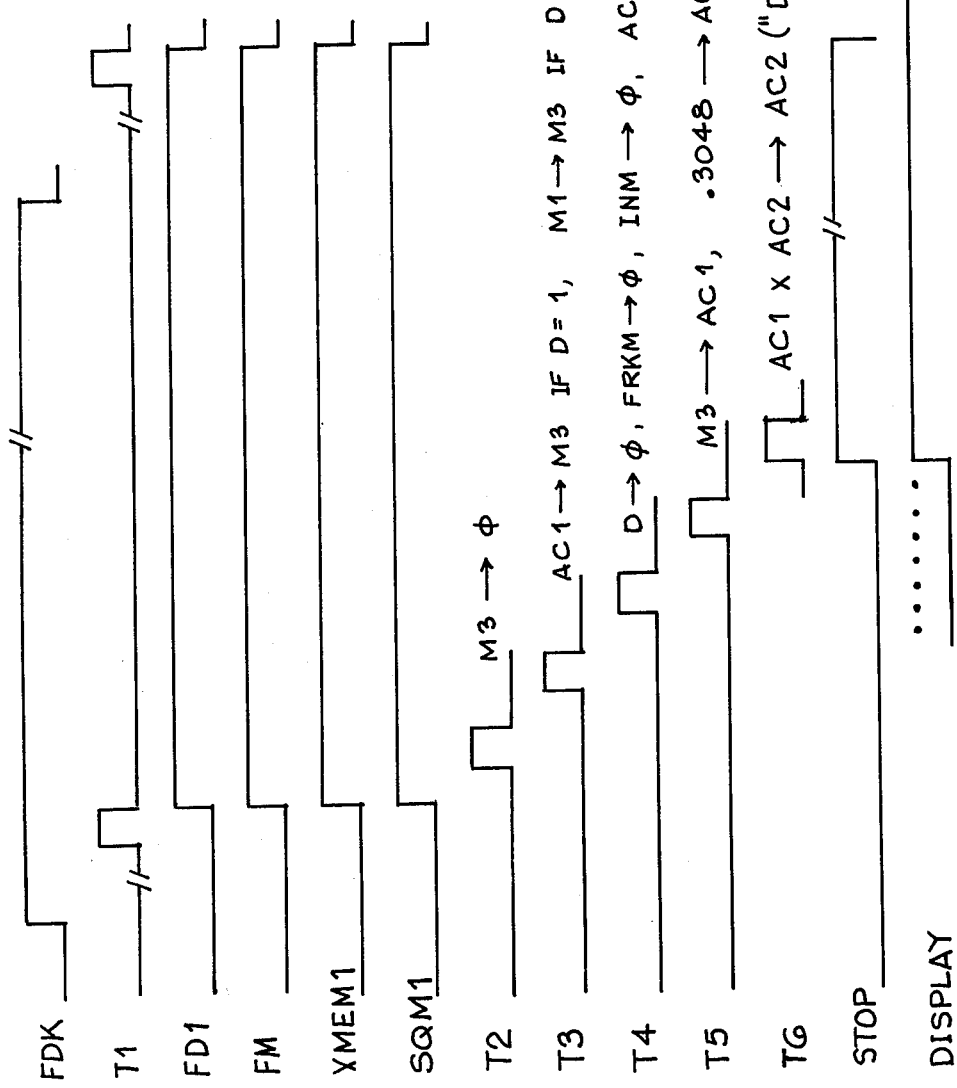
Figure 46:
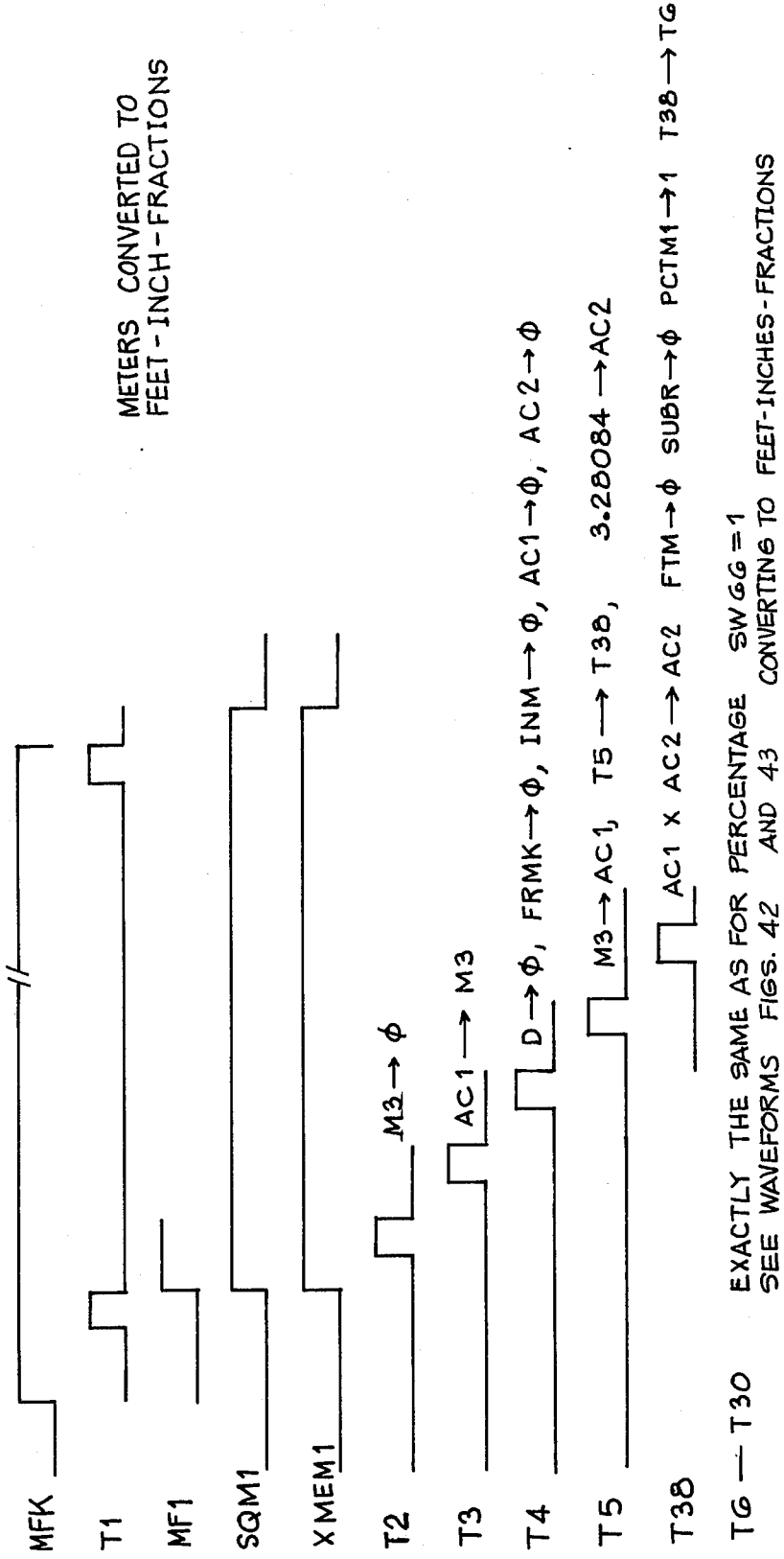
Figure 47:
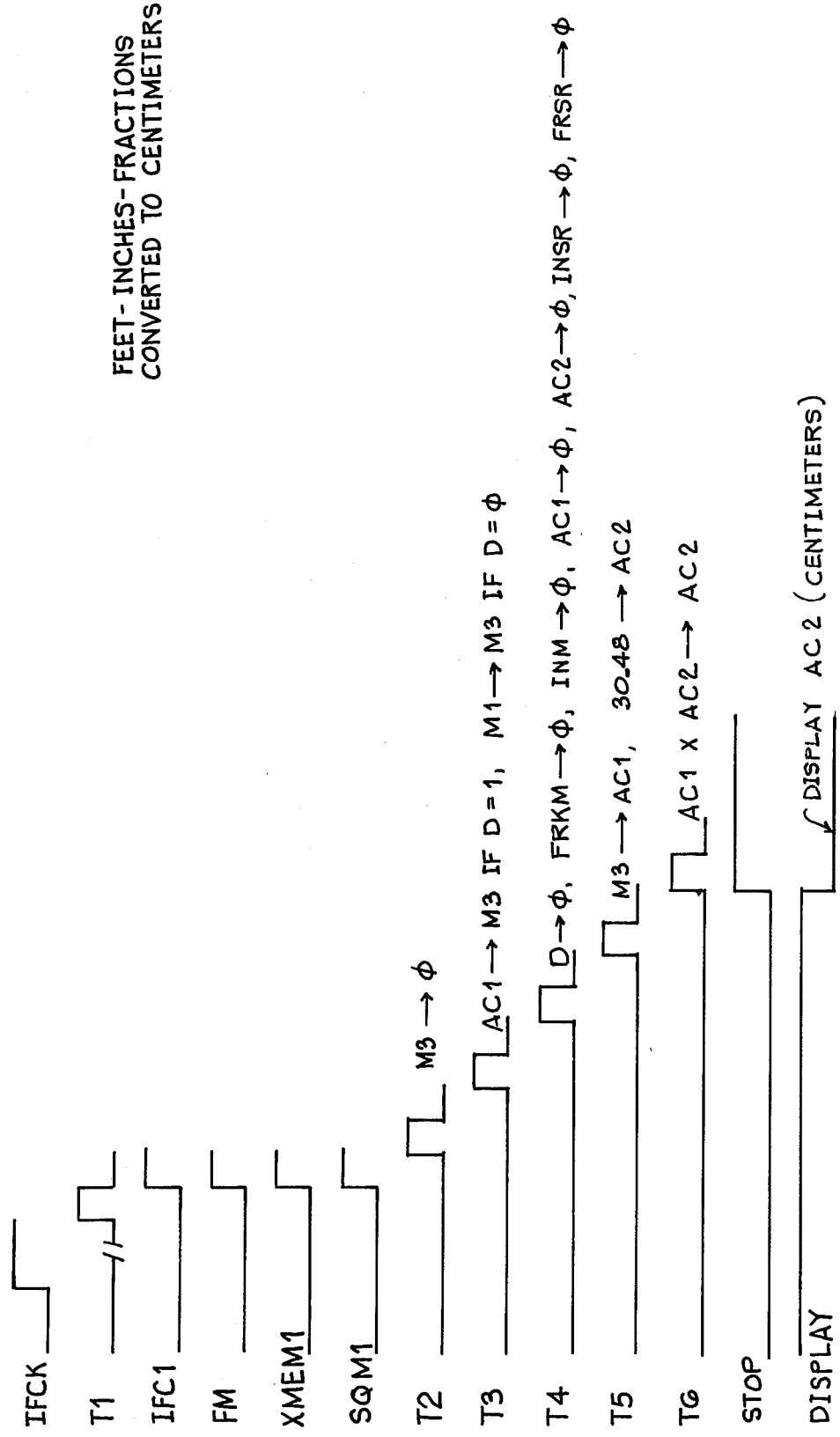
Figure 48:
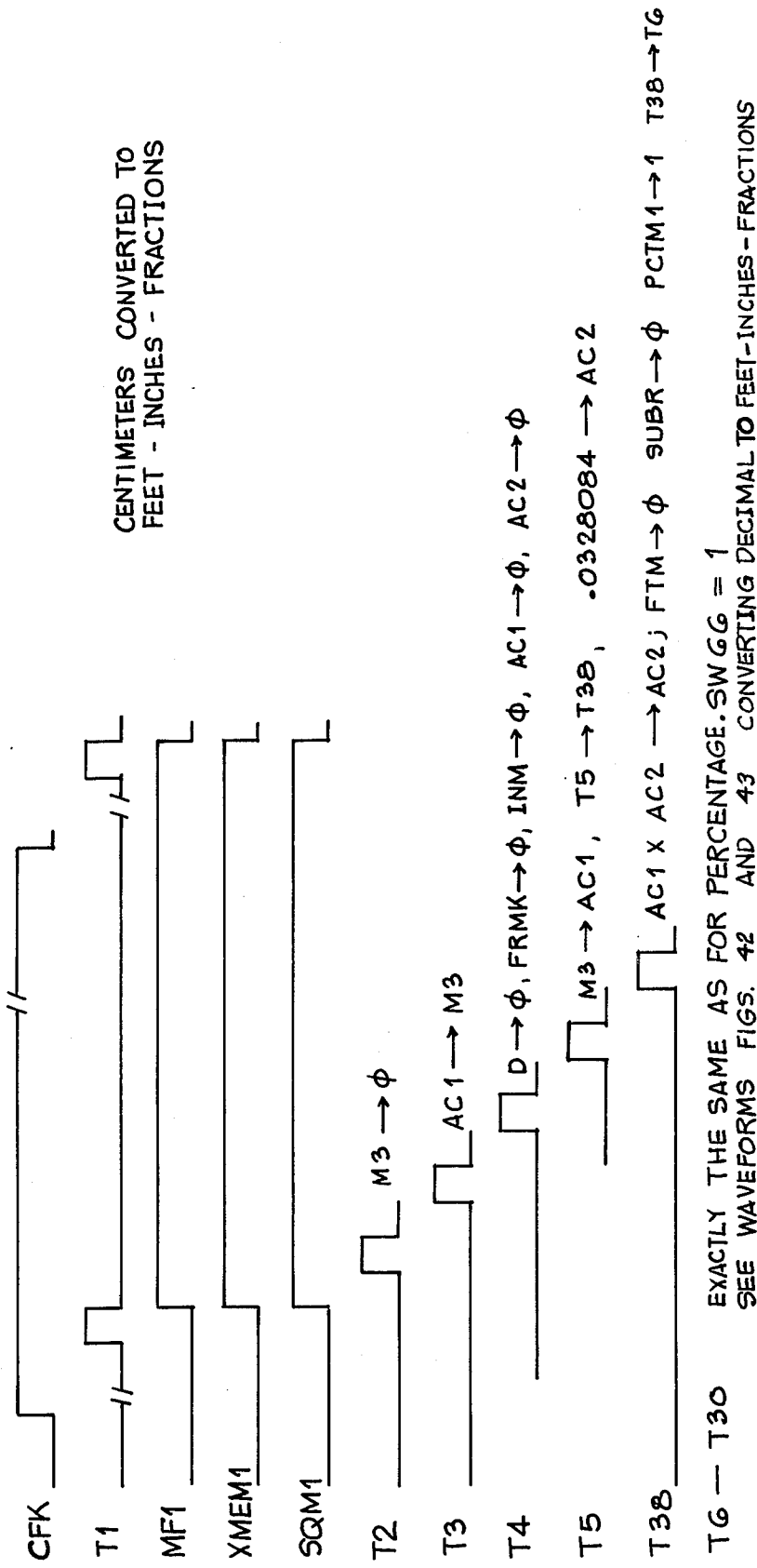

When operating switch 62 (also SW62, FIG. 28), after making the normal decimal entry into the AC1 register in decimal, we convert to feet, inches and fractions. This operation is practically the same as that which occurs in the percentage mode from time T6 to T30 of FIG. 42 and 43. At time T1, the DC1 flip-flop will be set to "one" at the trailing edge of clock pulse T1 by depressing SW62. At time T2, AC2 is reset and Gates AND3 and OR3 of FIG. 12. AC1, which contains the decimal number to be converted, is transferred to AC2 at time T3 via Gates AND5, OR1, AND11 and OR2 of FIG. 24. At the trailing edge of pulse T4, we set the PCTM1 line of FIG. 9 to "one" with Gates OR14 and OR13 of FIG. 9. Since PCTM1 is set at the trailing edge of pulse T4, none of the functions carried out for the percentage mode will be carried out at this clock time. Note that PCTM1 originates from the governing flip-flop, which is in the "on" state during percentage operations.

Figure 37:
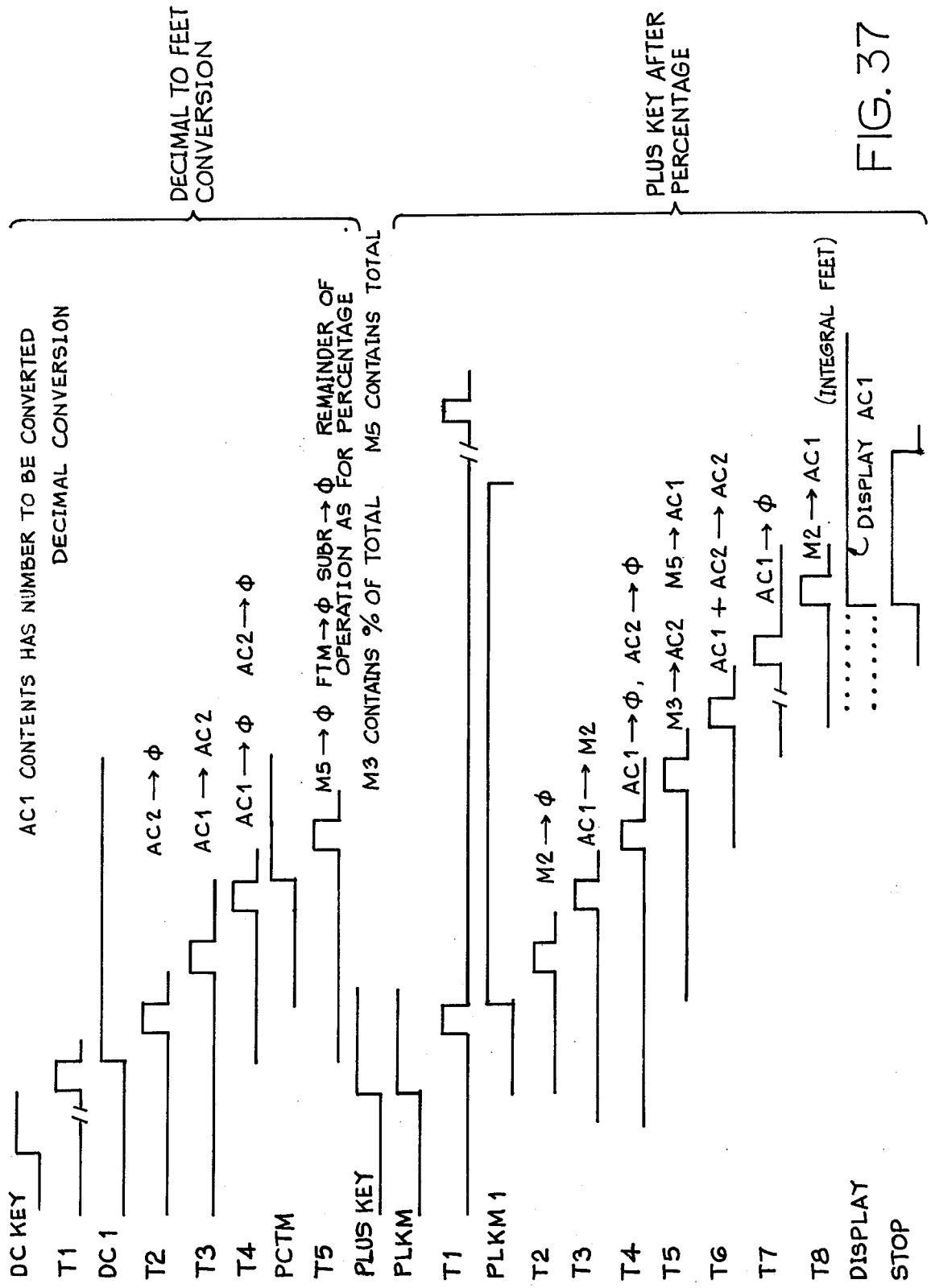

Beginning with time T5, we perform all operations of the percentage cycle, except multiplication, with Gate OR6 of FIG. 23 acting to inhibit AND GATE 10. At time T6 we also perform the operations of percentage with DC1 being "high" instead of SW66 due to Gates OR7 and AND9(FIG. 22). STOPT does not go "high" at time T6 because of the DC1 input to AND GATE 7 of FIG. 17. The clock pulses then go through all steps to T30 as in the percentage mode to convert the decimal quantity inserted into AC2 to feet, inches and fractions. As for percentages, the STOP signal appears at time T30. The waveforms for illustration of the timing relationships in the decimal conversion mode are shown in FIG. 37.

OPERATION OF THE PLUS OR MINUS KEY DIRECTLY AFTER PERCENTAGE KEY DEPRESSION

The depression of the Plus key 21 sets the PLKM line of FIG. 9 to "one." Likewise, MIKM is set "high" for a Minus key 21 depression. If the percentage Key 26 had been pressed immediately before, either PLKM1 or MIKM1 is set to "one" by the trailing edge of the pulse T1. Applicable waveforms for Plus operation are shown in FIG. 37. The waveforms for Minus key operation would be the same. At time T2, register M2 is set to zero through Gates AND7 and OR2 of FIG. 20. At time T3, we saved the feet by transferring AC1 to M2 with Gates AND4, OR1, AND8 and OR2 of FIG. 26. At time T4 we clear AC1 with Gates AND7, OR3 and OR6 of FIG. 10 and AC2 is cleared by Gates AND5, OR3 of FIG. 12. At time T5 we transfer the contents of M3, which contains the original total on which the percentage was to be taken to AC2 with Gates AND 6 and AND 12 of FIG. 24. The actual percentage of this total was stored in M5 at time T6 during the percentage operation by operation of Gates AND3, and AND4 of FIG. 21. The contents of M5 are now brought into AC1 at time T5 by Gates AND10 and OR4 of FIG. 11 and Gates AND8 and OR2 of FIG. 27. At time T6 we add or subtract AC1 to or from AC2 with Gates AND8 or AND15 of FIG. 23. At time T7 we clear AC1 through Gate AND7 of FIG. 10. At time T8, M2 transfers to AC1 by AND GATE 6 of FIG. 11 and AND GATE 4 of FIG. 27. The display flip-flop FF2 of FIG. 14 is set "high" by Gates AND12 and OR2 of FIG. 14 in order to display the AC1 accumulator. The STOPT line is activated through Gates AND2 and OR1 of FIG. 17 to halt the operation. No change actually appears in the display when using the plus or minus key 21 immediately after depressing the percentage key 26.

OPERATION OF THE EQUAL KEY IMMEDIATELY AFTER THE PLUS OR MINUS KEY

Referring now to FIG. 28, the EQK1 line is set "high" at T1, if the Equal kay 21a had been depressed. If either the Plus or Minus key had been the last function key depressed, the PLKM line or MIKM line would still be "high." At time T2 we set counter T to state T37 with Gates AND2 and OR1 of FIG. 18. At time T38, FTM line of FIG. 28 is reset through Gate AND5 and line PCTM1 of FIG. 9 is set to "one," and, finally, SUBR of FIG. 17 is reset through OR GATE 3. The T counter is also set back to the T5 state through OR GATE 2 of FIG. 18.

The remainder of the operation with PCTM1 = 1 is the same as for the operation of the percentage key. If SW66 - 1, we will convert the decimal number in AC2 (AC2 contains the total plus or minus percentage of the total) to feet, inches and fractions. If SW66 is zero, then the total plus or minus percentage of the total is displayed in decimal form. Waveforms of FIG. 40W are used for the equal key operation.

SQUARE FOOT OPERATION

Figure 39:
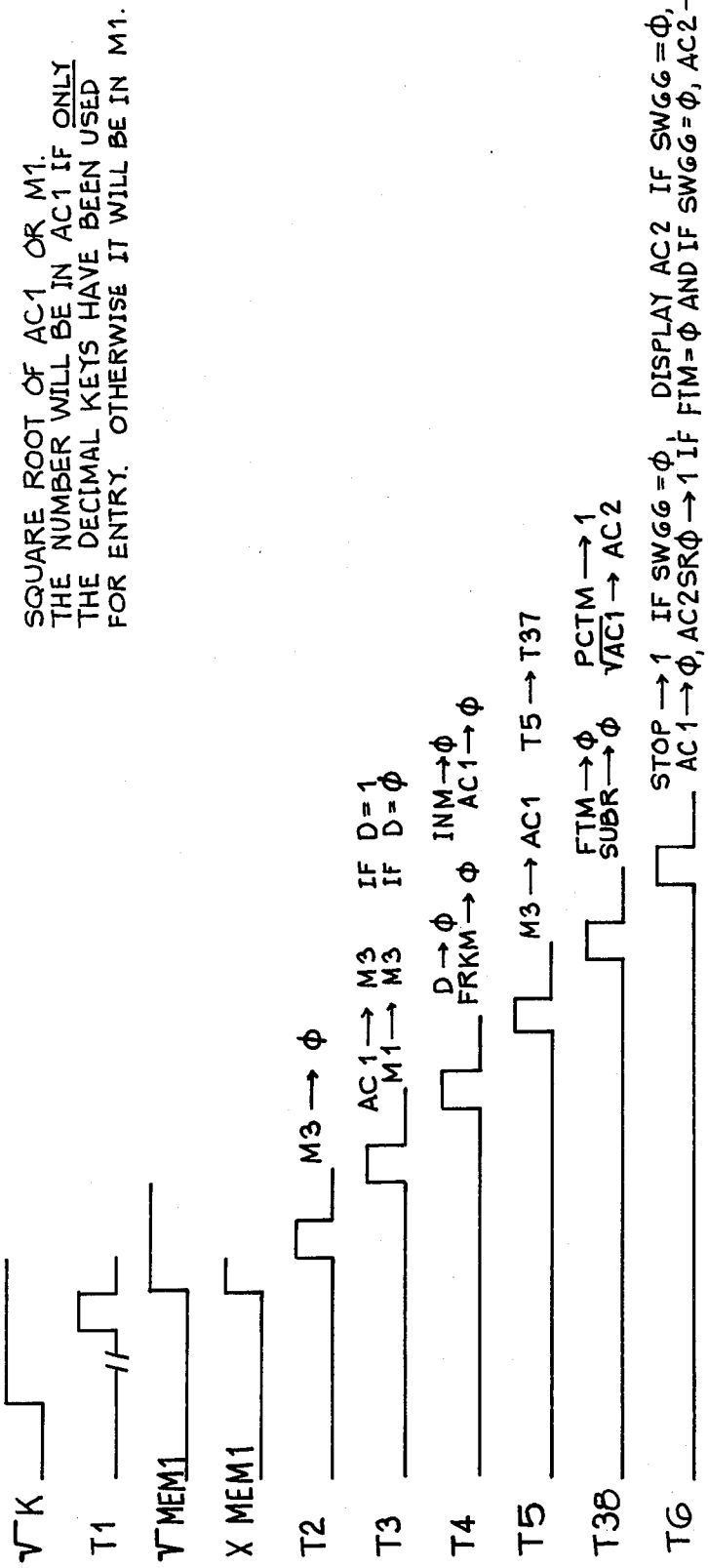

The entry of a number in decimal or in feet whose square root is to be taken resides in AC1. Waveforms are shown in FIG. 39. As the square root key 27 is depressed ($\sqrt{K}$ = O of FIG. 9) we set flip-flop FF3 (SQM1 line) to "one" on the trailing edge of pulse T1 (see FIG. 17). We also set XMEM1 (flip-flop FF2 of FIG. 23) through OR GATE 9. The action at times T2 and T3 is the same as for multiplication, since XMEM1 = 1. At time T2 register M3 is cleared. At time T3 accumulator AC1 is transferred to M3 if D = 1. At time T3, M1 is transferred to M3 if D=0. At time T4, D is set to "zero," FRKM is set to "zero" and INM is set to "zero" as is done for multiplication. At time T4, however, STOPT FIG. 17 is not set "high" because of the inhibit on AND GATE 6. Therefore, the action continues instead of stopping as for multiplication. At time T4, with SQM1 = 1, AC1 is set to "zero" through Gates AND9 and OR3 in FIG. 10. At time T5, M3 is transferred back to AC1 through AND GATE 3 of FIG. 11 and through AND GATE 1 of FIG. 27 for the decimal point. At time T5 we now advance the counter T to state 37 through Gates AND1 and OR1 of FIG. 18. The square root of AC1 is taken at time T38 through AND GATE 16 of FIG. 23. Also at time T38, as for decimal to feet conversion or equal key operation, FTM and SUBR are set to "zero" and PCTM1 is set to "one." The counter T is set back to the T5 state and the operation carries forward as in the percentage case. If SW66 = 0, the square root in decimal form contained in AC2 is displayed. If SW66 = 1, the conversion to feet, inches and fractions from the decimal form is obtained at time T30.

T COUNTER OPERATION

Figure 18A:
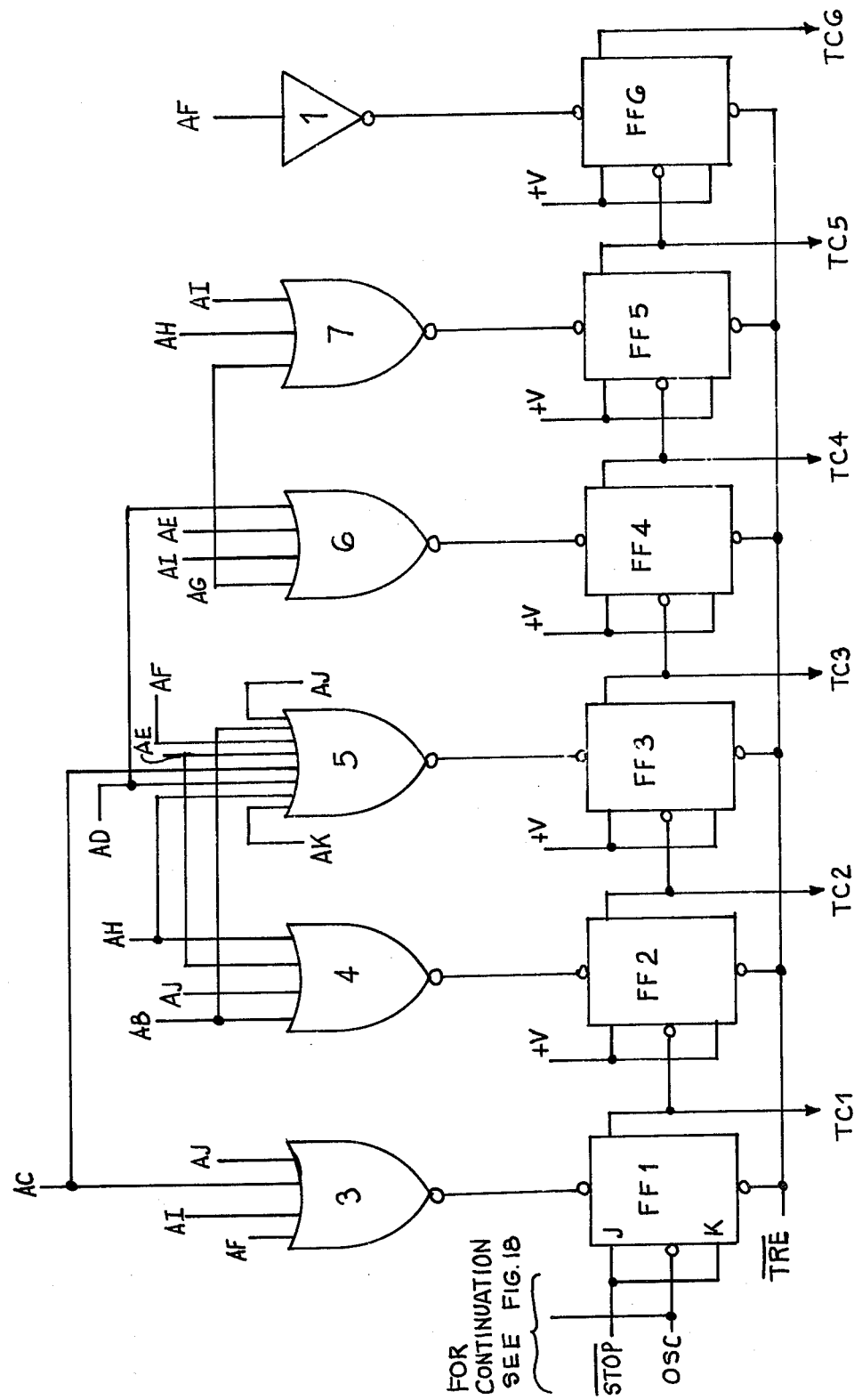
Figure 33:
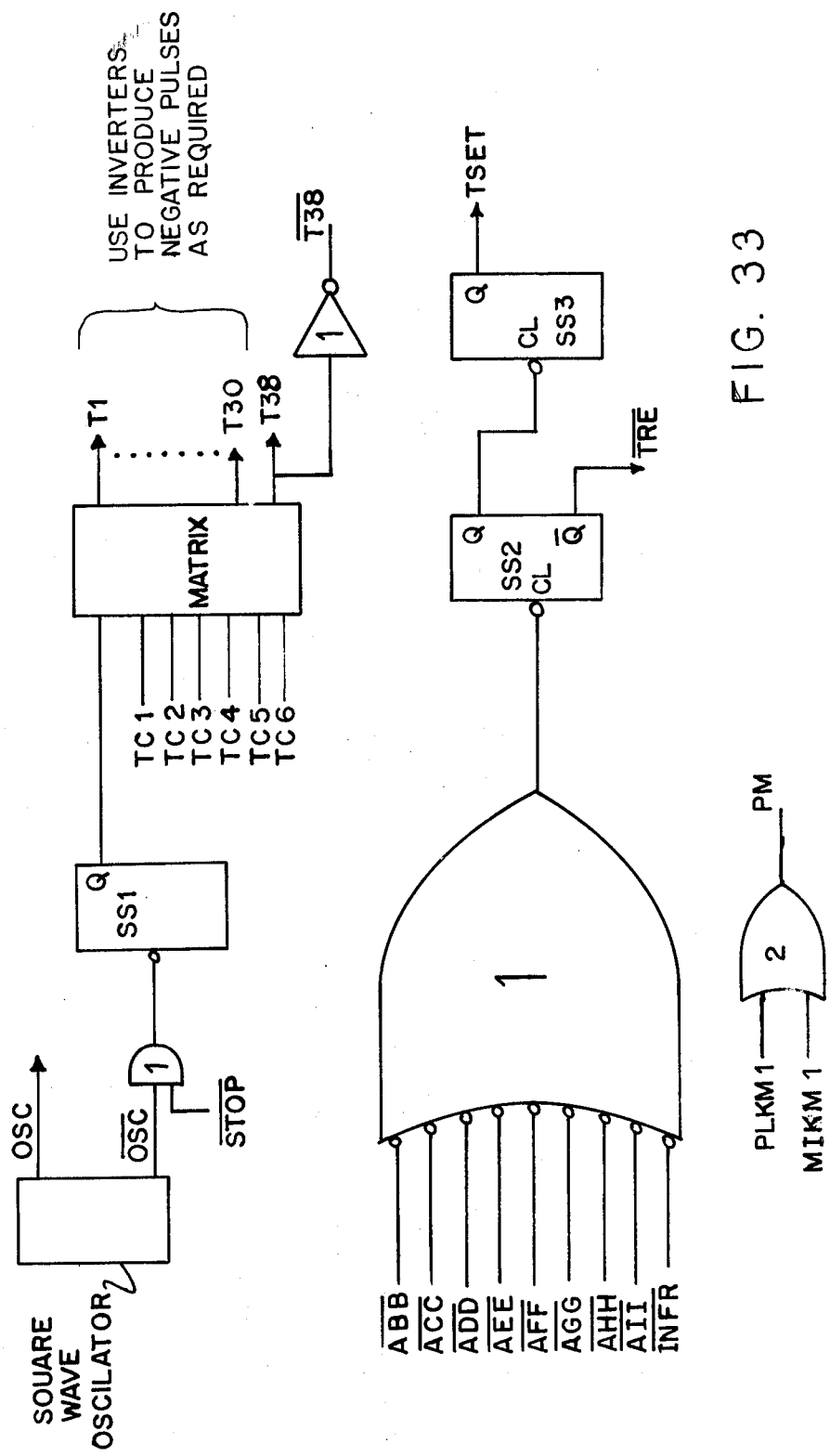
FIG. 33 is a circuit diagram of a timing pulse generator.

The basic counter T is a ripple binary counter which is shown in FIG. 18A. The T clock pluses T1 to T30 and T38 originate from the matrix of FIG. 33. This is a conventional and-or gate matrix as is not detailed here. To stop operation of the counter T, we simply control the JK inputs of flip-flop FF1 in FIG. 18. When zero, counting is no longer possible.

Figure 40:
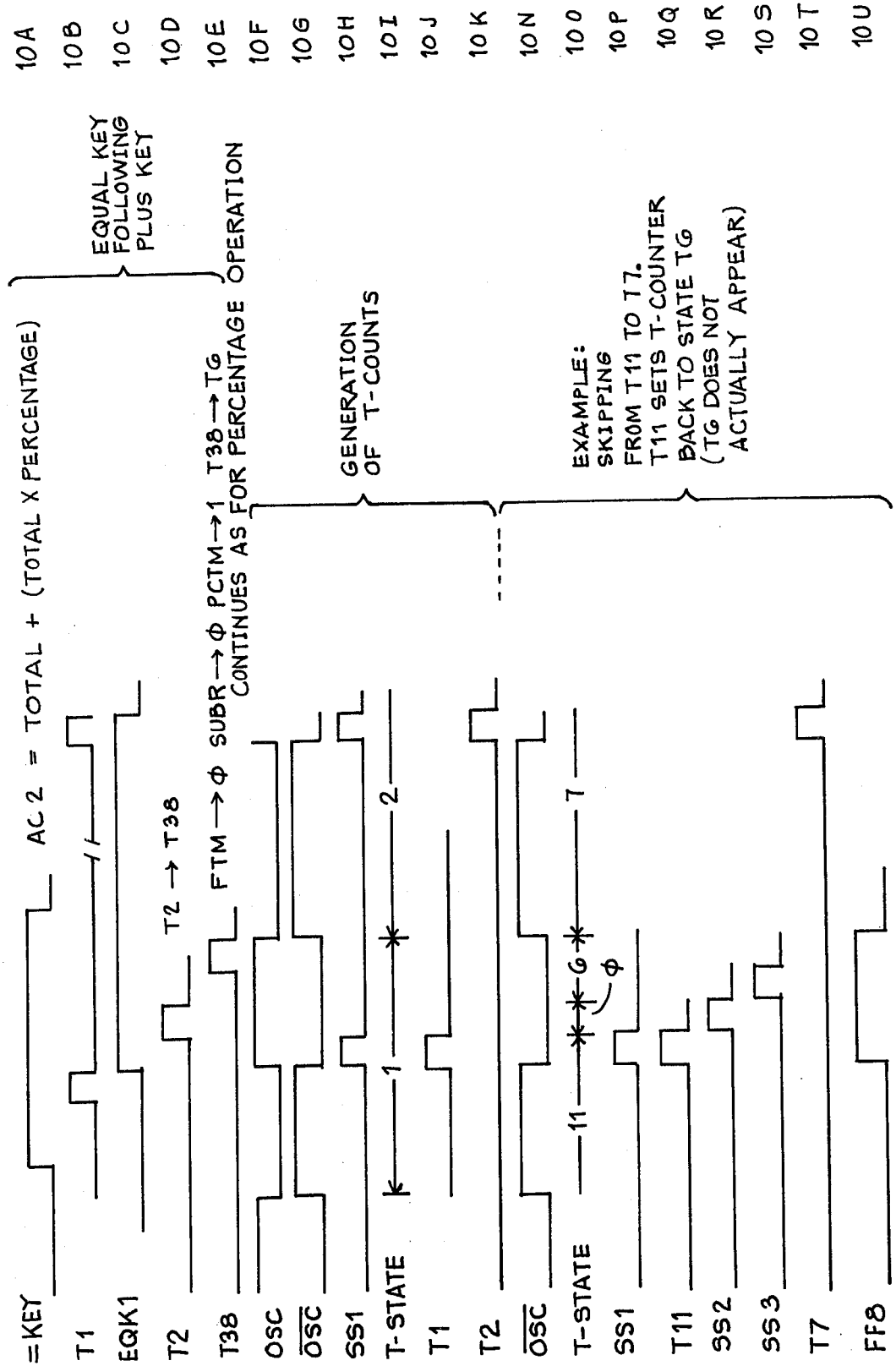

The waveform for this operation is shown at the bottom of FIG. 40. When the square wave oscillator goes negative, the counter T increments to the next count. The inverted output of this oscillator is applied to the monostable or single shot circuit SS1 of FIG. 33 and a pulse emanates, as shown on Wave Form 10H of FIG. 40. The inputs from the binary counter control the connection path through the matrix so that the T1 pulse appears at the output as in Wave form 10J of FIG. 40. These connection paths are controlled by the output of the binary counter to provide any of the T pulses used in the operations described above. For various conditional operations we create T pulse "skips." For instance, at time T11 we set the counter T back to its T6 state. The next T pulse that appears would be T7. This example is shown in Wave Forms 10N to 10U.

The T11 pulse sets FF8 to "one" as shown in Wave Form 10U with AND GATE 3 of FIG. 18. On the trailing edge of T11, SS2 generates a pulse to directly reset the T counter. On the trailing edge of this pulse from SS2, SS3 of FIG. 33 generates a pulse, as shown on Wave Form 10T. Since flip-flops FF8 is still "high," the pulse from SS3 passes through AND GATE 12 and sets the counter T to state 6 (FF2 and FF3 in the counter T are "high"). The next pulse out of the matrix will therefore be T7, as shown in Wave Form 10T. The T6 pulse itself, in this case, never appears. FF8 is later reset on the negative going edge of OSC.

CONVERSION OF FEET TO METERS

Feet, inches and fractions are keyed into the display as described in preceding section. If feet alone are entered, D = 1 and AC1 will contain the number to be converted. If feet and/or inches and/or fractions have been entered, D = 0 and M1 will contain the number to be converted. When the foot to meter conversion switch (SW71, FIG. 29) is depressed as "high" is caused on the "D" input of the FM flip flop (FF1, FIG. 29). At time T1 FM will set at the trailing edge of this pulse. XMEM1 (FIG. 23) and SQM1 (FIG. 17) are also set on the trailing edge of T1. M3 will reset to zero at time T2 to ready this register for receiving data (AND GATE 8, FIG. 20). At time T3, AC1 transfers to M3 if D = 1 (GATES AND 10 and OR 3 of FIG. 26). Memory M1 transfers to M3 if D = 0 (GATES AND 11 and OR 3 of FIG. 26). At time T4, line D (FIG. 8), FRKM (FIG. 9), INM (FIG. 16) are reset to "zero" (see GATES AND 6 and OR 12, FIG. 9). Also at time T3, AC1 is reset to zero (AND GATE 9, FIG. 10). These operations are similar to those that take place for depressing a multiplication key 21 or square root key 27 (see FIG. 1). STOPT is not set, however, in this case since AND GATE 6 of FIG. 17 is inhibited by SQM1 = 0. At time T4, AC2 is also reset through gates OR5, AND 5 of FIG. 12. Since the inch and fraction displays are not required, they are deactivated by the reset signal through AND GATE 28 of FIG. 25. At time T5, memory M3 is brought into AC1 through AND GATE 3 of FIG. 11. AC1 now contains feet in decimal form which will be converted to meters. We prevent the counter T from advancing to the T37 state by the $\overline{FM}$ inhibit on AND GATE 1 FIG. 18. Now, with AC2 cleared, we introduce the constant 0.3048 into AC2 at T5 time. This constant multiplied by feet would give the answer in meters. This constant enters through gates OR1, OR2, OR3, OR4, of FIG. 29. Through OR GATE 5, the decimal point for this constant enters the AC2SR-4 flip flop at time T5.

At time T6, we take the conversion to meters by multiplying AC2 (AND GATE 17 FIG. 23). The answer in meters resides in AC2. The display flip flop in FIG. 14 is set to "zero" by GATES AND 15 and OR 3, of FIG. 14 which causes AC2 to be displayed (FIG. 15). The action for obtaining the conversion is now complete and STOPT is set "high" through GATES AND10 and OR1 of FIG. 17.

FEET TO DECIMAL CONVERSION

Figure 29:
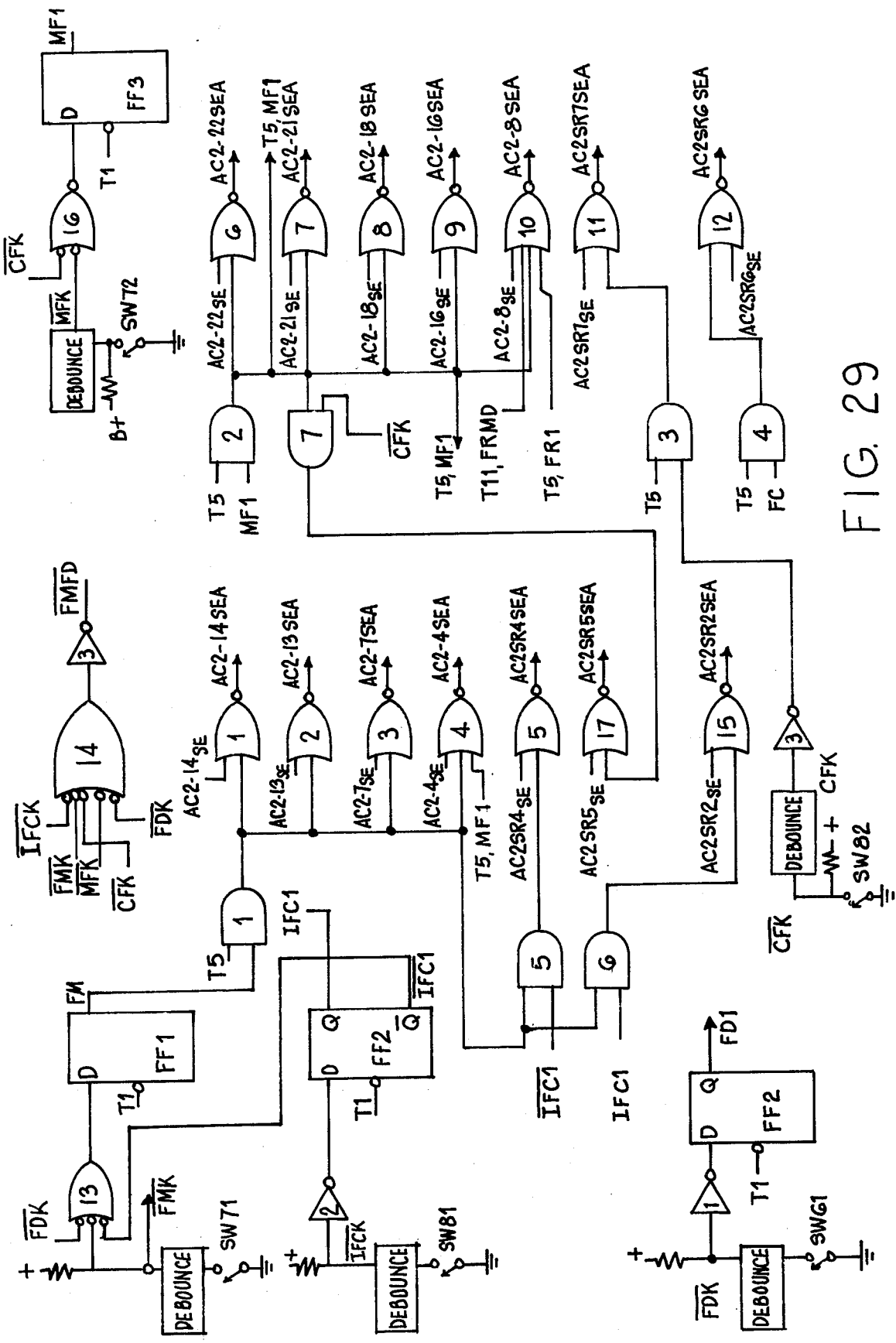
FIG. 29 is a circuit diagram illustrating logic circuitry for controlling shifting of registers to effect parameter conversions.

Entry is made in feet, inches and fractions, as described above. At time T1, flip-flop FF2 of FIG. 29 is set "high" when the feet to decimal key SW61 FIG. 29 is depressed. At the same time, FM (FIG. 29), XMEM1 (FIG. 23) and SQM1 (FIG. 17) are set to "one." At time T2, M3 is reset to "zero" to ready this register for incoming data (AND GATE 8 FIG. 20). At time T3, M1 transfers to M3 if D = 0 by operating AND GATE 11, OR GATE 3, FIG. 26. If D = 1, AC1 transfers to M3 by operating AND GATE 10 and/or GATE 3, FIG. 26. At time T4, line D of FIG. 8, FRKM (FIG. 9), INM (FIG. 16), are reset to "zero" through GATES AND 6 and OR 12 of FIG. 9. AC1 resets to "zero" (AND GATE 9, FIG. 10) and AC2 is reset through GATES OR 5 and AND5 of FIG. 12. These operations are almost the same as for the "feet to meter" conversions in the preceding paragraph. At time T5, M3 is transferred to AC1 through AND GATE 3 of FIG. 11. AC2 receives the "feet to meter" conversion through operation of gates OR1, OR2, OR3, OR4 of FIG. 29 constant at time T5, but this is an operation that we refer to as a "don't care condition." It is easier to let this operation take place than to prevent it. At time T6, multiplication of AC1 by AC2 takes place, which is also a "don't care condition" through operation of AND GATE 17 of FIG. 23. At time T6, the operation stops through operation of GATES AND 10 and OR 1 of FIG. 17.

We display AC1 by setting the display flip flop FF2 of FIG. 14 through operation of AND GATE 16 while AND GATE15 on the reset side of FF2 is inhibited. AC1, the contents of which is now being displayed contains the accumulated feet, inches and fractions in decimal form. Remember that in the process of entering data, the total is accumulated in M1. If only feet had been entered, the entry steps in AC1 and no accumulation occurs. At time T3, we then transfer either AC1 or M1 to M3.

METER CONVERSION TO FEET-INCHES-FRACTIONS

Meters are entered into the decimal keyboard as a decimal or integer quantity. At the trailing edge of pulse T1. MF1 flip flop of FIG. 29 is set "high" if SW72 (meter to feet switch) is depressed. With $\overline{FMFD} = 0$ FIG. 29 SQM1 goes "high" (FIG. 22) and XMEM1 goes "high" (FIG. 23).

At Time T2, the M3 register is cleared by AND GATE 8 of FIG. 20. Since only decimals (meters) have been entered, D = 1, and at time T3, AC1 transfers to M3 through GATES AND 10 and OR 3, of FIG. 26. At time T4, D is set to "Zero" by GATES AND6 and OR 12 of FIG. 9. FRKM of FIG. 9 and INM of FIG. 16 also receive reset pulses, but these flip flops are already in their "zero" state. Inches or fractions are not entered in this mode. At time T4, we reset AC1 through AND GATE9 of FIG. 10 and reset AC2. A stop is prevented at time T4 by the inhibit on AND GATE6 of FIG. 17.

We reset AC2 by means of GATES OR5 and AND5 of FIG. 12 at time T4. At time T5, we transfer M3 (which contains meters) to AC1 through AND GATE3 of FIG. 11. At time T5, we enter the constant 3.28084 into the AC2 register. For this we utilize GATES AND2, OR6, OR7, OR8, OR9, OR10, OR4 of FIG. 29 for the integers, and OR17 for the decimal point. This constant multiplied by meters will provide the conversion to feet.

We now set the T counter to state 37 with GATES AND1 and OR1 of FIG. 18. Clock pulse T38 appears next, setting PCTM1 to "one" of FIG. 9. FTM of FIG. 28 is set "low" through GATES OR3, AND5, and SUBR is set "low" via OR GATE 3 in FIG. 17. These flip flops are both initialized to "zero" for the decimal to feet conversion process to follow if SW66 = 1, as it should be in this mode of operation. We now multiply AC2 by AC1 to obtain feet in decimal form. The answer resides in the AC2 register after operating AND GATE18 of FIG. 23.

The T38 clock pulse also sets the counter T back to state T5 by operating OR GATE2 of FIG. 18 so that the T6 pulse appears next. Operation from time T6 to time T30 will be exactly the same as for the percentage mode (PCTM1 had been set "high" by T38 clock pulse). The STOPT flip flop is prevented from being set "high" at time T6 by the $\overline{MF1}$ inhibit applied to AND GATE7 of FIG. 17. This operation from time T6 to time T30 is completely described before in this text where the percentage mode of operation is set forth. At time T30 the decimal number is AC2 AT T6, which represents meters converted to feet, is now converted to feet, inches and fractions on the display.

FEET-INCHES-FRACTIONS CONVERTED TO CENTIMETERS

This operation is very similar to the conversion from feet-inches-fractions to meters. As in previous cases, feet, inches or fractions can each be entered into the keyboard alone or in conjunction with one or two of the other factors. In any case, the order of entry is first feet, then inches and then fractions.

When the inch to centimeter conversion switch 81 (FIG. 1) is depressed, at the trailing edge of T1, IFC1 (FIG. 29) FM (FIG. 29), XMEM1 (FIG. 23) and SQM1 (FIG. 17) go "high". The "D" inputs of these flip flops are set "high" through the various gates involved (OR GATE13 and OR GATE14, FIG. 29; OR GATE9, FIG. 23; OR GATE4 FIG. 17), when the inch to centimeter key (SW81) is struck. M3 is reset to "zero" by AND GATE8 FIG. 20 at time T2 preparing for the new data that it is to receive. At time T3, AC1 data goes into the previously cleared M3 register if D = 1 by operation of gates AND10, OR3, AND12 and OR4 of FIG. 26. If D = 0, then M1 transfers to M3 by operation of gates AND11, OR3, AND13, OR4 of FIG. 26. At time T4, D, FRKM, INM are set to "zero" by operation of gates AND6 and OR12 of FIG. 9. At time T3, we also reset AC1 and AC2 with gates AND9 and OR3 of FIG. 10 for the former and GATES OR5, AND5, OR3 of FIG. 12 for the latter. The inch and fraction displays, since they are no longer necessary, are deactivated by AND GATE28 FIG. 25. AND GATE6 of FIG. 17 is inhibited by $\overline{SQM1} = 0$ and therefore the STOPT flip flop is not set.

Finally, M3, which now contains the feet-inch-fractions in decimal form, transfers to AC1 through AND GATE3 of FIG. 11 and AND GATE1 of FIG. 27 (for the decimal). The $\overline{FM}$ inhibit signal on AND GATE1 (FIG. 18) prevents advance of the counter T. At time T5, the conversion factor 30.48 is inserted into the previously cleared AC2 register. This constant enters through GATES OR1, OR2, OR3, OR4 of FIG. 29. The decimal point separately enters AC2SR2 through AND GATE 6 and OR GATE15 of FIG. 29. The decimal point entry to AC2SR4, used for the feet to meter conversion, is inhibited by $\overline{IFC1}$ of FIG. 29. At time T6, we multiply AC1 by AC2 by operating AND GATE17 of FIG. 23 to obtain the centimeter equivalent. The display line of FIG. 14 is set "low" by operation of GATES AND15 and OR3 and the action stops as STOPT goes "high" by operation of gates AND10 and OR1 of FIG. 17. The centimeters in AC2, equivalent to the feet-inches-fractions originally entered, are now being displayed.

CENTIMETERS CONVERTED TO FEET-INCHES-FRACTIONS

Centimeters are keyed into the decimal keyboard by depressing CF key 82 (FIG. 1) and SW82 (FIG. 29) to produce the desired conversion. The ensuing operations are almost the same as for the conversion of meters to feet-inches-fractions as described above.

At the trailing edge of pulse T1, MF1 (FIG. 29), XMEM1 (FIG. 23) and SQM1 (FIG. 17), go "high" since the "D" inputs to these flip flops will be "high" when $\overline{FMFD} = 0$ (FIG. 29). M3 is cleared at time T2 by operation of AND GATES8 (FIG. 20). Only the decimal keyboard is used for the entry of centimeters and therefore D = 1. AC1 transfers to M3 through GATES AND10 and OR3 of FIG. 26 and GATES AND12 and OR4 of FIG. 26 for decimal at T3. "D" is set to "zero" at time T4 by GATES AND6 and OR12 FIG. 9. FRKM (FIG. 9) and INM (FIG. 16) also receive reset pulses but they are already in their "zero state." AC1 resets through AND GATE9 of FIG. 10, and AC2 resets through gates OR5 and AND5 of FIG. 12.

We now transfer the contents of register M3, which contains centimeters, to AC1 using AND GATE3 of FIG. 11 and AND GATE1 of FIG. 27. Also at time T5, we insert the constant 0.0328084 into the AC2 register, using gates AND2, OR6, OR7, OR8, OR9, OR10 of FIG. 29 and OR GATE2 of FIG. 22 for the integers. At time T5 AND GATE 7 of FIG. 29 is inhibited by $\overline{CFK}$ = 0, AND GATE3 is enabled, and thus AC2SR7 is set "high." This correctly represents the decimal point at left of the seventh digit. Note that in this case there is no flip flop associated with the SW82 switch closure. The $\overline{CFK}$ signal, resulting from the depression of the switch 82, inhibits and enables the correct gates for setting the decimal point.

At time T5, we also set the counter T to state 37 by GATES AND1 and OR1 of FIG. 18. The next clock pulse, $\overline{T38}$ sets PCTM1 to "one" (FIG. 9). For the conversion process to follow, line FTM of FIG. 28 is "zeroed" through GATES OR3, AND5 and SUBR is "zeroed" through GATES OR3 and AND8 of FIG. 17. AC1 is multiplied by AC2 to provide decimal feet equivalent to the centimeters originally entered. The counter goes back to state T5 by means of OR GATE 2 of FIG. 18.

From time T6 on, with SW66 = 1, the operation continues as in the percentage case. The $\overline{MF1} = 0$ signal at AND GATE7 of FIG. 17, prevents stopping at time T6. At time T6, the centimeters originally entered have now been converted to feet in decimal form in accumulation AC2. The action continues to time T30, exactly as in percentage operation, providing the feet-inches-fraction equivalent of centimeters.

ENTRY OF DISPLAYED QUANTITIES INTO MEMORY

Figure 30:
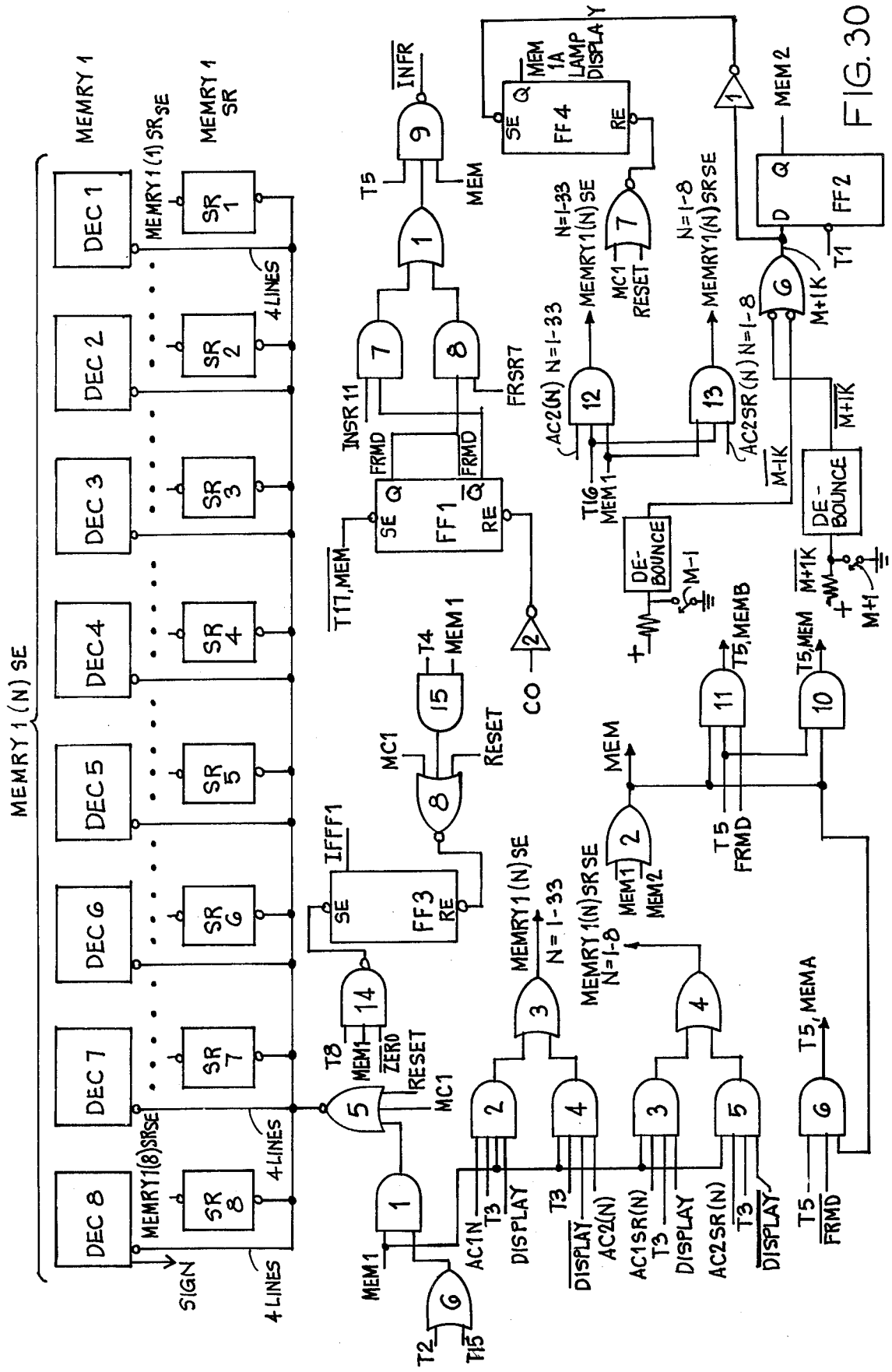
FIG. 30 is a circuit diiagram of a memory and memory control circuit.
Figure 31:
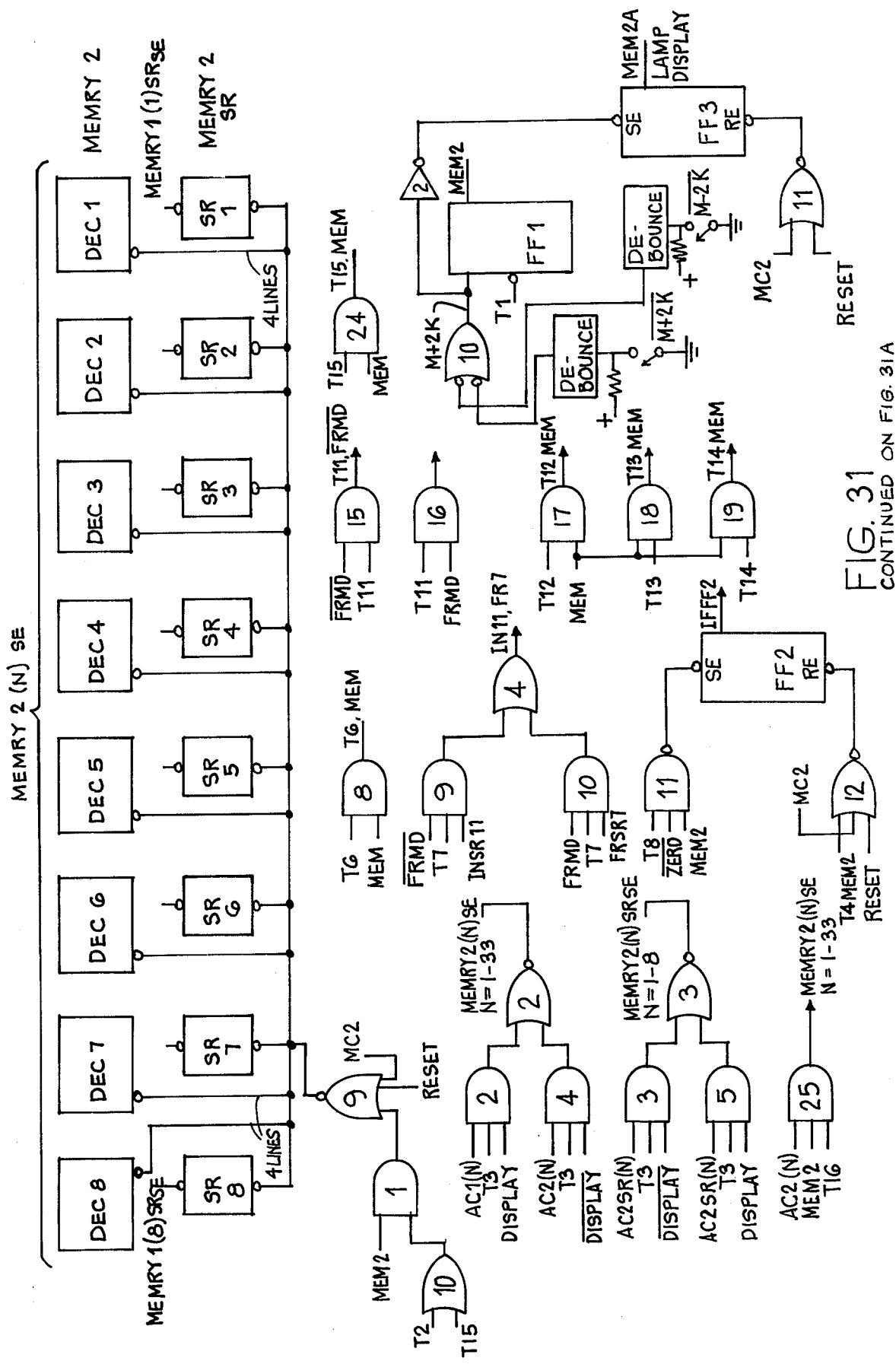
FIGS. 31 and 31A are circuit diagrams of a memory and memory control circuit.
Figure 31A:
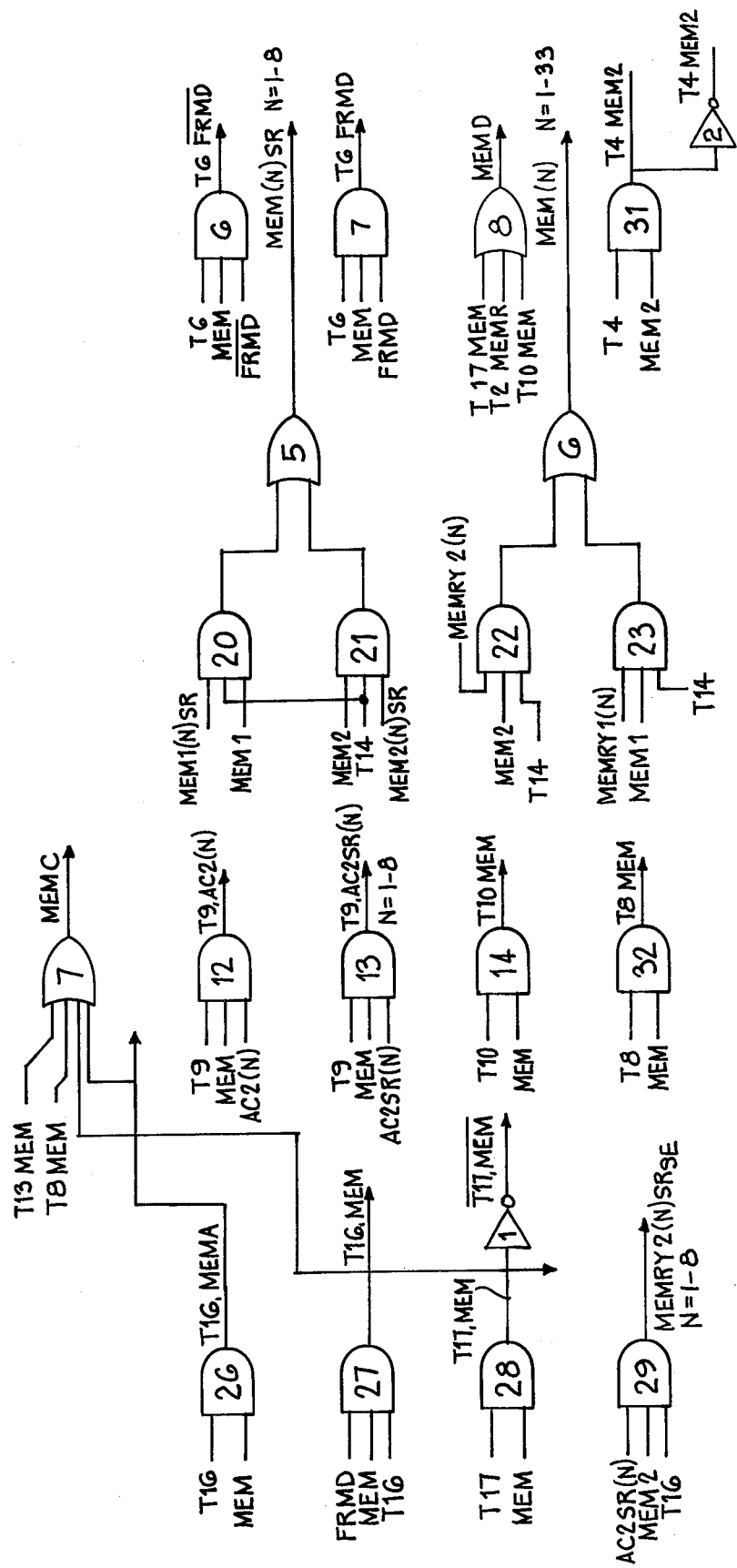
Figure 49:
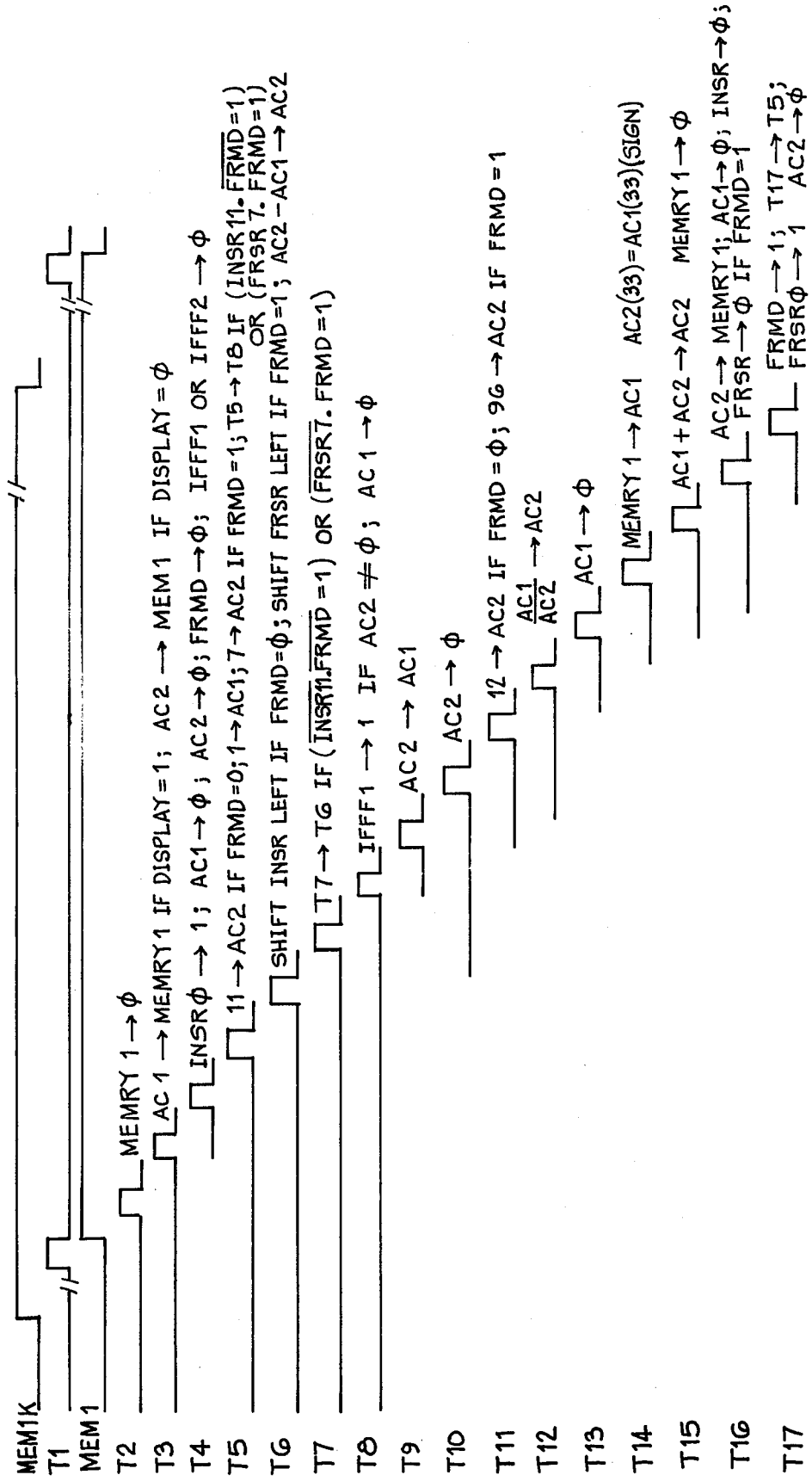

The waveforms of FIG. 49 depict memorization of the display by Memory 1 with depression of the M+1 key (SW110) is shown in FIG. 30, the M+2 key (SW111) is shown in FIG. 31. MEM1 goes "high" on the trailing edge of pulse T1 if M+1K signal on "D" input of FF2 (FIG. 30) is "high." Similarly, MEM2 goes "high" if the M+2K signal (FIG. 31) is "high." At time T2, we clear Memory 1 by operation of GATES OR6, AND1, OR5, of FIG. 30 if MEM1=1, or we clear Memory 2 by operation of GATES OR10, AND1, OR9 of FIG. 31 if MEM2=1. This makes way for new information to be located into the desired memory at time T3. If AC1 is displayed (DISPLAY 1, FIG. 14, we then load AC1 into MEMORY1 (MEMRY 1) through GATES AND2, OR3 and GATES AND3, OR4 of FIG. 30 (the latter for the decimal). If AC2 is being displayed (DISPLAY = 0, FIG. 14) then we load MEMORY1 from AC2 by operation of GATES AND4, OR3 and AND5, OR4, FIG. 30.

A similar operation takes place if MEMRY2 is to be loaded by operation of GATES AND2, AND4, OR2, AND3, AND5 and OR3 of FIG. 31. At time T4, we set INSR "high" by operation of OR GATE2 of FIG. 30 and GATES AND29, and OR3, of FIG. 25. AC1 is reset by GATES AND16 and OR3 of FIG. 10 and OR GATE2 of FIG. 30 and AC2 is reset by AND GA-TE16, FIG. 10 and OR GATE 3 FIG. 12. The CO signal from AND GATE 16 of FIG. 10 also resets the FRMD flip flop of FIG. 30 through inverter 2 of FIG. 30. This flip flop when "low" governs various operations necessary to add the inches (in decimal feet form) to feet, which are already in memory. When FRMD is "high," fractions (in decimal feet form) are added to the total already in memory. The total accumulated value will be reatined in the selected memory in decimal feet form. The line IFFF1 of flip flop (FF3, FIG. 30) or the line IFFF2 (FIG. 31) memorizes that the inch or fraction display had been activated. This will govern the type of display that will be obtained on depressing a memory recall key as is discussed hereinafter.

If MEM1 = 1, IFFF1 will be reset at time T4 by AND GATE15 of FIG. 30.; if MEM2 = 1, line IFFF2 will be reset by gates AND31, OR12 of FIG. 31. This clears the way for new information to be loaded later at time T8.

At time T5, if FRMD = 0, we proceed to evaluate the number of inches displayed in the inch display 240 of FIG. 15. The constant 11 is inserted into AC2 if FRMD=0 by AND GATE6 of FIG. 30. and GATES OR3 and OR8 of FIG. 22. This occurs the first time through the loop T5 - T17 with FRMD=0. During the second time through this loop, the fractional display is evaluated and FRMD (FIG. 30), as we shall see, will equal "one." The constant 7, at time T5, will be inserted into AC2 if FRMD = 1 by AND GATE 11 of FIG. 30 and GATES OR4, OR8 and OR2 of FIG. 22. At time T5 we also insert the constant 1 into AC1 by OR GATE2 of FIG. 13 and AND GATE10 of FIG. 30. Now, if INSR11 = 1 and FRMD = 0, during evaluation of inches, or FRSR7 = 1 and FRMD = 1, during evaluation of fractions, the counter T is set to state T7. We set FF15 (FIG. 18) to "one" by GATES AND7, OR1 and AND9 of FIG. 30 or gate AND8, OR1 and AND9 of FIG. 30. SS2 is triggered through OR GATE 1 ($\overline{INFR}$ input FIG. 33), subsequently triggering SS3 of FIG. 33. The SS3 (T-SET) pulse passes through AND GATE 19, of FIG. 18, to set the counter T to state T7. The next T clock pulse emanating from the matrix will be T8. The operation from time T8 to time T17, accumulating feet, inches and fractions into decimal form retaining this data in the selected memory, will be described later.

If, at time T5, conditions that set FF15 of FIG. 18 do not apply, we then proceed to time T6. If FRMD = 0, we shift INSR left gates AND6 of FIG. 31 and OR GATE 4 of FIG. 25. If FRMD = 1 (the second time through this loop) we shift FRSR left with AND GATE 7 of FIG. 31 and OR GATES of FIG. 25. At time T6, we subtract AC1 from AC2 by AND GATE8 FIG. 31 and OR GATE2 FIG. 23. If INSR11 or FRSR7 become "one," as a result of the left shift at time T6, then AC2 contents will equal the contents originally displayed in the INCH or FRACTION registers. We would proceed to line T8 if this were so. If INSR11 or FRSR7 stay at "zero," we set the counter T back to state T5 with GATES AND9, AND10 and OR4 of FIG. 31 and OR GATE2 of FIG. 18; SS3 (T-SET) pulse (FIG. 33) passes through AND GATE13 of FIG. 14, to set counter T to "five." We repeat steps T6 and T7 until INSR11 become "one", if FRMD = 0, or, if FRSR7 becomes "one," if FRMD = 1. The AC2 counter reflects the inches (if FRMD = 0) or fractions (if FRMD = 1) in BCD form.

At time T8, if AC2 does not equal "zero," we set IFFF1 to "one" through AND GATE 14 of FIG. 30 if MEMRY 1 is entered. If MEMRY2 is entered, we set IFFF2 to "one" through AND GATE 11 of FIG. 31. One of these flips flops will be utilized later for the "recall" operation. If AC2 had equaled "zero," this would have indicated that there had not been any inch display (if FRMD = 0) or, any fraction display (if FRMD = 1).

At time T8, we now set AC1 to "zero" with GATES AND 32 and OR7 of FIG. 31 and OR GATE3 of FIG. 10. With AC1 cleared, AC2 is loaded into AC1 by GATES AND12 and AND13 of FIG. 31. OR GATE 2 of FIG. 21, and OR GATE4 of FIG. 11 at time T9. At time T10, AC2 is cleared through AND GATE 14 and OR GATE8 of FIG. 31 and OR GATE3 of FIG. 12.

At time T11, we now have inches (FRMD = 0) or fractions (FRMD=1) in AC1. These are reduced to decimal feet by introducing the constant 12 into AC2 if FRMD=0 by AND GATE15 of FIG. 31 and OR GATE10 of FIG. 22 or the constant 96 if FRMD=1 by operation of AND GATE16 of FIG. 31; GATES OR10 and OR2 of FIG. 22 and OR GATE10 of FIG. 29. At time T12, to convert to decimal feet, contents of AC1 is divided by AC2 the operation of AND GATE 17 of FIG. 31 and OR GATE1 of FIG. 23. Now AC1 is set to "zero" for new data by GATES AND18 and OR7 of FIG. 31 and OR GATE3 of FIG. 10 at time T13. Memory contents are transferred into AC1 at time T14 by gates AND22, AND23 and OR6 of FIG. 31 and OR GATE4 of FIG. 11 and into AC1SR(N) for decimal point by GATES AND20, AND21, OR5 of FIG. 31 and OR GATE 2 FIG. 27. At time T15 we add feet to inches (if FRMD=0) or fractions (if FRMD=1) to obtain a total in foot decimal form by AND GATE24 of FIG. 31 and OR GATE 8 of FIG. 23. MEMRY1 is then cleared by GATES OR6, AND1, OR5 of FIG. 30 if MEM1 = 1. MEMRY 2 is cleared if MEM2 = 1 by GATES OR10, AND1 and OR9 of FIG. 31. At time T16, the accumulated feet, inches or fractions are transferred back to MEMRY1 if MEM1 = 1 by GATES AND12 and AND13 of FIG. 30 or to MEMRY2 if MEM2 = 1 by GATES AND24 and AND29 of FIG. 31. At time T16, if we are concluding operations for fraction evaluation FRMD=1 (second time through time loop T5 - T16), then we will also clear the displays.

In order to clear the decimal display, we reset AC1 by operating GATES AND26, OR7 of FIG. 31 and OR GATE3 of FIG. 10. If FRMD=1, meaning that fractions had already been evaluated, we set the STOPT flip-flop by AND GATE 27 of FIG. 31 and OR GATE 1 of FIG. 17 action ceases until release of the memory input key. If FRMD=1, we want the decimal display 210 (FIG. 15) to be "zero" and the inch and fractional displays to be deactivated. Since AC1 is reset then with FRMD=1, we set DISPLAY to "one" by operation of AND GATE 27 of FIG. 31 and OR GATE 2 of FIG. 14 for display of AC1. We reset INSR by AND GATE 26 of FIG. 31 and OR GATE 4 of FIG. 25 to deactivate the inch display at time T16. If FRMD=1, then FRSE, the fractional display, is also deactivaed by AND GATE 27 of FIG. 31 and OR GATE 2 of FIG. 25.

If FRMD=0 at time T16, this would be the first time through the loop (time T5 to time T16) for accumulating inches and feet in memory. The action does not stop at time T16 as with the case FRMD=1. We proceed to time T17 where FRMD is now set to "one" by AND GATE 28 and inverter 1 of FIG. 31 and FF1 of FIG. 30. This prepares for the second pass through the loop (T5-T6) where fractions will be combined with feet and inches. AC2 is set to "zero" by GATES AND 28, OR GATE 8 of FIG. 31 and OR GATE 3 of FIG. 12. FRSRo is set to "one" by AND GATE 28 of FIG. 31, OR GATE 5 of FIG. 25. This will serve as an indicator for the case where the fractional display 230 (FIG. 15) had been "zero." FRSR will stop shifting left after seven shifts as FRSR7 goes "high." At time T17, the counter T is set back to state T4 by AND GATE 28 and inverter 1 of FIG. 31 by setting FF16 "high" (FIG. 18). A pulse emanates from SS#3 (FIG. 33) through AND GATE 20 (FIG. 18) to set the counter T to state T4 (signal AK is applies to OR GATE 5 of FIG. 18). T5 clock pulse appears next and the process continues to time T16 (FRMD=1) with fractions finally converted into decimal feet and added into the selected memory. At conclusion of this second pass, as discussed above, the decimal display will be "zero" and the inch-fraction display will be deactivated at time T16. The actions stops at time T16.

The operation with the M-1 key (FIG. 30) or M-2 key (FIG. 31) is the same as for M+1 key (FIG. 30) or M+2 key (FIG. 31). The only difference is that the flip-flop in the memory register representing the sign will be set "high." If M-1 is depressed, the "sign flip-flop" of MEMRY1 will be set "high." If M-2 is depressed, the "sign flip-flop" of MEMRY2 will be set "high." In both cases the number displayed is loaded into the selected memory as before.

Whenever a memory input key is struck, we set flip-flop FF4 of FIG. 30 or FF3 of FIG. 31. These flip-flops drive lamps M1 (101) or M2 (102) (see FIG. 15) to indicate that MEMRY1 and/or MEMRY2 had been loaded with data.

Referring back to operation of the M-1 or M-2 key, we also must handle the case where sign of the display is negative. The quantity must go into the memory as positive. We use the complementing feature of a J-K to achieve this. At time T16, if FRMD=1, we trigger the clock of flip-flop FF3 of FIG. 32 using AND GATE 27 of FIG. 31. This flip-flop represents the sign bit of the MEMRY 1. If the "Q" output of this flip-flop is "high" indicating that a negative quantity had been entered, then FF3 will change to a "low" state at trailing edge of pulse T16. This indicates a positive quantity exists in MEMRY1. On the other hand, if FF3 is already "low" indicating it is entered as positive, the clock trigger at time T16 will set FF3 "high," a negative quantity thereby resides in MEMRY1. The same type of circuitry using a J-K flip-flop can be employed for Memory 2.

If the quantity originally in the display was negative, inches or fractions must also be made negative when "accumulated" with feet. Provision can easily be employed to make the sign of the inches or fractions exactly the same a the sign of the feet as shown in the primary display. AC2 contains inches (if FRMD=0) or fractions (if FRMD=1) at time T14 clock pulse. The sign of AC2 at T14 is made the same as the sign of AC1. This insures that sign of the inches or fractions is identical with the sign of the feet. (See the operation of AND GATE 11, flip-flop FF4 of FIG. 32.)

DISPLAY OF MEMORY

Figure 50:
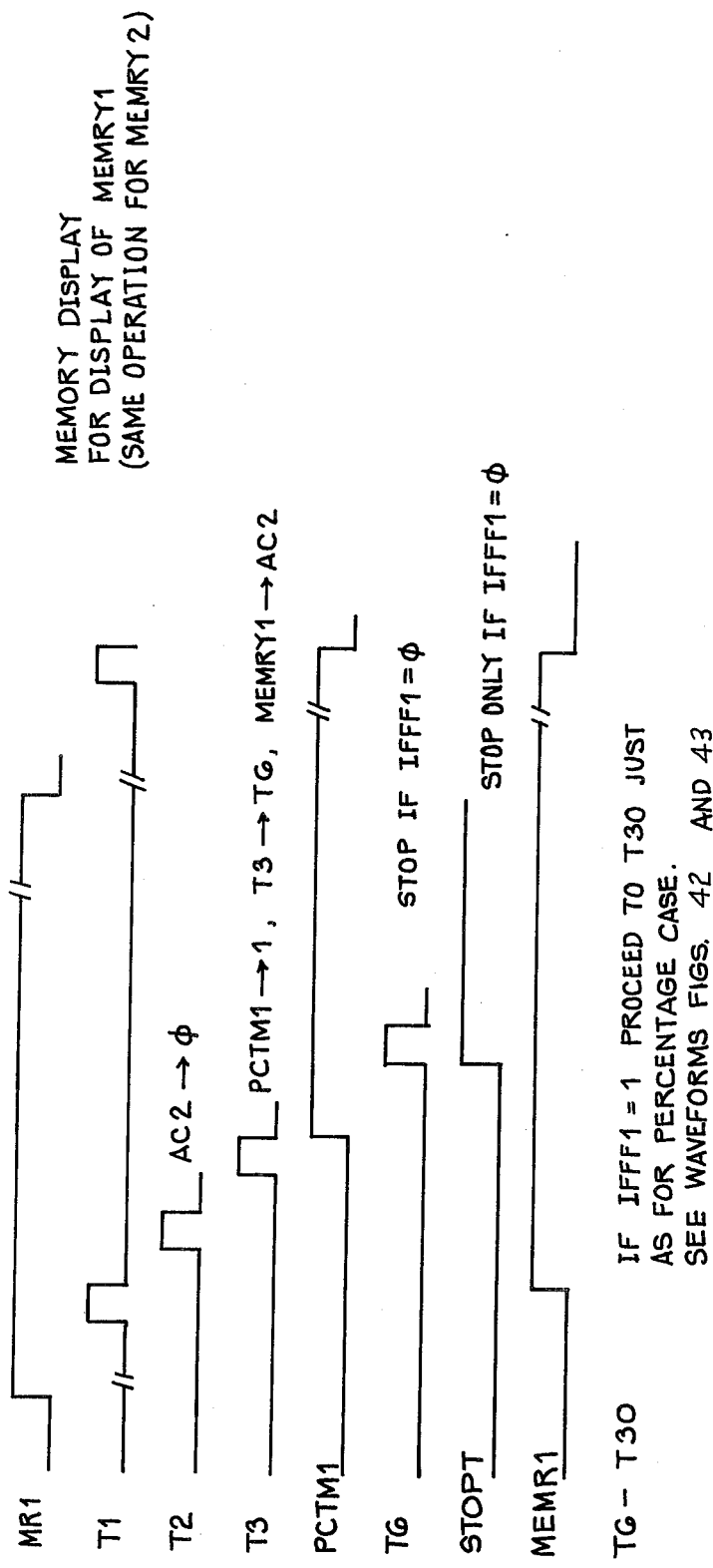

On command from a memory recall key MR1 or MR2 (FIG. 32), memory contents are transferred into the display. If MR1 is depressed, the contents of MEMRY1 will pass into AC2. If MR2 is depressed, contents of MEMRY2 is passed into AC2. The primary decimal display 210, the inch display 240, and fractional display 230 will be activated if feet-inches-fractions had been originally entered into memory. Otherwise, the display will be strictly decimal. The operation for each case is described below (see waveforms of FIG. 50).

At the trailing edge of pulse T1, MEMR1 (FIG. 32) goes "high" if MR1 is depressed, or MEMR2 (FIG. 32) goes "high" if MR2 is depressed. The AC2 register is cleared at time T2 by AND GATE 9, OR GATE 8 of FIG. 31 and OR GATE 3 of FIG. 12. At time T3, the contents of MEMRY1 by GATES AND5, OR3 of FIG. 32 and OR GATE 1 of FIG. 24 and MEMRY1SR (by GATES AND 7, and OR 4, of FIG. 32 and OR GATE 2 of FIG. 24) transfer to AC2 and AC2SR if MEMR1 is "high." If MEMR2 is "high," we similarly transfer MEMRY2 to AC2 and AC2SR (by GATES AND6, OR3, AND8, and OR4 of FIG. 32, and GATES OR1 and OR2 of FIG. 24). At the trailing edge of pulse T3, the PCTM1 flip-flop is set to "one" by GATES OR5, AND10, and inverter 3 (of FIG. 32 and GATES OR13, OR14 of FIG. 9). The "D" input of FF7 of FIG. 9 is "high" by virtue of $\overline{\text{MEMR}}$ input to OR GATE 13. The clock for PCTM1 is derived from the T3 MEMR INPUT SIGNAL TO OR GATE 14 of FIG. 9. Since PCTM1 goes "high" on the trailing edge of pulse T3, none of the operations associated with PCTM1 (percentage) occur at time T3.

At time T3, the counter T is set forward to the T5 state so that the normal PCTM1 functions take place from time T6 onward. The counter T is set to the T5 state through AND GATE13 of FIG. 18. The flip-flop FF9 of FIG. 18 is set "high" through AND GATE 10 of FIG. 32 and OR GATE 2 of FIG. 18. With AND GATE 13 of FIG. 18 enabled, the T-SET pulse from SS3 of FIG. 33 sets the T counter to state T5.

If MEMRY1 of MEMRY2 had been loaded with a pure decimal number, IFFF1 or IFFF2 would be "zero." Operation will stop time T6 with AC2 displayed, the original contents of MEMRY1 or MEMRY2 having been loaded into AC2 at time T3. The STOPT line would be set "high" from OR GATE 1 of FIG. 32 through OR GATE 1 of FIG. 17. The Display line is set to "zero" in order to display the contents of AC2 by operation of FIG. 32 and OR GATE 1 and OR GATE 3 of FIG. 14.

Figure 32A:
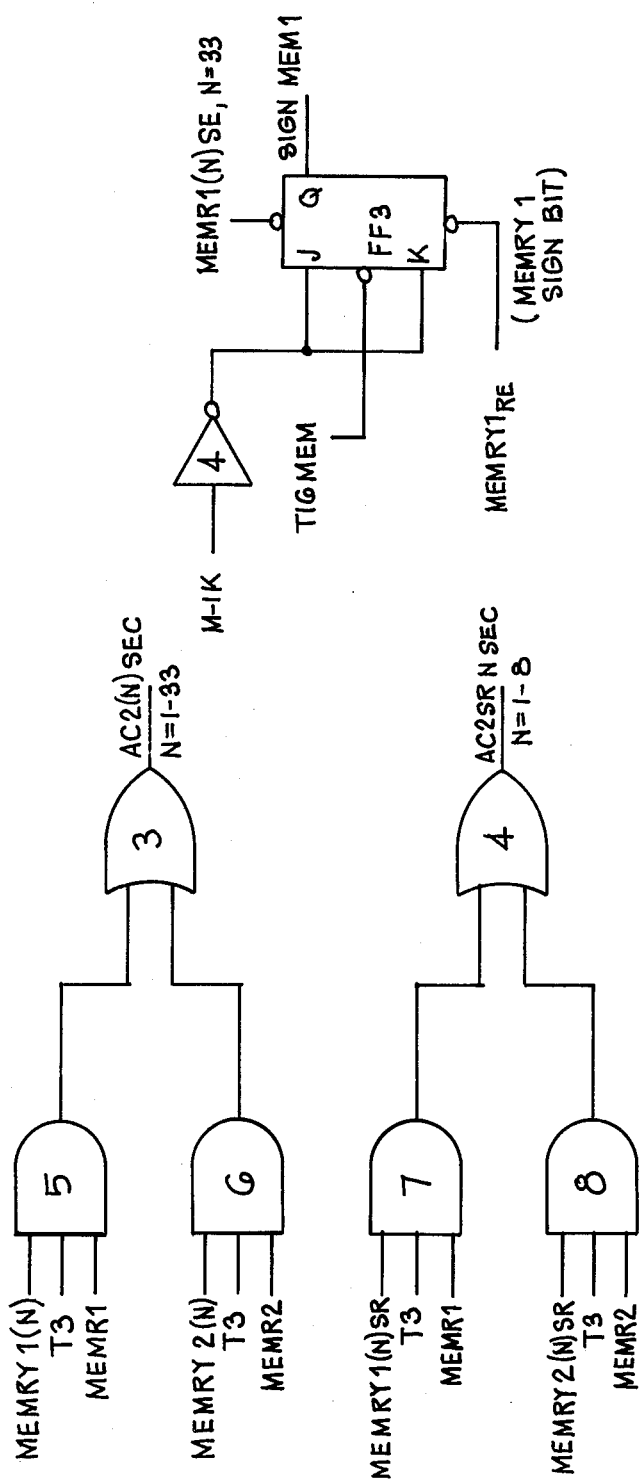

At time T6, AC1 is reset through OR GATE 5, Inverter 3 of FIG. 32, and GATES OR1, AND8, OR3 of FIG. 10. AC2SR$\phi$ is also set "high" at time T6 through OR GATE 6, Inverter 3 of FIG. 32 and GATES OR7, and AND9 of FIG. 22. AC2 does not transfer to M5 as in the percentage case, because of the inhibit ($\overline{\text{MEMR}}$=0) and AND GATE 3 and AND GATE 4 of FIG. 21. These are the required operations at time T6 if we are to proceed to time T30 achieving the decimal conversion to feet-inches-fractions. This is the same operation as described in the percentage mode (PCTM1=1).

In review, a stop occurs at time T6 if the original entry into memory had only been decimal (IFFF1 is "zero" with MEMR1=1 or IFFF2 is "zero" with MEMR2=1). In this case only the primary display is active. If IFFF1 or IFFF2 had been "high," then operation continues from T6 −T30 to provide the full feet-inches-fractions display as for percentage.

CLEAR KEY

When the clear key 24 in FIG. 1 and SW24 in FIG. 7 for the unit is depressed, all memories wil be cleared to "zero." This includes AC1, AC2, M1, M2, M3, M4, M5, MEMRY1, MEMRY2, FRSR, INSR. In addition, certain flip-flops which have to be initialized are also reset. This insures the proper start-up for the unit, not only with power turn-on, but for the abortion of any operation before its completion.

The clear key 24, when depressed, causes a "high" at the output of OR GATE 7 of FIG. 7. The RESET line and $\overline{\text{RESET}}$ line on FIG. 7 goes to "one" and "zero" respectively. As described at the beginning of this report, power turn-on creates the same conditions as depression of the clear key.

The list of flip-flops and registers cleared by the clear key 24, as well as power turn-on, is as follows:

(1) FF2, FIG. 8 through Inverter 1, OR GATE 6, FIG. 8, AND GATE 6, OR GATE 12, FIG. 9.

(2) FF2, FIG. 16, through AND GATE 6, and OR GATE 12, FIG. 9.

(3) FF1, FIG. 9 through AND GATE 6, OR GATE 12 of FIG. 9.

(4) FF5, FIG. 9 through OR GATE 10, FIG. 9.

(5) FF2, FIG. 9 through OR GATE 11, FIG. 9.

(6) FF3, FIG. 9 through OR GATE 9 and Inverter 5 of FIG. 9.

(7) FF4, FIG. 9 through OR GATE 8 and Inverter 6 of FIG. 9.

(8) FF1 to FF6, FIG. 18, constitute the counter T. No reset is required, since a free running condition is allowable.

(9) FF7 to FF16, FIG. 18, are reset through clock input. The "D" inputs are initially "zero," since the SS3 "single shot" is generally in a "zero" state except when triggered.

(10) AC1 and AC1SR, FIG. 11, is reset through OR GATE 3, FIG. 10. Note that the RESET signal is applied to OR GATE 3, FIG. 10.

(11) AC2SR, FIG. 22, AC2, 1 to 5, FIG. 22 and AC2, FIG. 12 are reset through OR GATE 3, FIG. 12.

(12) FF1, FIG. 14 is always reset at T1, as required for its operation, and never requires the "clear."

(13) FF2, FIG. 14 is reset or set, according to whether AC1 or AC2 is displayed, and does not require the "clear"

(14) FF3, FIG. 28. The "error" flip-flop is reset directly by the RESET signal.

(15) FF4, FIG. 28 does not receive the RESET pulse, but will set or reset in accordance with the operations required.

(16) FRSR, FIG. 25 is reset through OR GATE 2 of FIG. 25.

(17) INSR, FIG. 25 is reset through OR GATE 1, FIG. 25.

(18) Reset for M1 and M1D, FIG. 19, is through OR GATE 1, FIG. 20.

(19) Reset for M2 and M2D, FIG. 19, is through OR GATE 2, FIG. 20.

(20) Reset for M3 and M3D, FIG. 19 is through OR GATE 3, FIG. 20.

(21) Reset for M4 and M4D, FIG. 19, is through OR GATE 4, FIG. 20.

(22) Reset for M5 and M5D, FIG. 19, is through OR GATE 5, FIG. 20.

(23) Reset for FF1, FIG. 23, is through OR GATE 4, FIG. 23.

(24) Reset or set for FF2, FIG. 17, is in accordance with the requirements of various oprations. This flip-flop does not require the "clear."

(25) FF1, FIG. 30, is reset or set in accordance with requirements of various operations to be performed.

(26) FF3, FIG. 30 is reset through OR GATE 8, FIG. 30.

(27) FF4, FIG. 30 is reset through OR GATE 7, FIG. 30.

(28) FF2, FIG. 31, is reset through OR GATE 12, FIG. 30.

(29) FF3, FIG. 32 is reset through OR GATE 11, FIG. 31.

(30) MEMRY1, FIG. 30, is reset through OR GATE 5, FIG. 30.

(31) MEMRY2, FIG. 31, is reset through OR GATE 9, FIG. 31.

(32) Various other flip-flops not indicated above, do not require resets derived from the "clear" key. They are reset at appropriate times generally through the clock inputs.

MEMORY CLEAR KEY

MC1 or MC2, FIG. 32, when depressed, will clear MEMRY1 or MEMRY2 respectively. These keys do not affect other registers. MC2 originates from FIG. 32, passing through Inverter 6, as follows:

(1) OR GATE 9, FIG. 31, clearing MEMRY2.

(2) To OR GATE 11, FIG. 31, clearing FF3, and turning off the M2 lamp display.

(3) To OR GATE 12, FIG. 31, turning off IFFF2, which is used to indicate that fractions or inches had been activated in the original display.

Similar to the above, MC1, comes from FIG. 32 through Inverter 5 as follows:

(1) To OR GATE 5, FIG. 30, to clear MEMRY1.

(2) To OR GATE 7, FIG. 30, to turn-off lamp display M1.

(3) To OR GATE 8, FIG. 30, to turn-off IFFF1.

CLEAR ENTRY KEY

The CE key (SW25) is shown in FIG. 10. This key, when depressed, will clear the entry into the primary display as well as into the inch and fraction displays. Other registers or flip-flops are unaffected. The entry of data for the primary display is deposited into AC1. The depression of the CE key, in FIG. 10, resets AC1 through Inverter 2 and OR GATE 3 of FIG. 10. The CEK signal is generated in FIG. 10 from the CE key. This CEK signal resets INSR in FIG. 25 through OR GATE 1 and reset FRSR in FIG. 25 through OR GATE 2.

While preferred features of the present invention have been described herein, and several variable features have also been described herein, it will be obvious that specific auxiliary features described herein could be omitted and additional features could be provided without departing from the scope and spirit of the present invention. For example, totals of additive and subtractive functions need not be cumulatively recorded in the Displays 1, but could be individually recorded and totaled upon depression of the equals key 21a, and that a printing mechanism could be provided to operated with or without simultaneous recordation of numerics in the Displays 1 to record on paper tape each of the entered and recorded numerics and functions performed in the apparatus.

It is intended that all matter and descriptions contained in the above description or shown in the accompanying drawings shall not be interpreted as limiting in any way.

What is claimed is:

1. A computing apparatus contained with a housing, comprising:
    a display console consisting of displays to record the results of specified computations;
    a first keyboard having a plurality of character keys representing the digits "0" through "9";
    primary function keys representing the arithmetic functions of addition, subtraction, multiplication and division;
    a key representing an "equals" function;
    a key representing a decimal point;
    a key representing a "clear all" function;
    a key representing a "clear last entry" function;
    a key representing a percent function;
    a key representing a square foot function;
    a second keyboard having a plurality of character keys with the 12 character keys representing the digits "1" through "12" representing, respectively, one through 12 inches;
    a third keyboard having a plurality of character keys with the character keys representing the identified fractions of $\frac{1}{8}$, $\frac{1}{4}$, $\frac{3}{8}$, $\frac{1}{2}$, $\frac{5}{8}$, $\frac{3}{4}$ and $\frac{7}{8}$;
    an array of switches, including an "on/off" switch, a constant switch, a decimal selector switch, an operation selector switch;
    conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;
    converting means actuated by said conversion keys for effecting the associated conversions;
    memory means for storing numerics;
    memory utilization means, including a plurality of keys representing the "memory" functions of entering positive numerics into memory, entering negative numerics into memory, recalling numerics entered into memory, clearing numerics entered into memory;
    means for automatically performing the function of taking a percentage of a numeric entered in the apparatus and recording the number in the displays, when said numeric is "feet," "inches," "fractions of an inch" and when said numeric is a decimal numeric, wherein said percentage taking means further includes means for automatically recording in the displays the result of said function of taking a percentage;
    an indicator light to indicate when numerics have been entered into a memory;
    an indicator light to indicate when numerics have been entered into another memory; and
    a power source for driving the computing apparatus.

2. A computing apparatus contained within a housing, comprising:
    a display console consisting of displays to record the results of specified computations;
    a first keyboard having a plurality of character keys representing the digits "0" through "9";
    primary function keys representing the arithmetic functions of addition, subtraction, multiplication and division;
    a key representing an "equals" function;

a key representing a decimal point;
a key representing a "clear all" function;
a key representing a "clear last entry" function;
a key representing a percent function;
a key representing a square root function;
a second keyboard having a plurality of character keys with the twelve character keys representing the digits "1" through "12" representing, respectively, 1 through 12 inches.
a third keyboard having a plurality of character keys with the character keys representing the identified fractions of ⅛, ¼, ⅜, ½, ⅝, ¾ and ⅞;
an array of switches, including an "on/off" switch, a constant switch, a decimal selector switch, an operation selector switch;
conversion keys, including a feet-to-decimal conversion key, a decimal-to-feet conversion key, a feet-to-meters conversion key, a meters-to-feet conversion key, an inches-to-centimeters conversion keym, a centimeters-to-inches conversion key;
converting means actuated by said conversion keys for effecting the associated conversions;
memory means for storing numerics;
memory utilization means, including a plurality of keys representing the "memory" functions of entering positive numerics into memory, entering negative numerics into memory, recalling numerics entered into memory, clearing numerics entered into memory,
means for automatically performing the function of taking the square root of a numeric entered in the apparatus and recorded in the displays, when said numeric is "feet," "inches," "fractions of an inch" and when said numeric is a decimal numeric, wherein said square root taking means includes means for automatically recording in the displays the result of said function of taking a square root;
an indicator light to indicate when numerics have been entered into a memory;
an indicator light to indicate when numerics have been entered into another memory; and
a power source for driving the computing apparatus.

3. A computing apparatus contained within a housing, comprising:
a display console consisting of displays to record the results of specified computations;
a first keyboard having a plurality of character keys representing the digits "0" through "9";
primary function keys representing the arithmetic functions of addition, subtraction, multiplication and division;
a key representing an "equals" function;
a key representing a decimal point;
a key representing a "clear all" function;
a key representing a "clear last entry" function;
a key representing a percent function;
a key representing a square root function;
a second keyboard having a plurality of character keys with the twelve character keys representing the digits "1" through "12" representing, respectively, 1 through 12 inches;
a third keyboard having a plurality of character keys with the character keys representing the identified fractions of ⅛, ¼, ⅜, ½, ⅝, ¾ and ⅞;
an array of switches, including an "on/off" switch, a constant swit;ch, a decimal selector switch, an operation selector switch;
conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;
converting means actuated by said conversion keys for effecting the associated conversions, said converting means including means for automatically performing the function of directly converting a numeric entered into the apparatus and recorded in the displays, when said numeric is "feet", "inches" and "fractions of an inch" to a decimal equivalent, and wherein said converting means includes means for recording said decimal equivalent in the display;
memory means for storing numerics;
memory utilization means, including a plurality of keys representing the "memory" functions of entering positive numerics into memory, entering negative numerics into memory, recalling numerics entered into memory, clearing numerics entered into memory;
an indicator light to indicate when numerics have been entered into a memory;
an indicator light to indicate when numerics have been entered into another memory; and
a power source for driving the computing apparatus.

4. A computing apparatus contained within a housing, comprising:
a display console consisting of displays to record the results of specified computations;
a first keyboard having a plurality of character keys representing the digits "0" through "9";
primary function keys representing the arithmetic functions of addition, subtraction, multiplication and division;
a key representing an "equals" function;
a key representing a decimal point;
a key representing a "clear all" function;
a key representing a "clear last entry" function;
a key representing a percent function;
a key representing a square root function;
a second keyboard having a plurality of character keys with the twelve character keys representing the digits "1" through "12" representing, respectively, 1 through 12 inches;
a third keyboard having a plurality of character keys with the character keys representing the identified fractions of ⅛, ¼, ⅜, ½, ⅝, ¾ and ⅞;
an array of switches, including an "on/off" switch, a constant switch, a decimal selector switch, an operation selector switch;
conversion keys, including a feet-to-decimal conversion key, a decimal-to-feet conversion key; a feet-to-meters conversion key, a meters-to-feet conversion key, an inches-to-centimeters conversion key, a centimeter-to-inches conversion key;
converting means actuated by said conversion keys for effecting the associated conversions, said converting means including means for automatically performing the function of directly converting a numeric entered into the apparatus and recorded in the display, when said numeric is a decimal numeric to an equivalent in "feet," "inches" and "fractions of an inch," and said converting means including means for automatically recording said "feet," "inches" and "fractions of an inch" equivalents in the displays to the nearest one-eighth of an inch;
memory means for storing numerics;
memory utilization means, including a plurality of keys representing the "memory" functions of entering positive numerics into memory, entering negative numerics into memory, recalling numerics entered into memory, clearing numerics entered into memory;
an indicator light to indicate when numerics have been entered into memory;
an indicator light to indicate when numerics have been entered into another memory; and
a power source for driving the computing apparatus.

5. A computing apparatus contained within a housing, comprising:
a display console consisting of displays to record the results of specified computations;
a first keyboard having a plurality of character keys representing the digits "0" through "9";
primary function keys representing the arithmetic functions of addition, subtraction, multiplication and division;
a key representing an "equals" function;
a key representing a decimal point;
a key representing a "clear all" function;
a key representing a "clear last entry" function;
a key representing a percent function;
a key representing a square root function;
a second keyboard having the plurality of character keys with the twelve character keys representing the digits "1" through "12" representing, respectively, 1 through 12 inches;
a third keyboard having a plurality of character keys with the character keys representing the identified fractions of $\frac{1}{8}, \frac{1}{4}, \frac{3}{8}, \frac{1}{2}, \frac{5}{8}, \frac{3}{4}$ and $\frac{7}{8}$;
an array of switches, including an "on/off" switch, a constant switch, a decimal selector switch, an operation selector switch;
conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;
converting means actuated by said conversion keys for effecting the associated conversions, said converting means including means for performing the function of directly converting a numeric entered into the apparatus and recorded in the displays, when said numeric is "feet," "inches" and "fractions of an inch" to its metric measurement equivalent in "meters," and said converting means including means for recording said metric measurement equivalent in the display;
memory means for storing numerics;
memory utilization means, including a plurality of keys representing the "memory" functions of entering positive numerics into memory, entering negative numerics into memory, recalling numerics entered into memory, clearing numerics entered into memory;
an indicator light to indicate when numerics have been entered into a memory;
an indicator light to indicate when numerics have been entered into another memory; and
a power source for driving the computing apparatus.

6. A computing apparatus contained within a housing, comprising:
a display console consisting of displays to record the results of specified computations;
a first keyboard having the plurality of character keys representing the digits "0" through "9";
primary function keys representing the arithmetic functions of addition, subtraction, multiplication and division;
a key representing an "equals" function;
a key representing a decimal point;
a key representing a "clear all" function;
a key representing a "clear last entry" function;
a key representing a percent function;
a key representing a square root function;
a second keyboard having a plurality of character keys with the twelve character keys representing the digits "1" through "12" representing, respectively, 1 through 12 inches;
a third keyboard having a plurality of character keys with the character keys representing the identified fractions of $\frac{1}{8}, \frac{1}{4}, \frac{3}{8}, \frac{1}{2}, \frac{5}{8}, \frac{3}{4}$ and $\frac{7}{8}$;
an array of switches, including an "on/off" switch, a constant switch, a decimal selector switch, an operation selector switch;
conversion keys, including a feet-to-decimal conversion key, a decimal-to-fee conversion key, a feet-to-meters conversion key, a meters-to-feet conversion key, an inches-to-centimeters conversion key, a centimeters-to-inches conversion key;
converting means actuated by said conversion keys for effecting the associated conversions, said converting means including means for automatically performing the function of directly converting a numeric entered into the apparatus and recorded in the display, when said numeric is a metric measurement numeric in "meters" to its equivalent in "feet," "inches" and "fractions of an inch," said converting means including means for automatically recording said "feet," "inches" and "fractions of an inch" equivalent in the displays to the nearest one-eighth of an inch;
memory means for storing numerics;
memory utilization means, including a plurality of keys representing the "memory" functions of entering positive numerics into memory, entering negative numerics into memory, recalling numerics entered into memory, clearing numerics entered into memory;
an indicator light to indicate when numerics have been entered into a memory;
an indicator light to indicate when numerics have been entered into another memory; and
a power source for driving the computing apparatus.

7. A computing apparatus contained within a housing, comprising:
a display console consisting of displays to record the results of specified computations;
a first keyboard having a plurality of character keys representing the digits "0" through "9";
primary function keys representing the arithmetic functions of addition, subtraction, multiplication and division;
a key representing an "equals" function;
a key representing a decimal point;
a key representing a "clear all" function;
a key representing a "clear last entry" function;
a key representing a percent function;
a key representing a square root function;

a second keyboard having a plurality of character keys with the twelve character keys representing the digits "1" through "12" representing, respectively, 1 through 12 inches;

a third keyboard having a plurality of character keys with the character keys representing the identified fractions of ⅛, ¼, ⅜, ½, ⅝, ¾ and ⅞;

an array of switches, including an "on/off" switch, a constant switch, a decimal selector switch, an operation selector switch;

conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;

converting means actuated by said conversion keys for effecting the associated conversions, said converting means including means for automatically performing the function of directly converting a numeric entered into the apparatus and recorded in the displays, when said numeric is "inches" and "fractions of an inch" to its metric measurement equivalent in "centimeters," and said converting means including means for recording said metric measurement equivalent in the display;

memory means for storing numerics;

memory utilization means, including a plurality of keys representing the "memory" functions of entering positive numerics into memory, entering negative numerics into memory, recalling numerics entered into memory, clearing numerics entered into memory;

an indicator light to indicate when numerics have been entered into a memory;

an indicator light to indicate when numerics have been entered into another memory; and a power source for driving the computing apparatus.

8. A computing apparatus contained within a housing, comprising:

a display console consisting of displays to record the results of specified computations;

a first keyboard having a plurality of character keys representing the digits "0" through "9";

primary function keys representing the arithmetic functions of addition, subtraction, multiplication and division;

a key representing an "equals" function;

a key representing a decimal point;

a key representing a "clear all" function;

a key representing a "clear last entry" function;

a key representing a percent function;

a key representing a square root function;

a second keyboard having a plurality of character keys with the 12 character keys representing the digits "1" through "12" representing, respectively, 1 through 12 inches;

a third keyboard having a plurality of character keys with the character keys representing the identified fractions of ⅛, ¼, ⅜, ½, ⅝, ¾ and ⅞;

an array of switches, including an "on/off" switch, a constant switch, a decimal selector switch, an operation selector switch;

conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;

converting means actuated by said conversion keys for effecting the associated conversions, said converting means including means for automatically performing the function of directly converting a numeric entered into the apparatus and recorded in the display, when said numeric is a metric measurement numeric in "centimeters" to its equivalent in "feet," "inches" and "fractions of an inch," and said converting means including means for automatically recording said "feet," "inches" and "fractions of an inch" equivalent in the displays to the nearest one-eighth of an inch;

memory means for storing numerics;

memory utilization means, including a plurality of keys representing the "memory" functions of entering positive numerics into memory, entering negative numerics into memory, recalling numerics entered into memory, clearing numerics entered into memory;

an indicator light to indicate when numerics have been entered into a memory;

an indicator light to indicate when numerics have been entered into another memory; and a power source for driving the computing apparatus.

9. An apparatus, according to claim 8, wherein said memory means includes means for automatically retaining in each of two separate and distinct memory storage cores numerics entered into the apparatus, either positive or negative, in "feet," "inch" or "fraction of an inch" numerics, decimal numerics or metric measurement numerics.

10. An apparatus, according to claim 9, including means for automatically recording in the displays the numerics retained in either one of the separate and distinct memory storage cores and then the numerics of the other separate and distinct memory storage core.

11. A computing apparatus contained within a housing, comprising:

a display console consisting of displays to record the results of specified computations;

a first keyboard having a plurality of character keys representing the digits "0" through "9";

primary function keys representing the arithmetic functions of addition, subtraction, multiplication and division;

a key representing an "equals" function;

a key representing a decimal point;

a key representing a "clear all" function;

a key representing a "clear last entry" function;

a key representing a percent function;

a key representing a square root function;

a second keyboard having a plurality of character keys with the twelve character keys representing the digits "1" through "12" representing, respectively, 1 through 12 inches;

a third keyboard having a plurality of character keys with the character keys representing the identified fractions of ⅛, ¼, ⅜, ½, ⅝, ¾ and ⅞;

an array of switches, including an "on/off" switch, a constant switch, a decimal selector switch, an operation selector switch;

conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;

converting means actuated by said conversion keys for effecting the associated conversions;

memory means for storing numerics;

memory utilization means, including a plurality of keys representing the "memory" functions of entering positive numerics into memory, entering negative numerics into memory, recalling numerics entered into memory, clearing numerics entered into memory;

means for performing the arithmetic functions of addition, subtraction, multiplication and division when the numerics entered into the apparatus are "feet," "inches" and "fractions of an inch," and when numerics entered into the apparatus are decimal numerics, and which includes means for automatically recording in the display the results of said arithmetic functions;

an indicator light to indicate when numerics have been entered into a memory;

an indicator light to indicate when numerics have been entered into another memory; and a power source for driving the computing apparatus.

12. An apparatus, according to claim 11, further including means for automatically recording in the displays the remainder of the arithmetic function of division when the quotient of the dividend divided by the divisor is not exact.

* * * * *